United States Patent [19]
Yudasaka et al.

[11] Patent Number: 5,563,427
[45] Date of Patent: Oct. 8, 1996

[54] ACTIVE MATRIX PANEL AND MANUFACTURING METHOD INCLUDING TFTS HAVING VARIABLE IMPURITY CONCENTRATION LEVELS

[75] Inventors: Ichio Yudasaka; Minoru Matsuo; Satoshi Takenaka, all of Suwa, Japan

[73] Assignee: Seiko Epson Corporation, Tokyo, Japan

[21] Appl. No.: 313,310

[22] PCT Filed: Feb. 9, 1994

[86] PCT No.: PCT/JP94/00189

§ 371 Date: Dec. 6, 1994

§ 102(e) Date: Dec. 6, 1994

[87] PCT Pub. No.: WO94/18706

PCT Pub. Date: Aug. 18, 1994

[30] Foreign Application Priority Data

| Feb. 10, 1993 | [JP] | Japan | 5-022840 |
| Apr. 12, 1993 | [JP] | Japan | 5-084856 |
| Jul. 5, 1993 | [JP] | Japan | 5-165749 |
| Sep. 9, 1993 | [JP] | Japan | 5-224562 |
| Dec. 16, 1993 | [JP] | Japan | 5-316971 |

[51] Int. Cl.$^6$ .......................... H01L 27/01; H01L 29/04; H01L 29/76
[52] U.S. Cl. .......................... 257/72; 257/351; 257/408; 437/27; 437/28; 437/29
[58] Field of Search .......................... 257/72, 351, 369, 257/59, 408; 437/21, 27, 28, 29, 48; 359/59

[56] References Cited

U.S. PATENT DOCUMENTS

| 5,141,885 | 8/1992 | Yoshida et al. ............. | 437/41 |
| 5,250,931 | 10/1993 | Misawa et al. ............. | 345/206 |
| 5,323,042 | 6/1994 | Matsumoto ............. | 257/350 |
| 5,393,992 | 2/1995 | Suzuki ............. | 257/72 |
| 5,396,084 | 3/1995 | Matsumoto ............. | 257/72 |
| 5,396,099 | 3/1995 | Kitajima ............. | 257/72 |

FOREIGN PATENT DOCUMENTS

| 544229 | 6/1993 | European Pat. Off. . | |
| 59-205762 | 11/1984 | Japan . | |
| 60-164363 | 8/1985 | Japan . | |
| 63-204769 | 8/1988 | Japan . | |
| 1289917 | 11/1989 | Japan . | |
| 2246277 | 10/1990 | Japan . | |
| 4293023 | 10/1992 | Japan . | |
| 142577 | 6/1993 | Japan . | |
| 173179 | 7/1993 | Japan . | |
| 0112490 | 4/1994 | Japan ............. | 257/72 |

*Primary Examiner*—Robert P. Limanek
*Assistant Examiner*—David B. Hardy
*Attorney, Agent, or Firm*—W. Glen Johnson

[57] ABSTRACT

In the formation of a thin-film transistor (620) capable of improving the OFF current characteristic, first, all ions (arrow Ion-1) generated from a mixed gas (doping gas) containing 5% $PH_3$ with the remainder being $H_2$ gas are implanted to a polycrystalline silicon film (604) at an approximately 80 keV energy level to achieve a $P^+$ ion dose in the range from $3 \times 10^{13}/cm^2$ to $1 \times 10^{14}/cm^2$ in the process forming low concentration source-drain areas (602, 603). Next, all ions generated from a doping gas of pure hydrogen (arrow Ion-2) are implanted to the low concentration area (604a) at an approximately 20 keV energy level to achieve an $H^+$ ion dose from $1 \times 10^{14}/cm^2$ to $1 \times 10^{15}/cm^2$. Then, the impurity is activated by heat treatment of the low concentration area (604a) implanted with impurity for approximately one hour at approximately 300° C. in a nitrogen atmosphere.

27 Claims, 27 Drawing Sheets

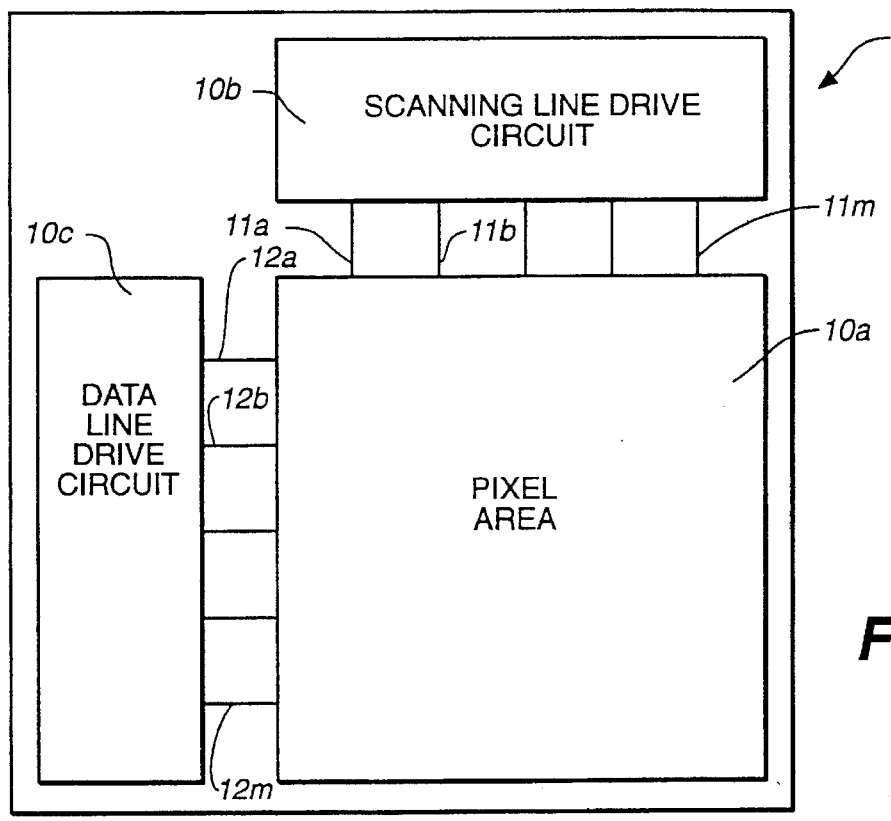
FIG._1
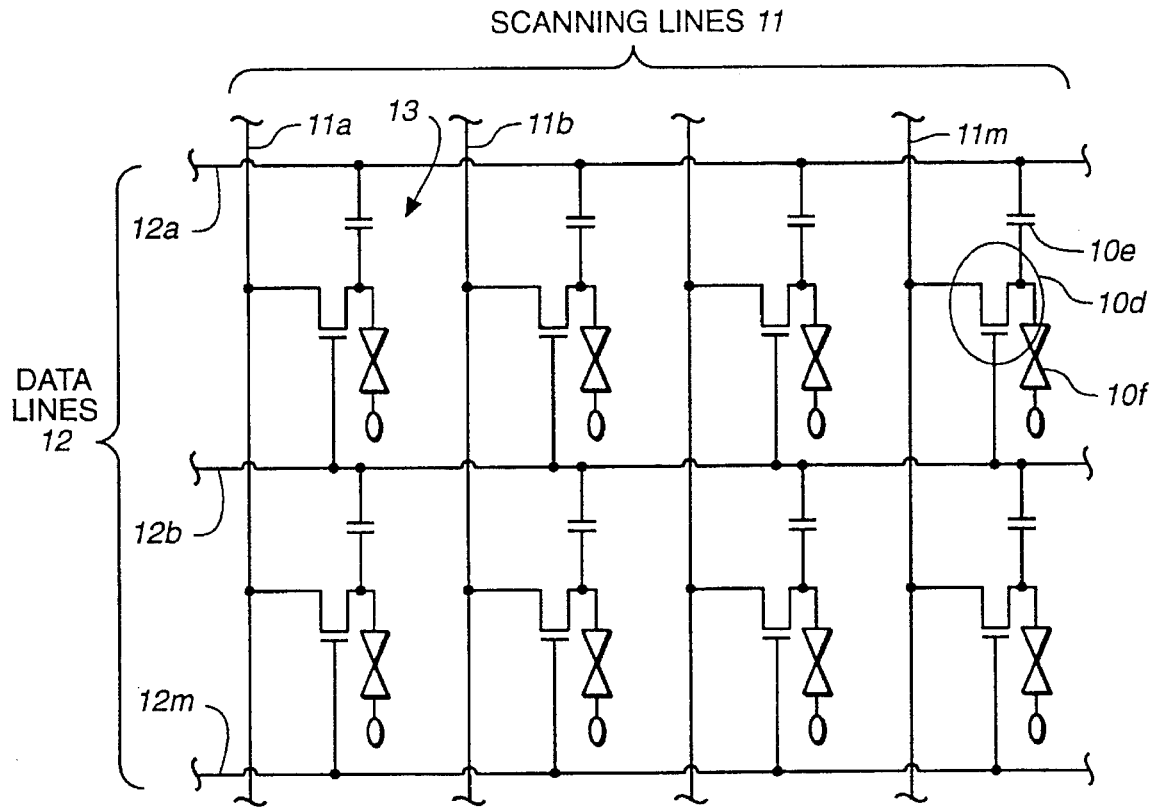
FIG._2

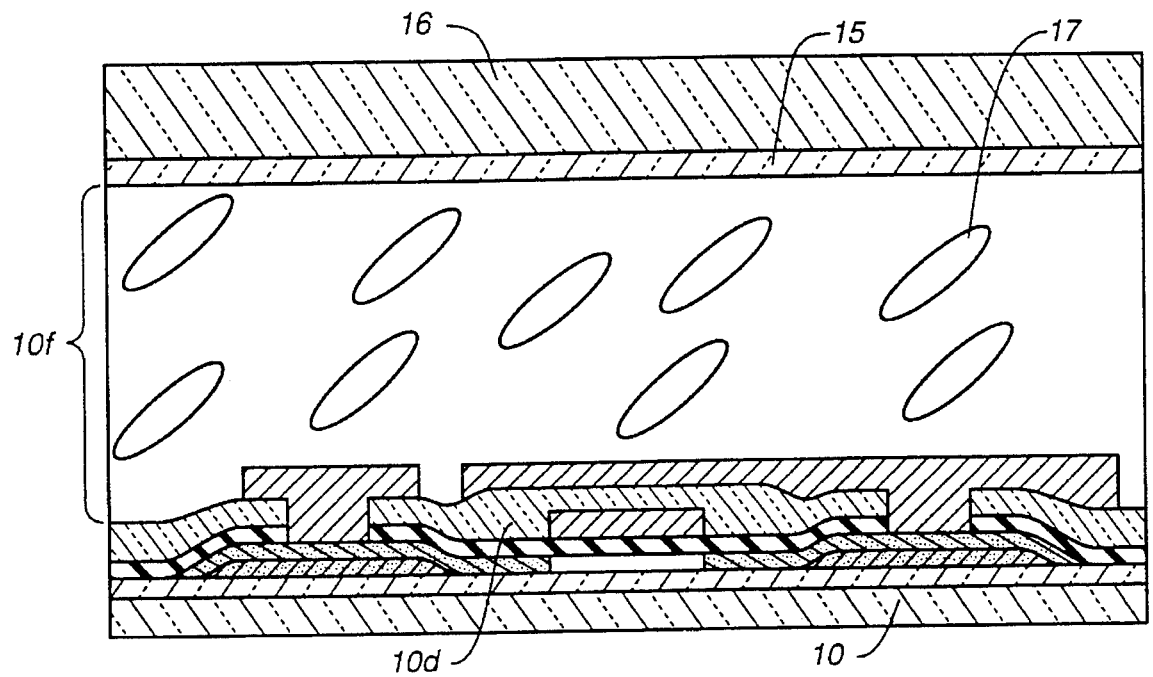
FIG._3
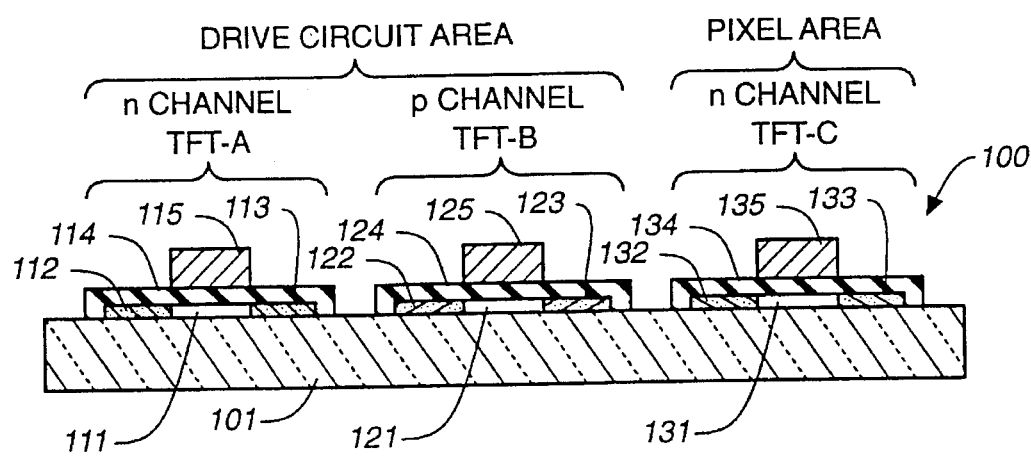
FIG._4

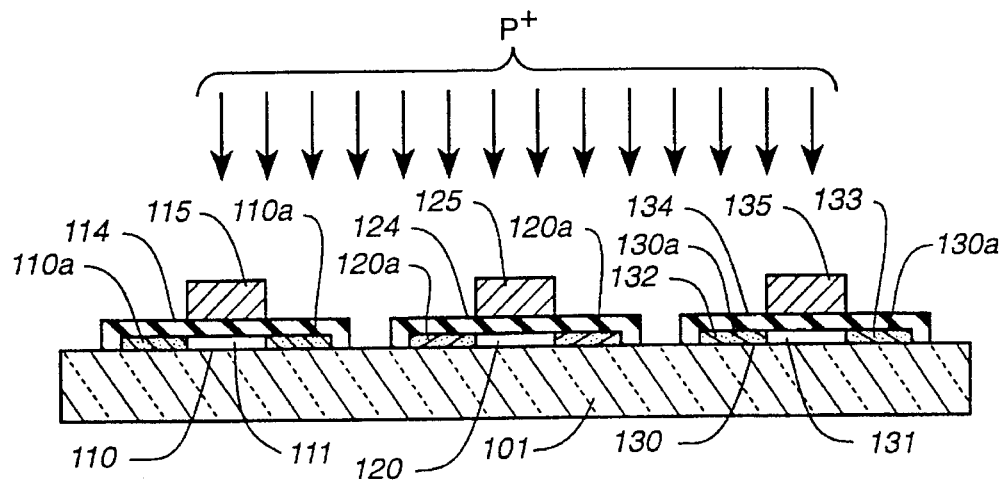
FIG._5A
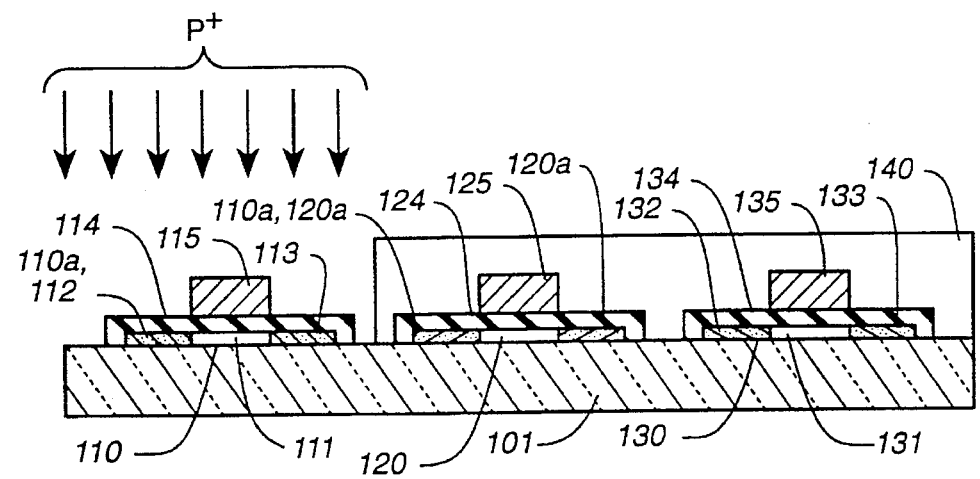
FIG._5B
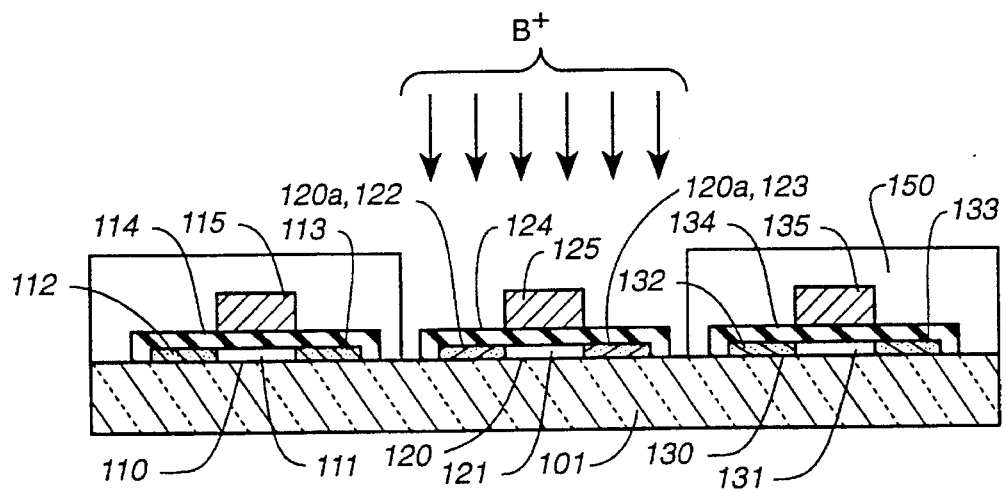
FIG._5C

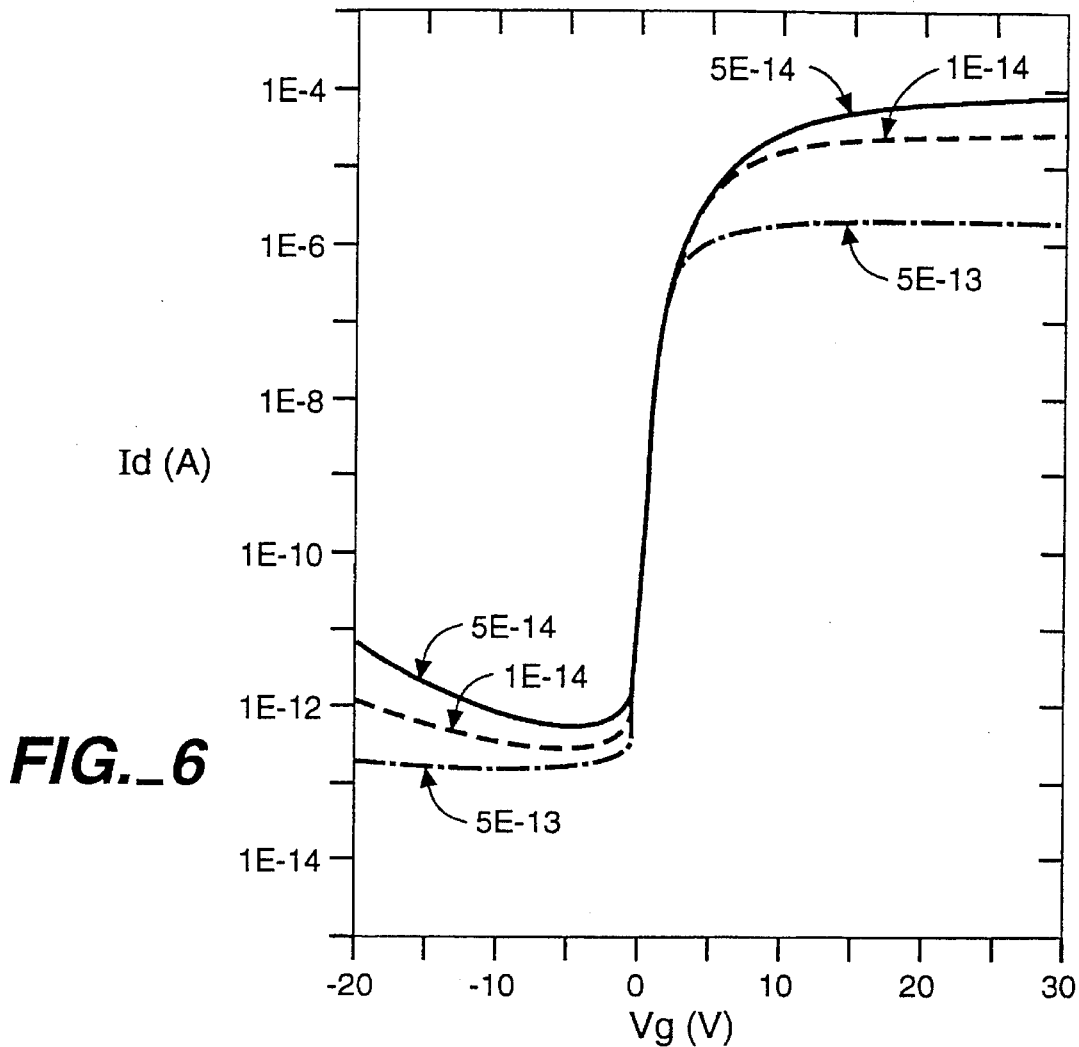
FIG._6
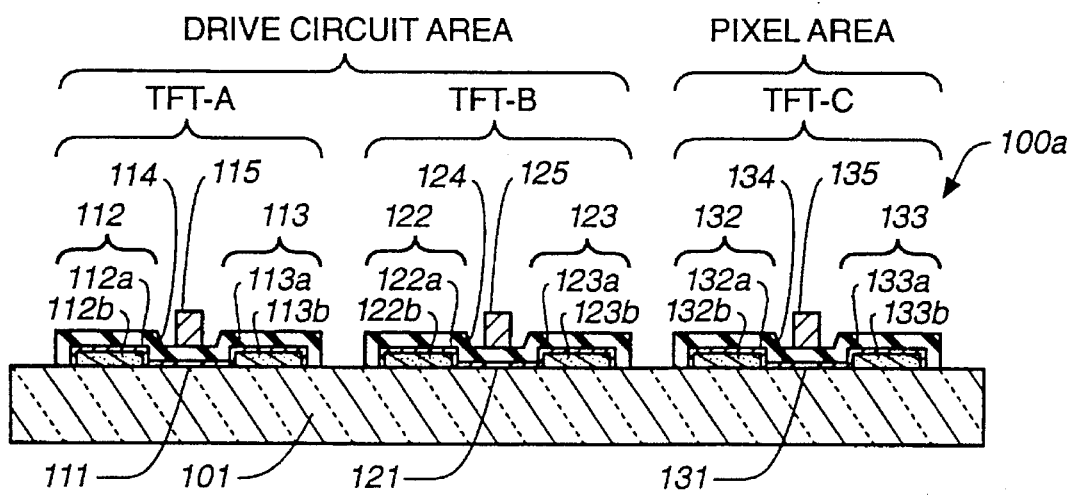
FIG._7

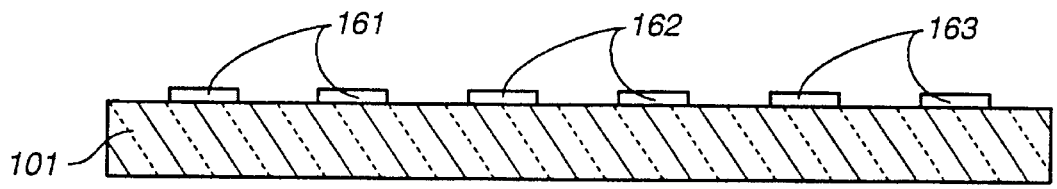
FIG._8A
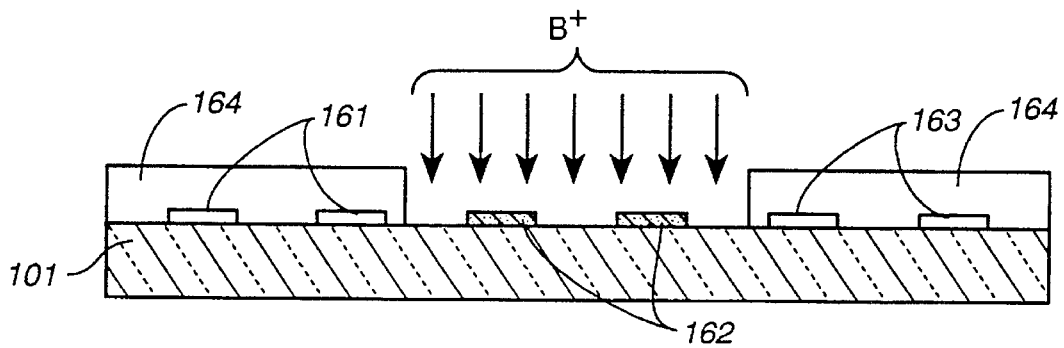
FIG._8B
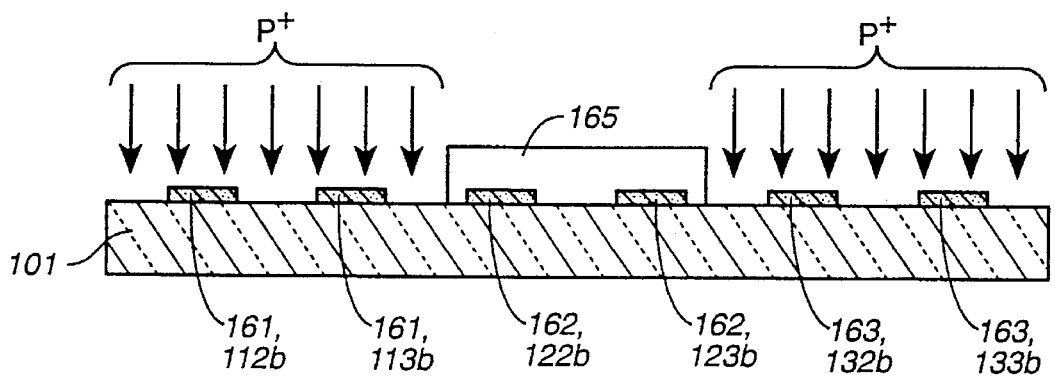
FIG._8C
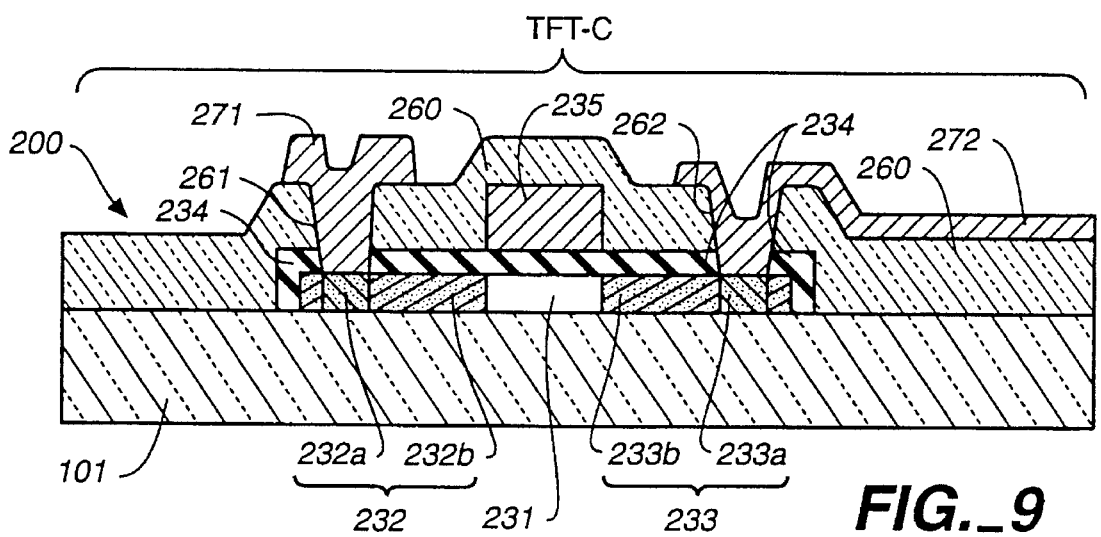
FIG._9

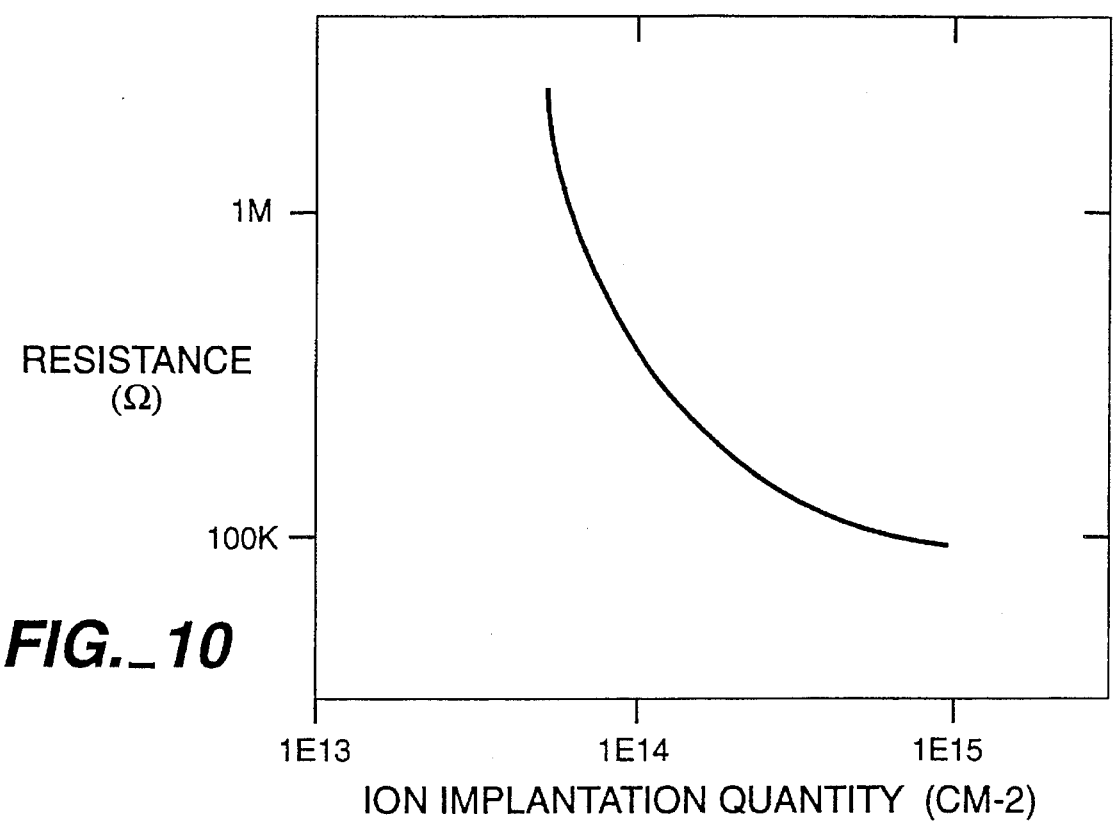
FIG._10
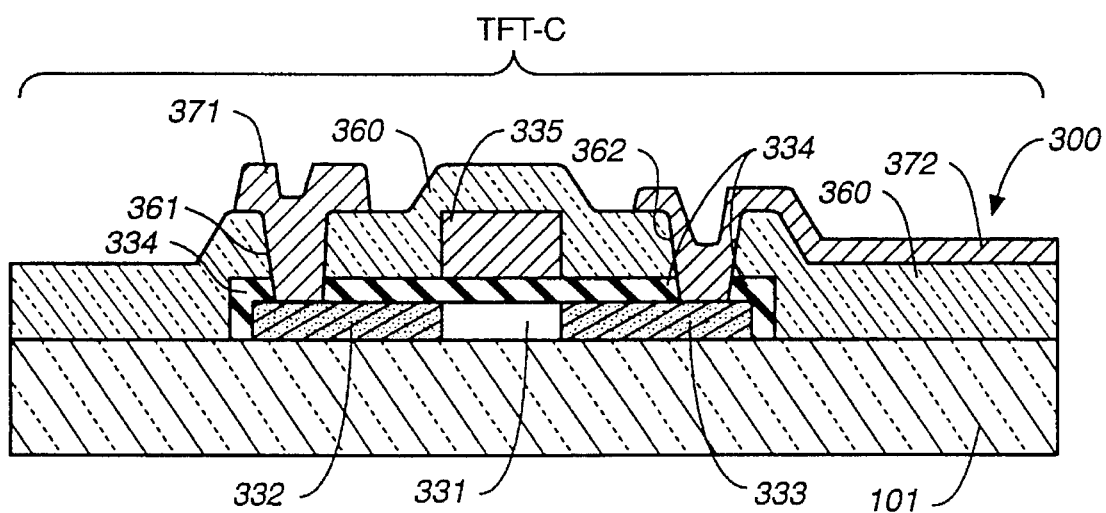
FIG._12

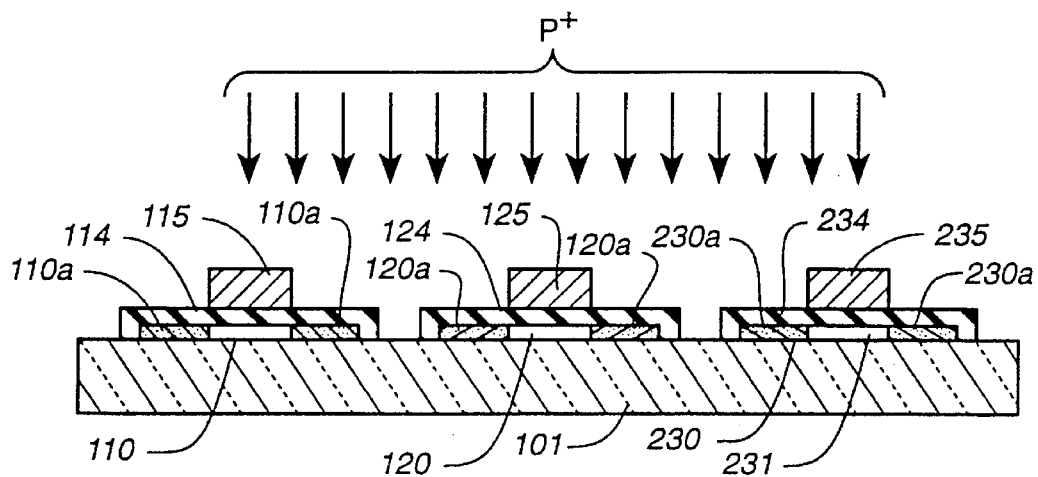
FIG._11A
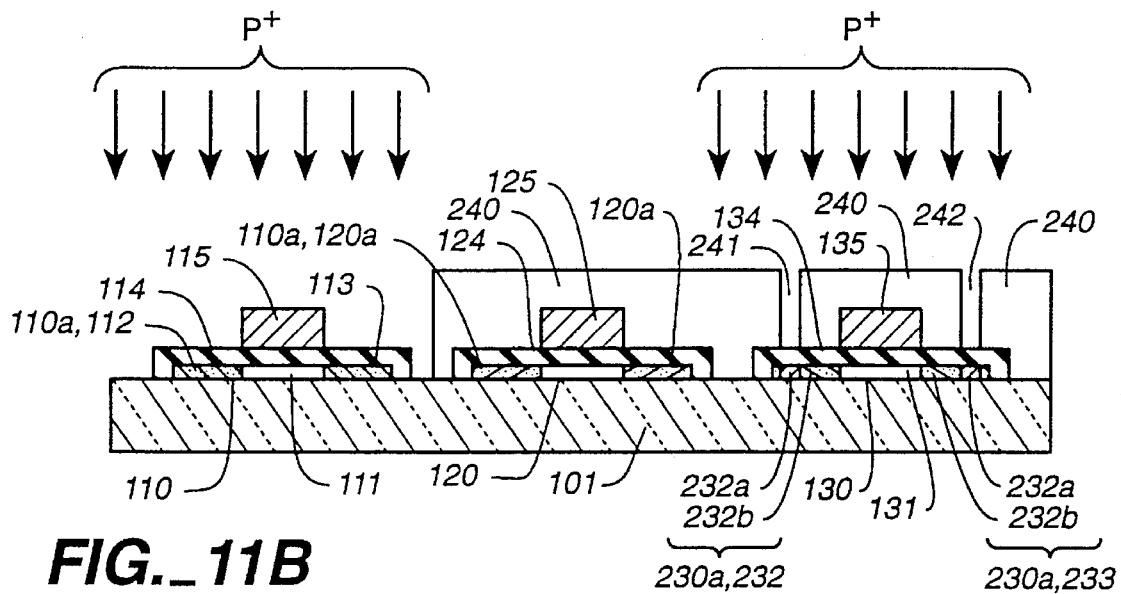
FIG._11B
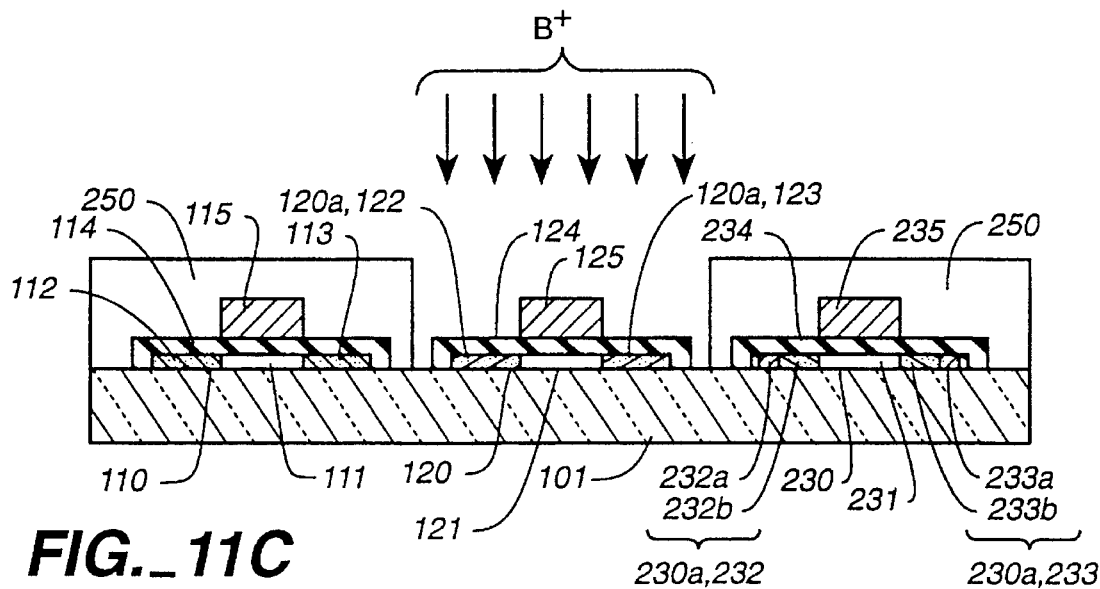
FIG._11C

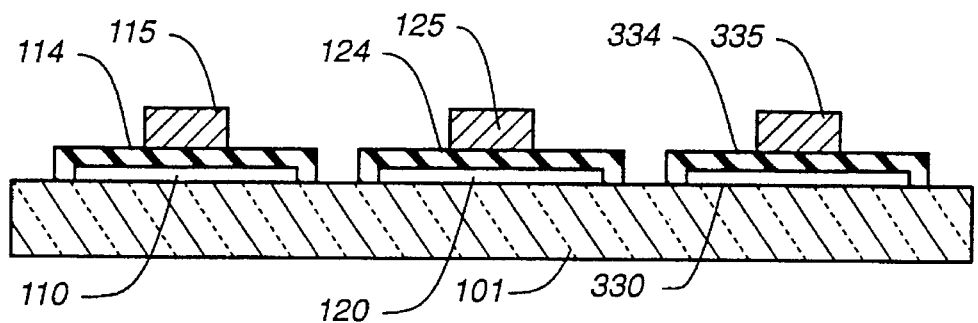
FIG._13A
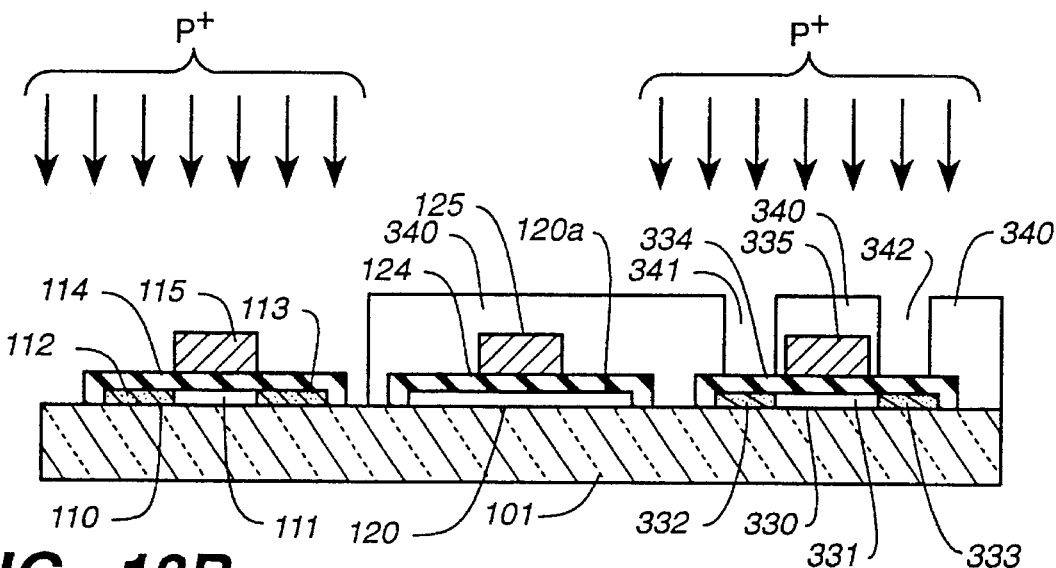
FIG._13B
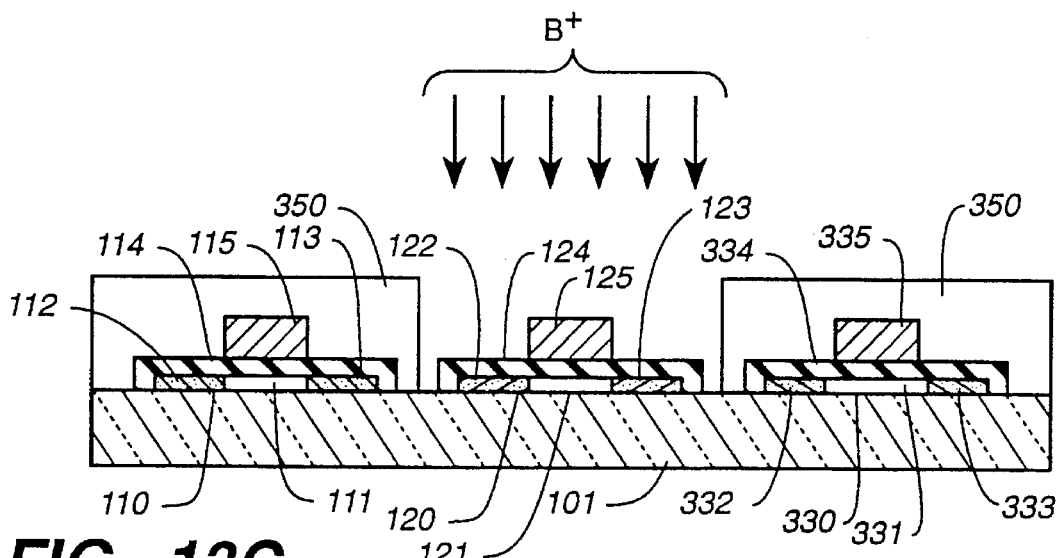
FIG._13C

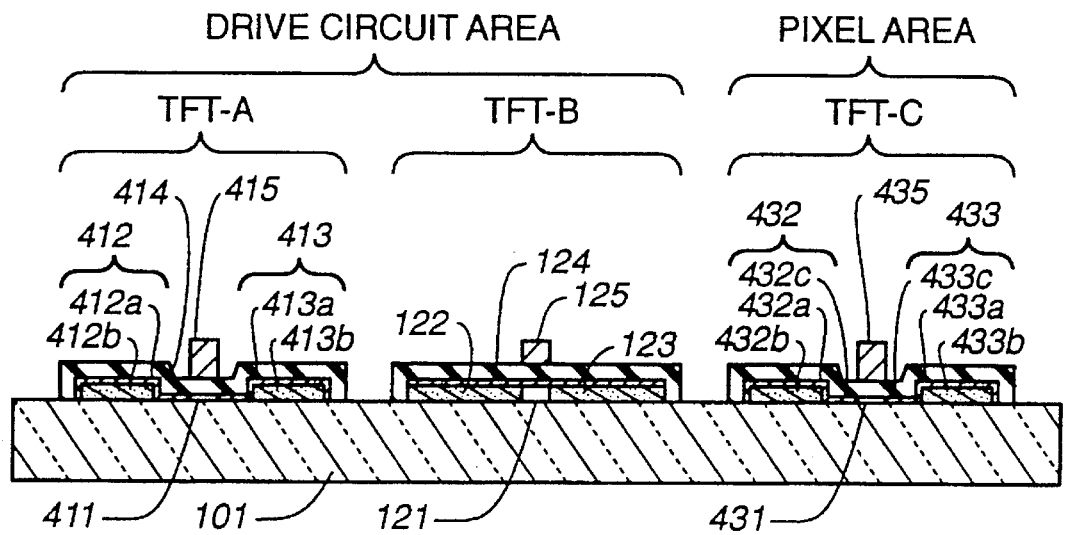
FIG._14
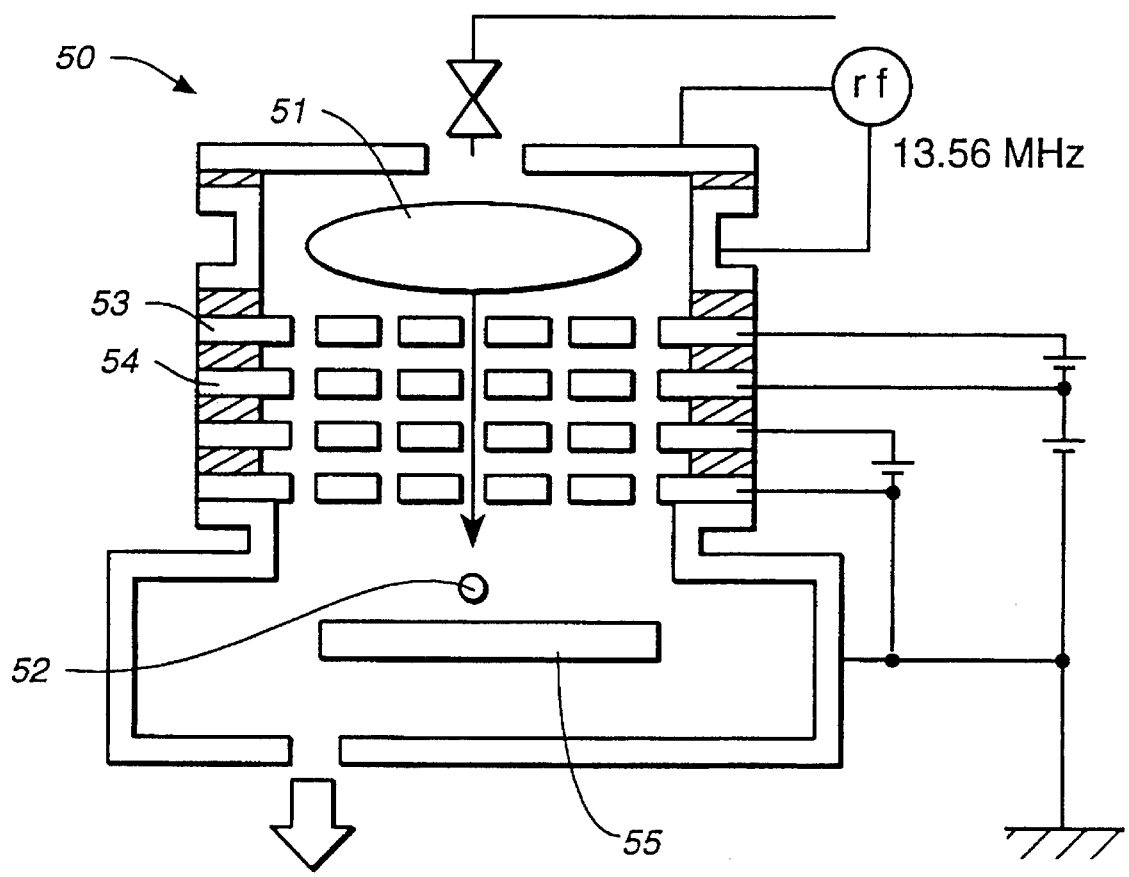
FIG._16

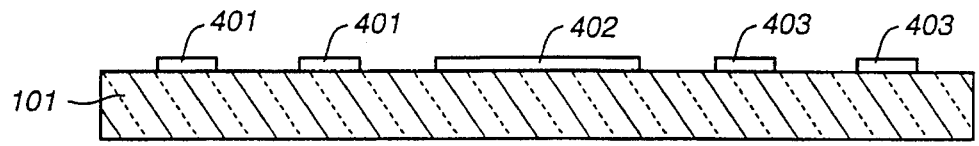
FIG._15A
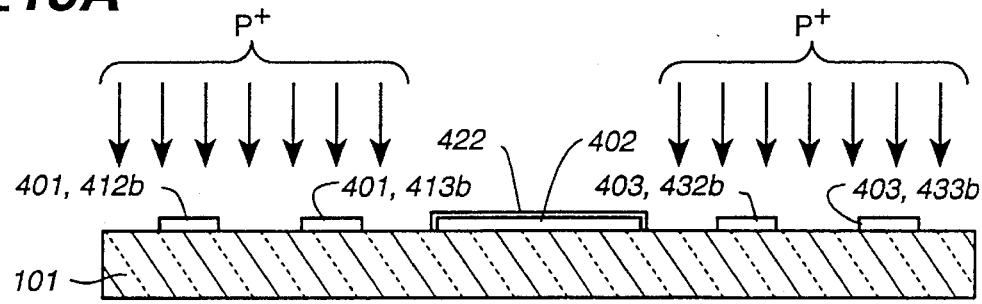
FIG._15B
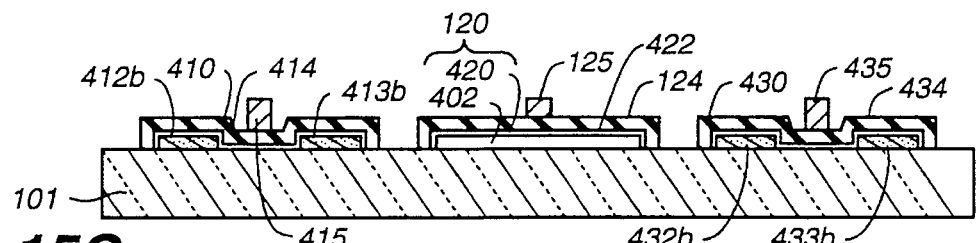
FIG._15C
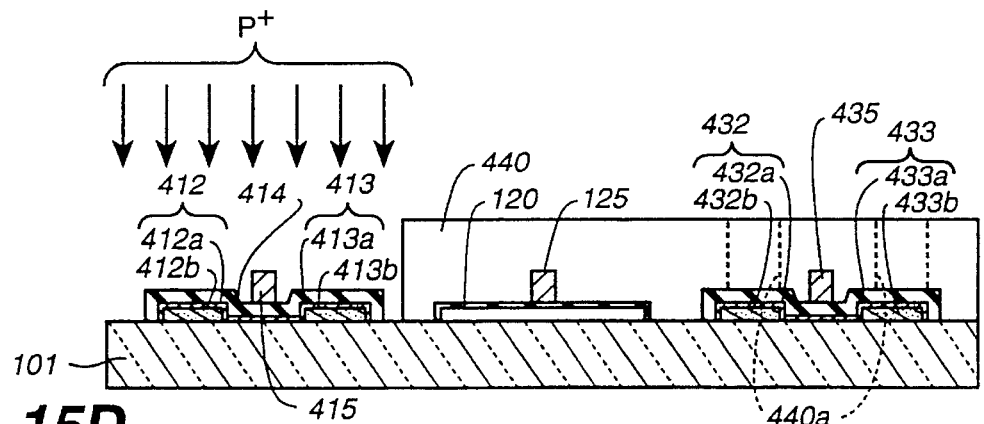
FIG._15D
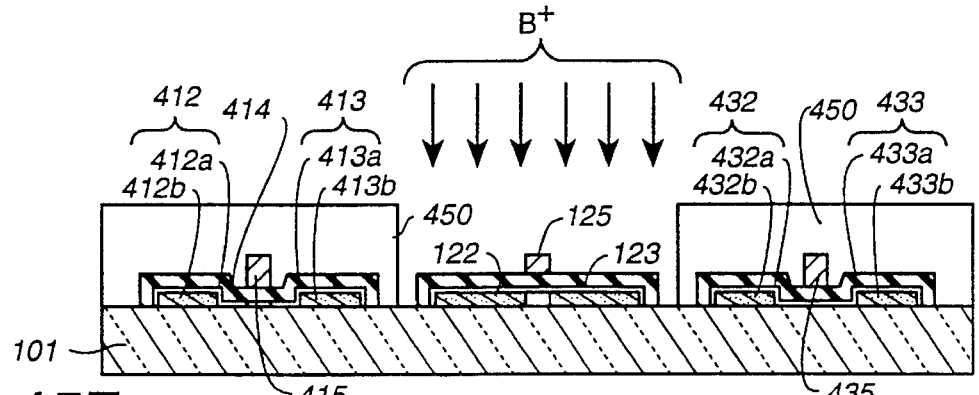
FIG._15E

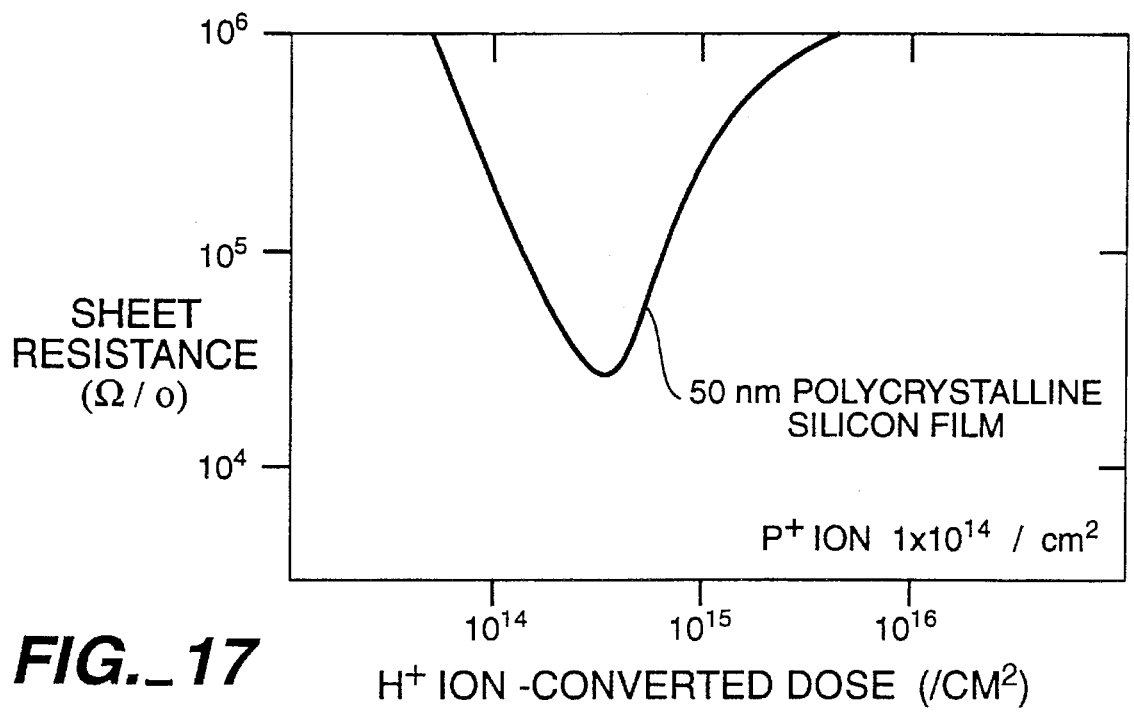
FIG._17
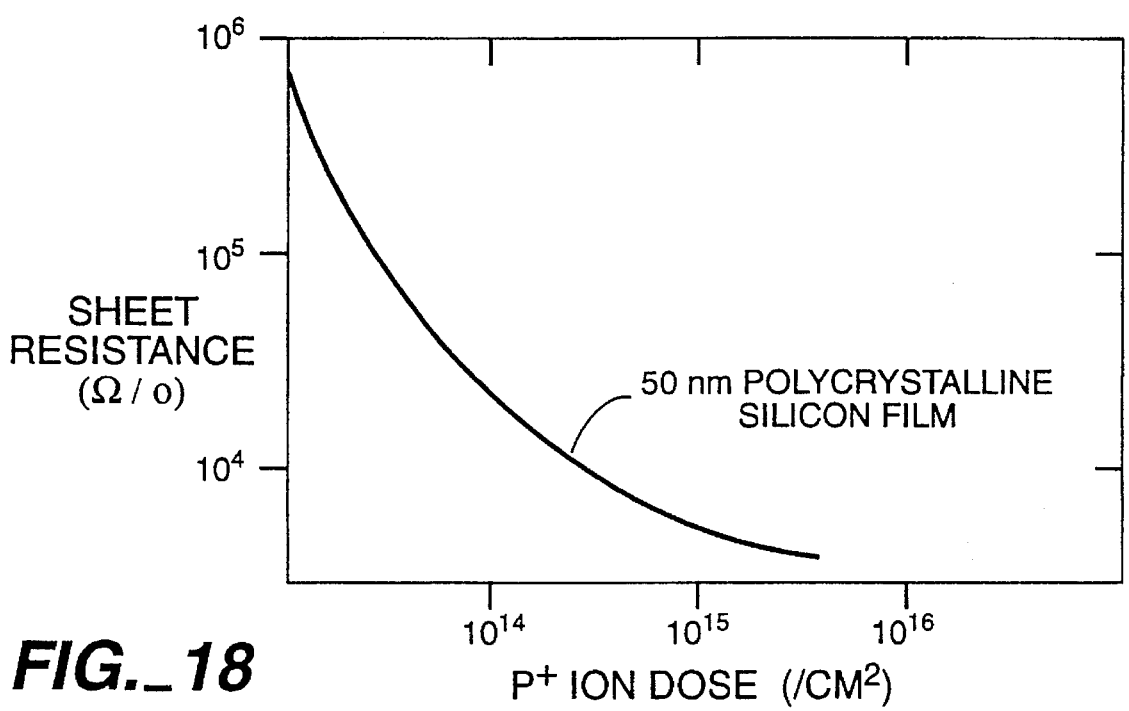
FIG._18

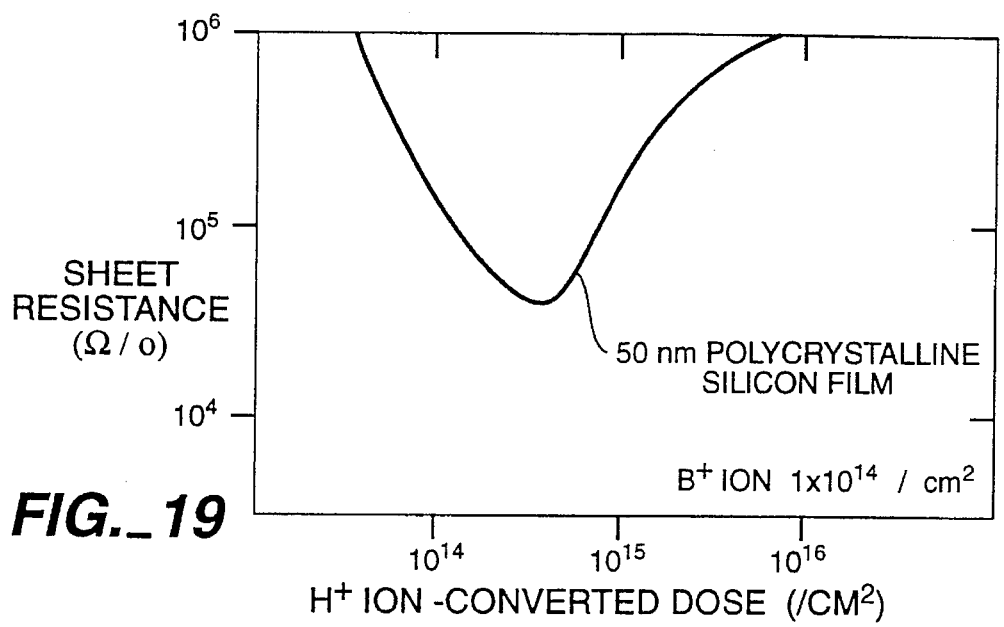
FIG._19
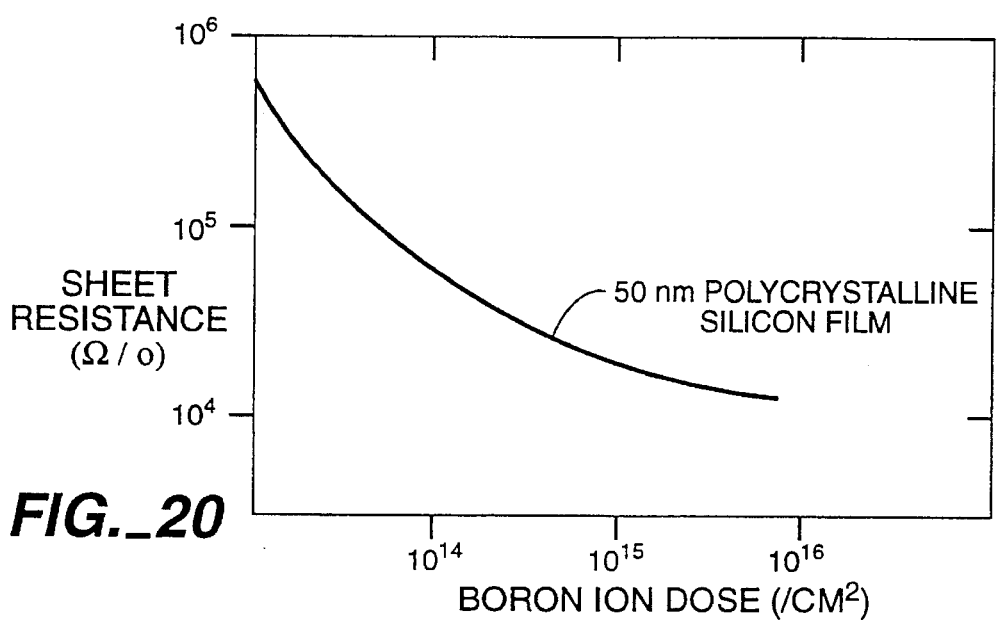
FIG._20
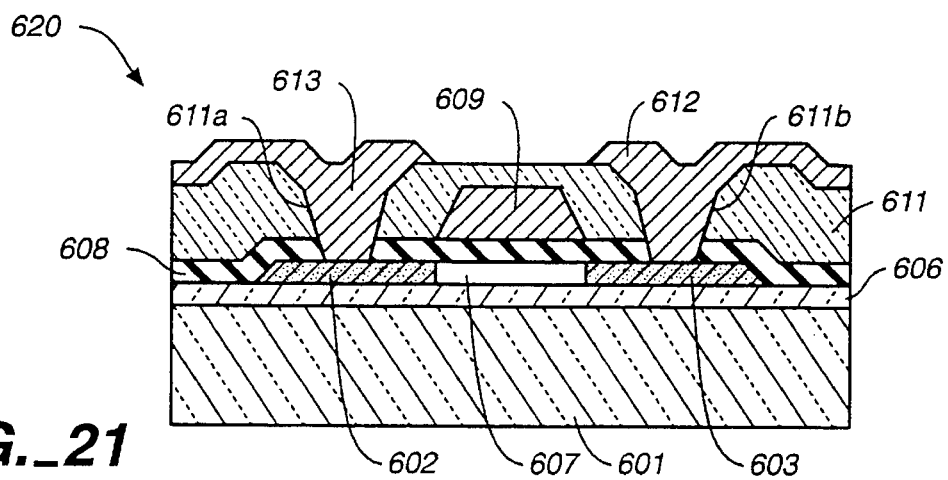
FIG._21

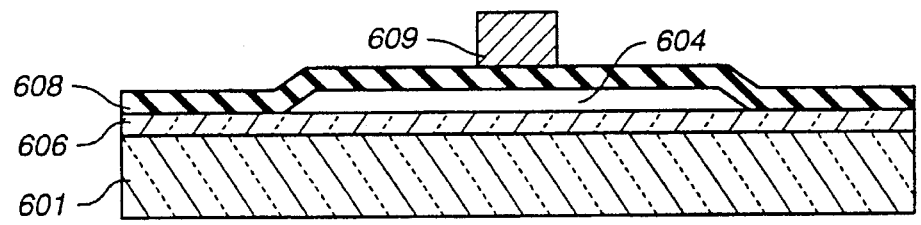
FIG._22A
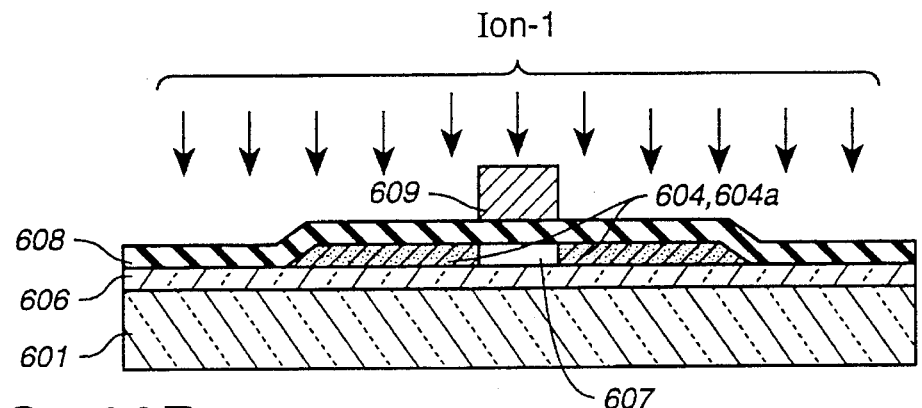
FIG._22B
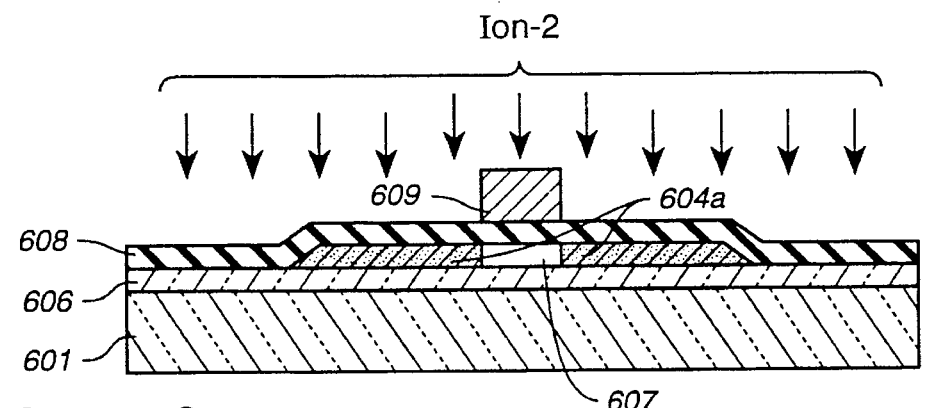
FIG._22C
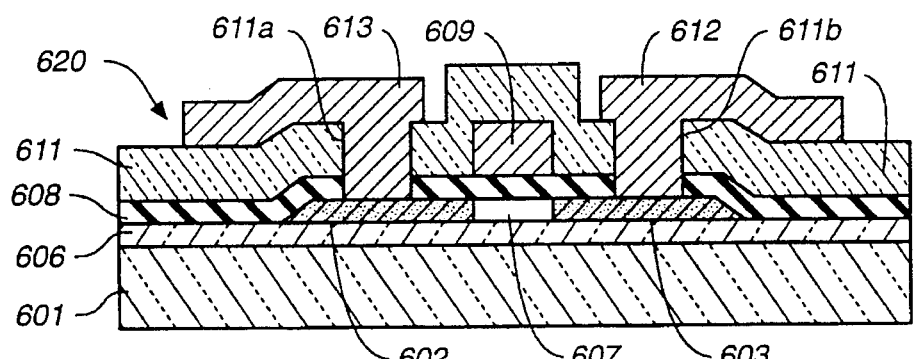
FIG._22D

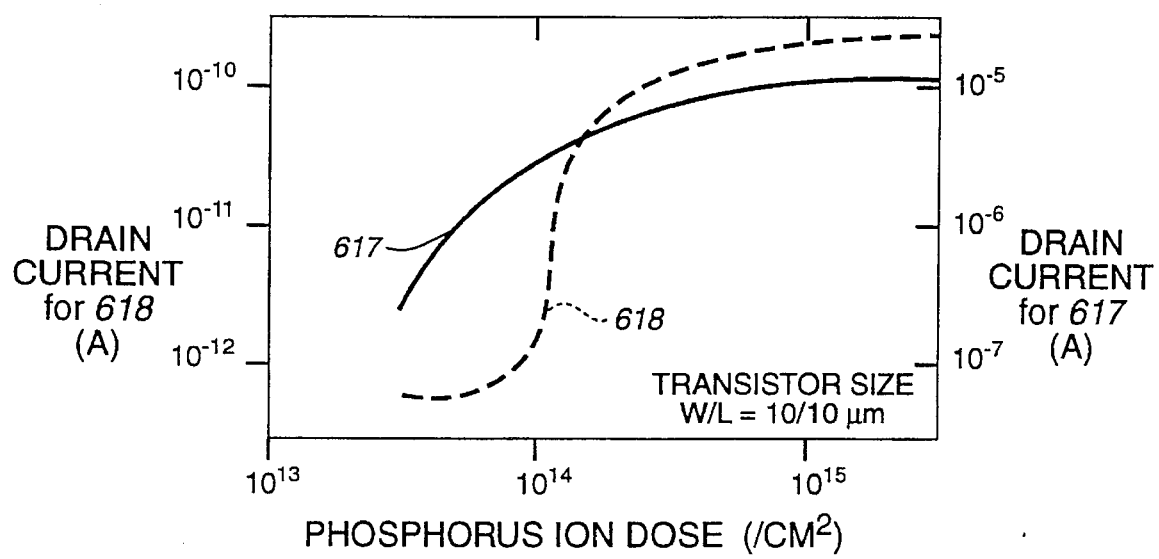
FIG._23
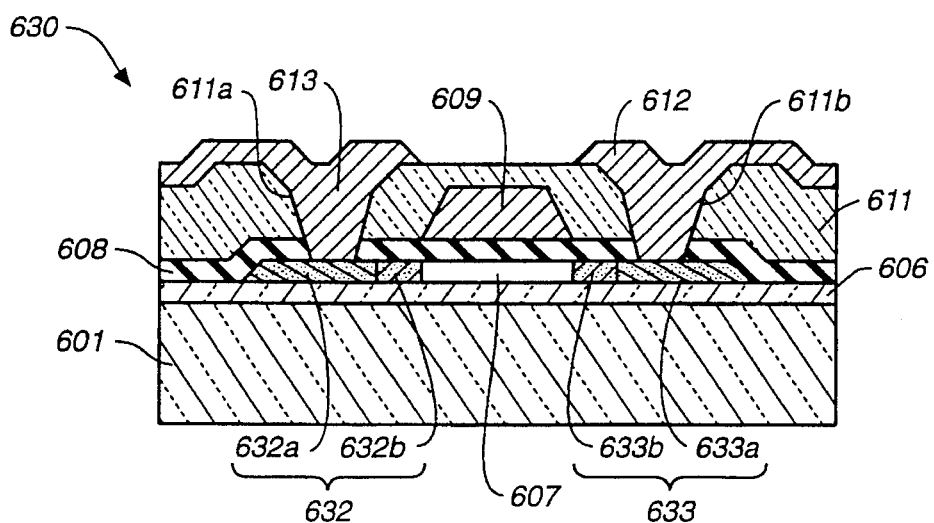
FIG._24

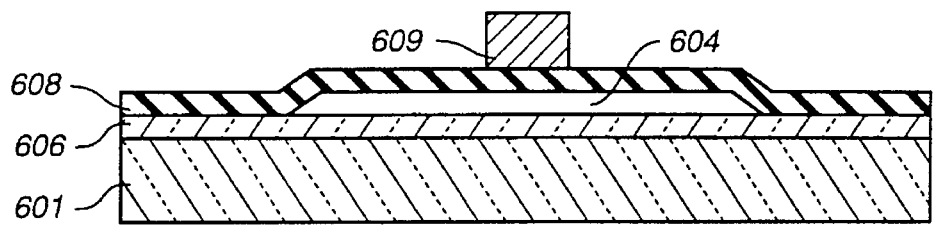
FIG._25A
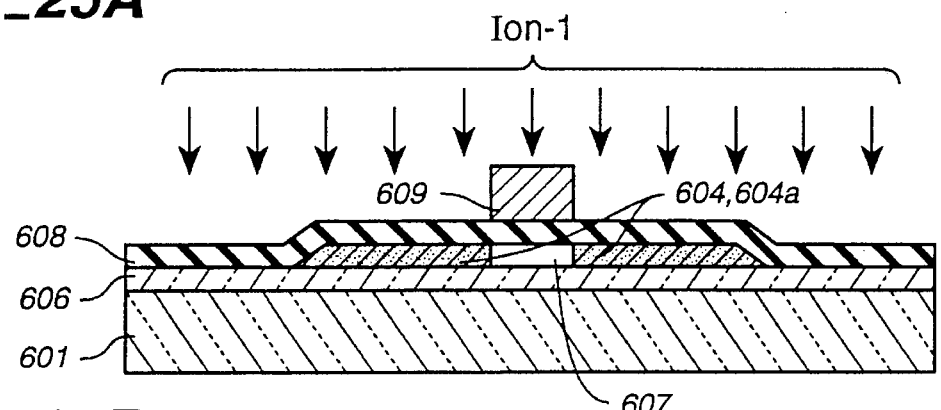
FIG._25B
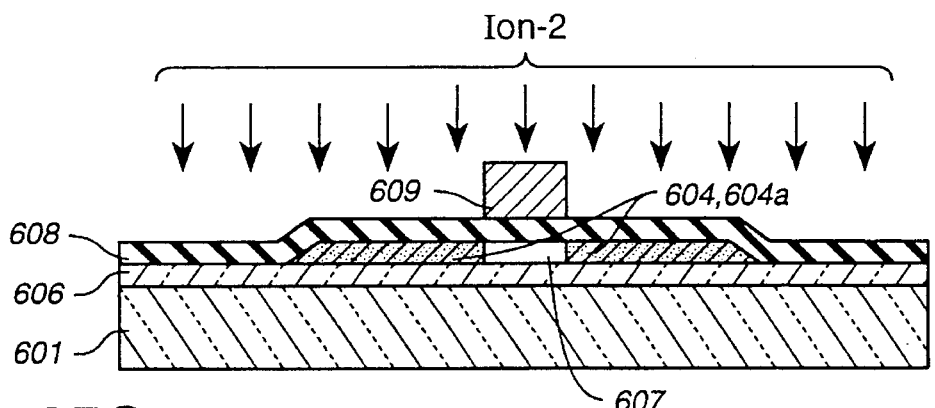
FIG._25C
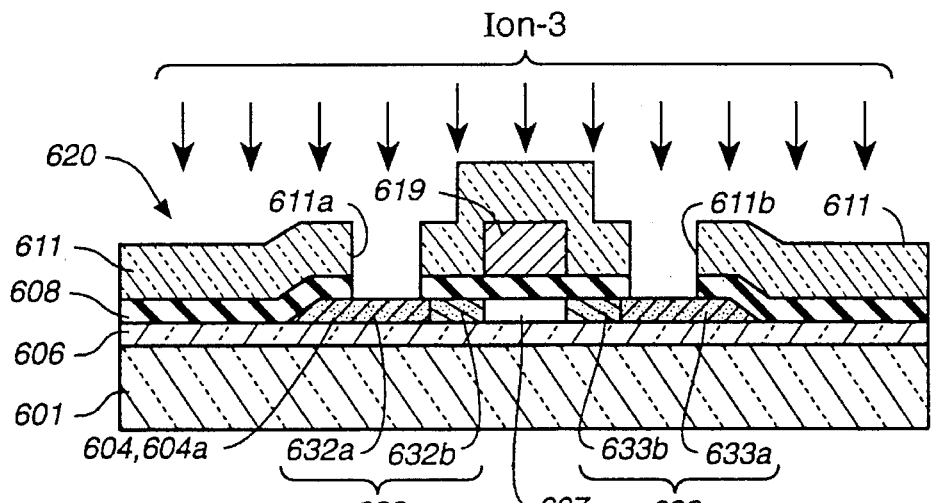
FIG._25D

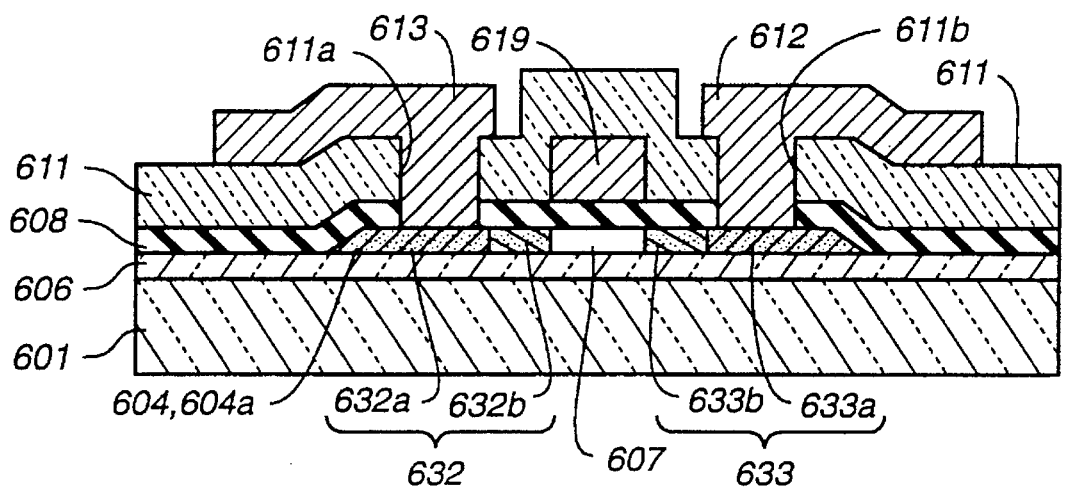
FIG._25E
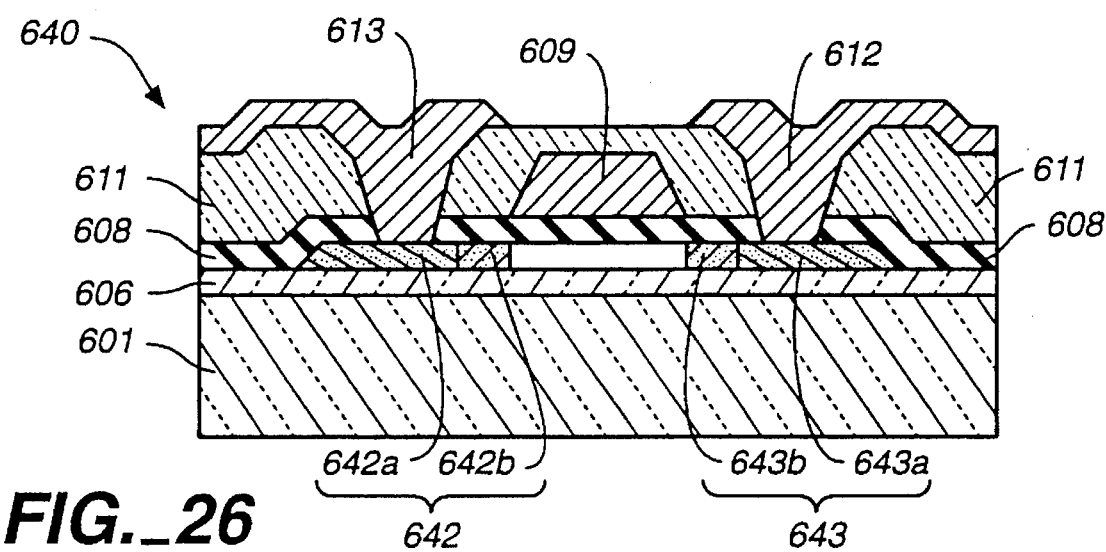
FIG._26

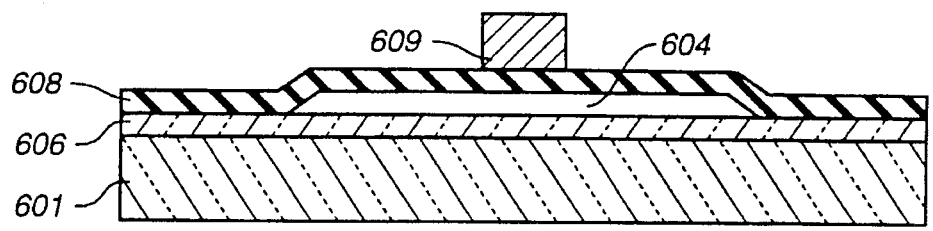
FIG._27A
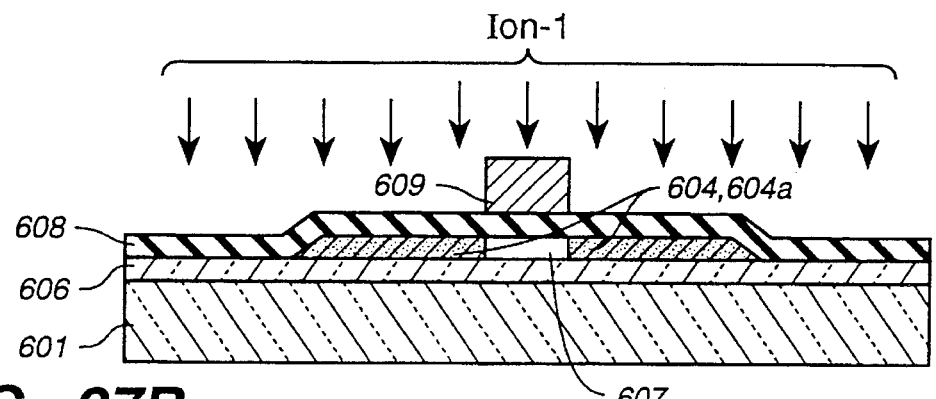
FIG._27B
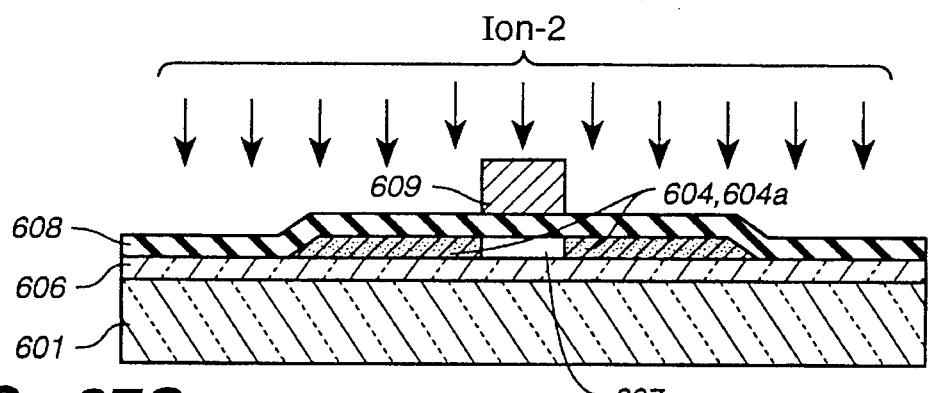
FIG._27C
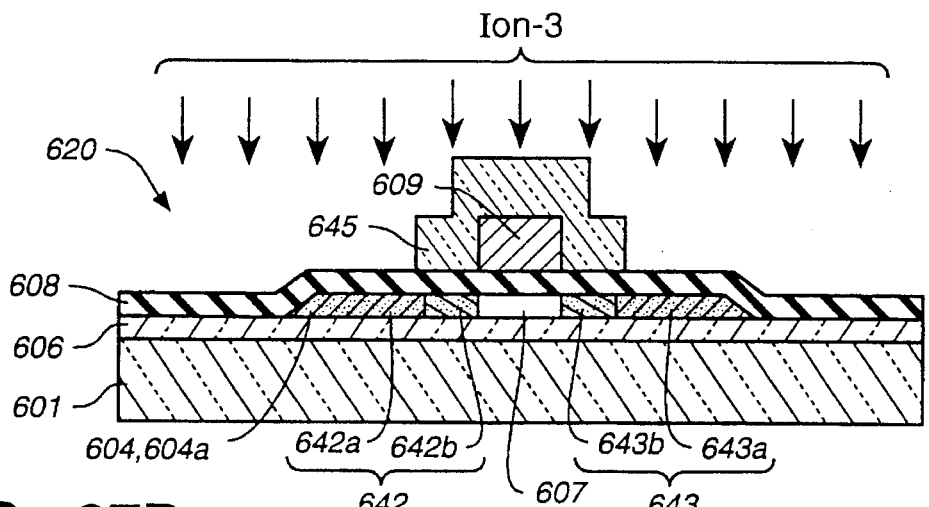
FIG._27D

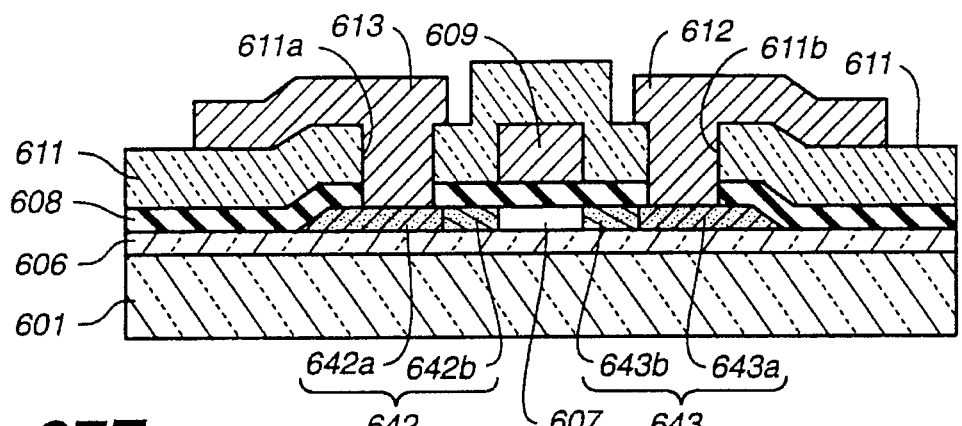
FIG._27E
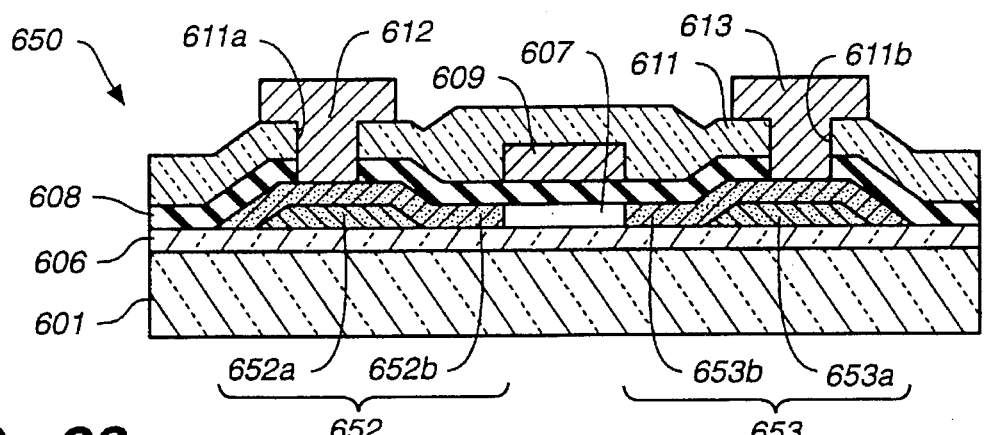
FIG._28
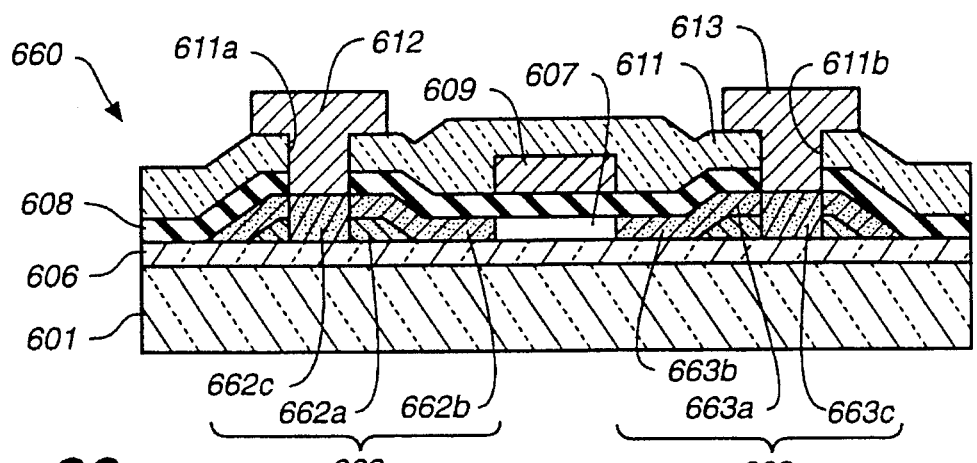
FIG._30

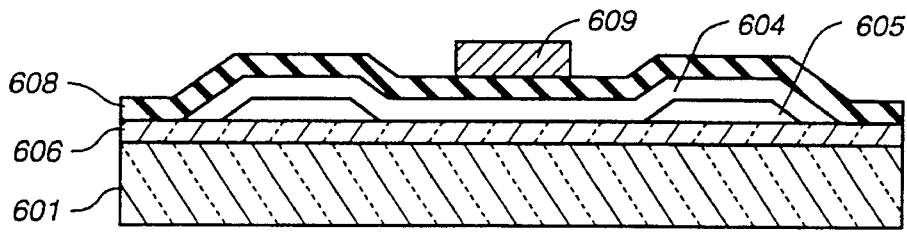
FIG._29A
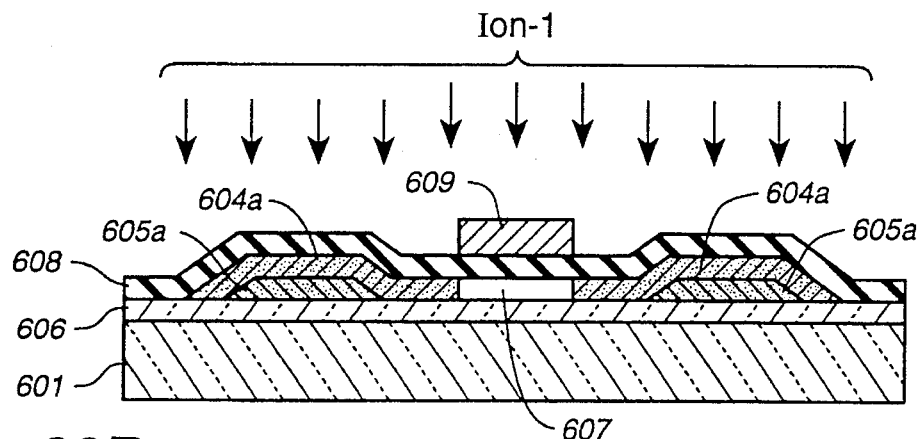
FIG._29B
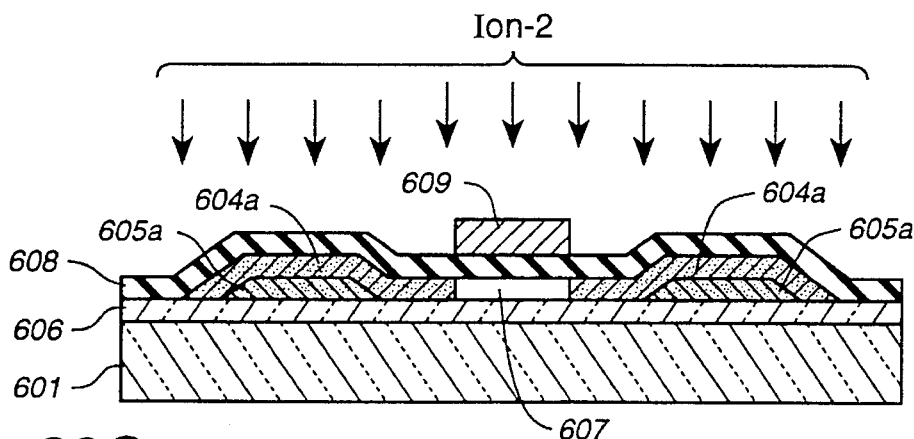
FIG._29C
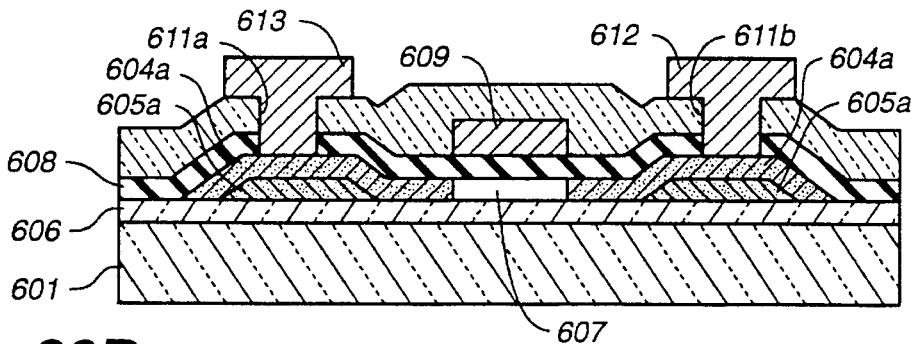
FIG._29D

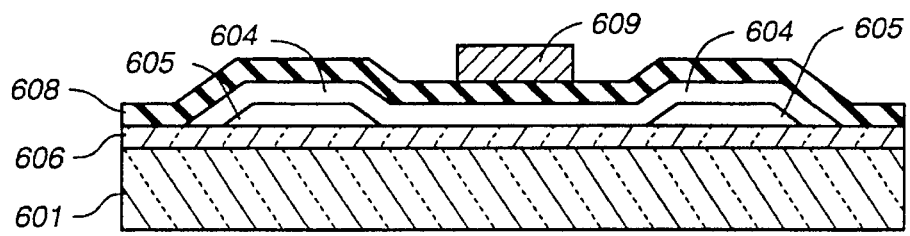
FIG._31A
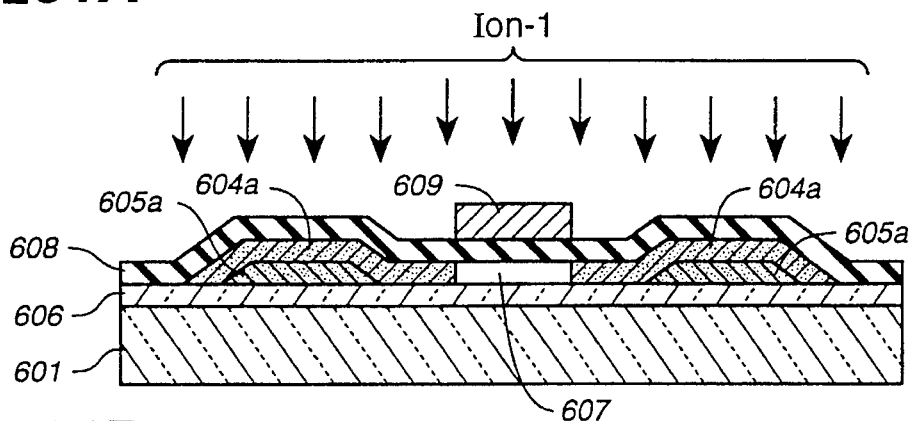
FIG._31B
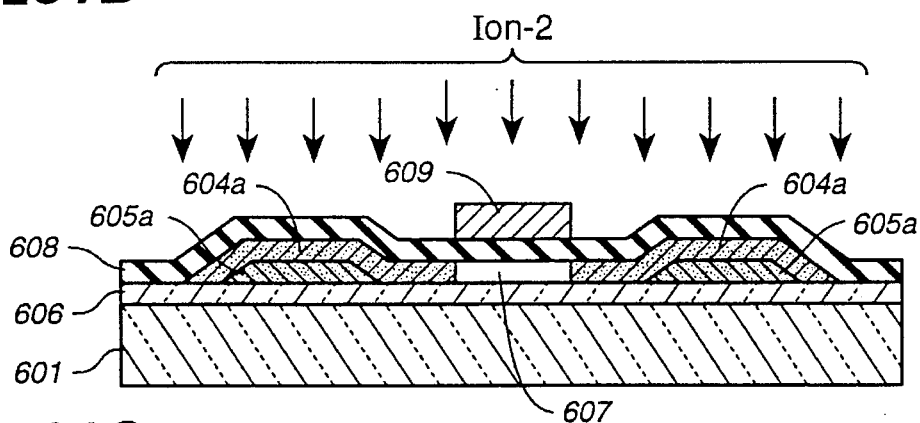
FIG._31C
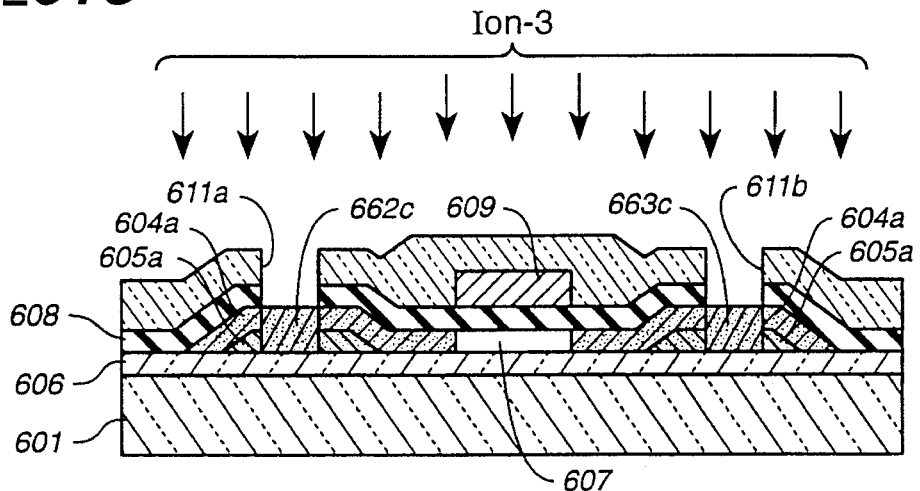
FIG._31D

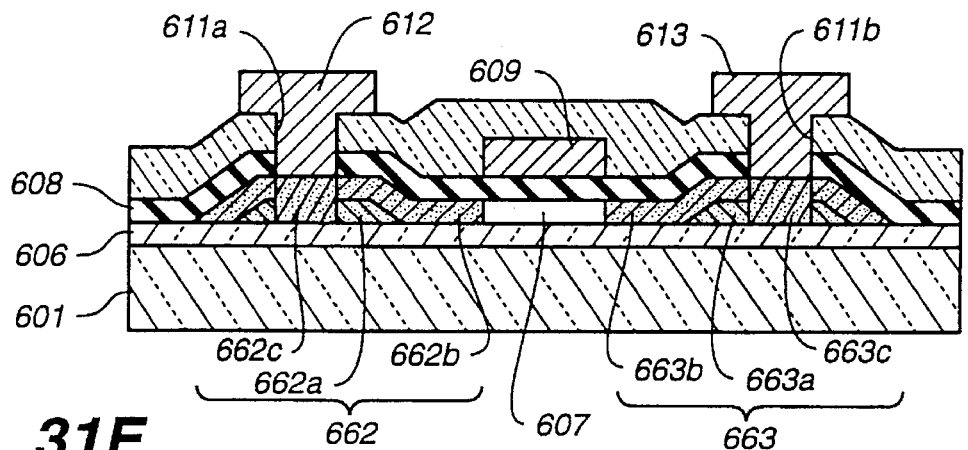
FIG._31E
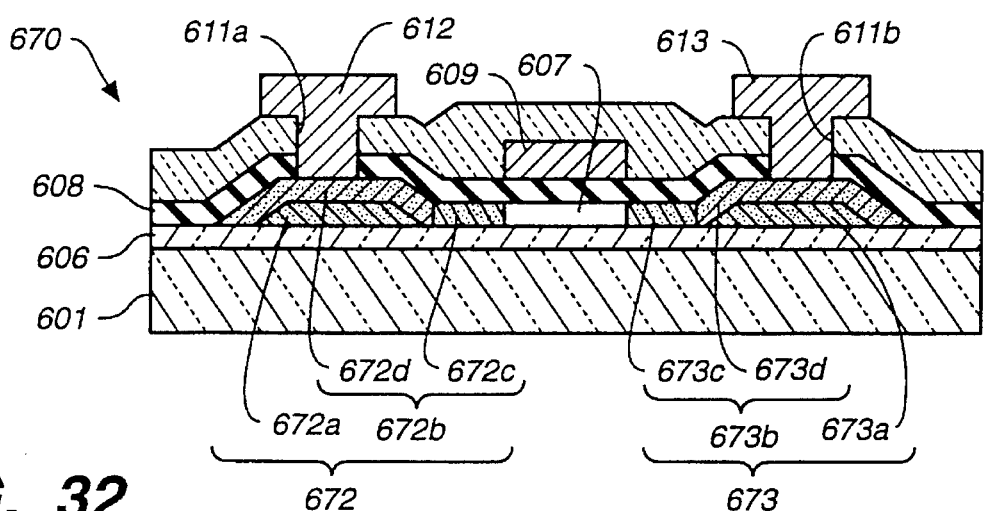
FIG._32
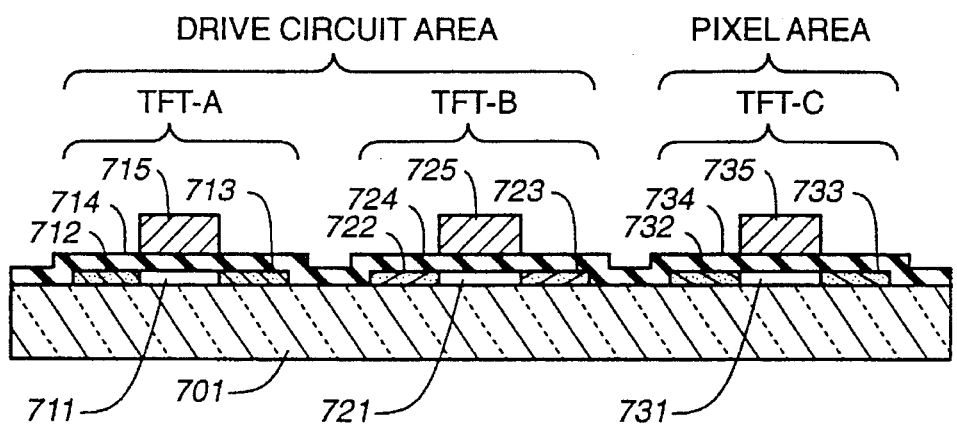
FIG._34

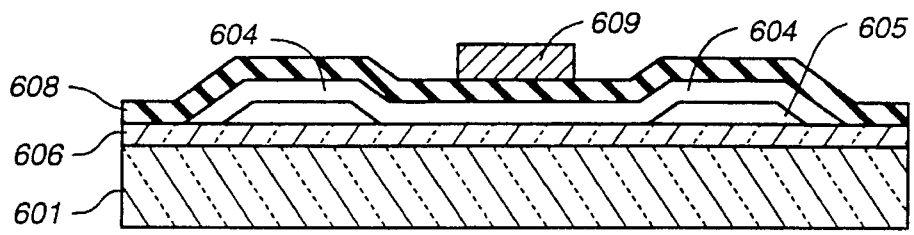
FIG._33A
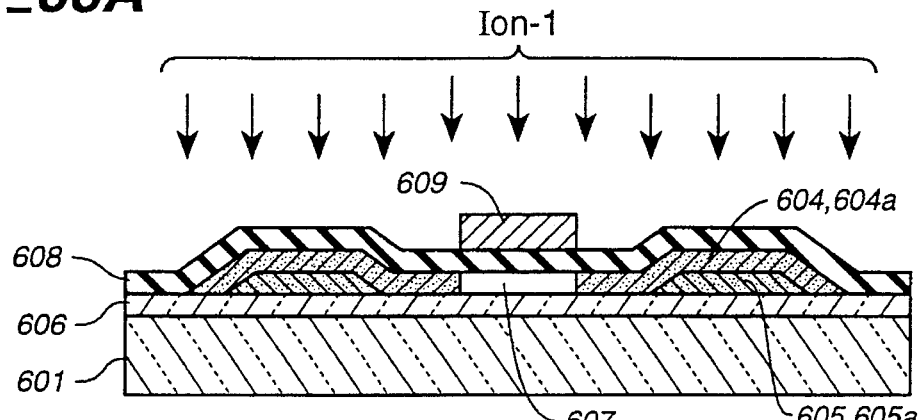
FIG._33B
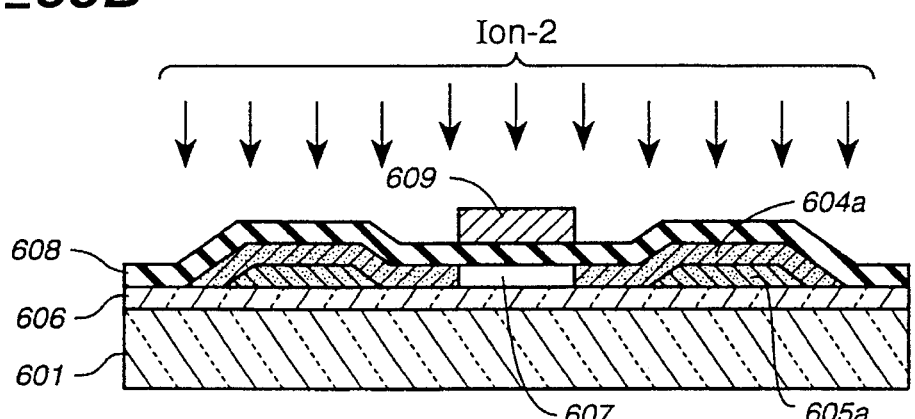
FIG._33C
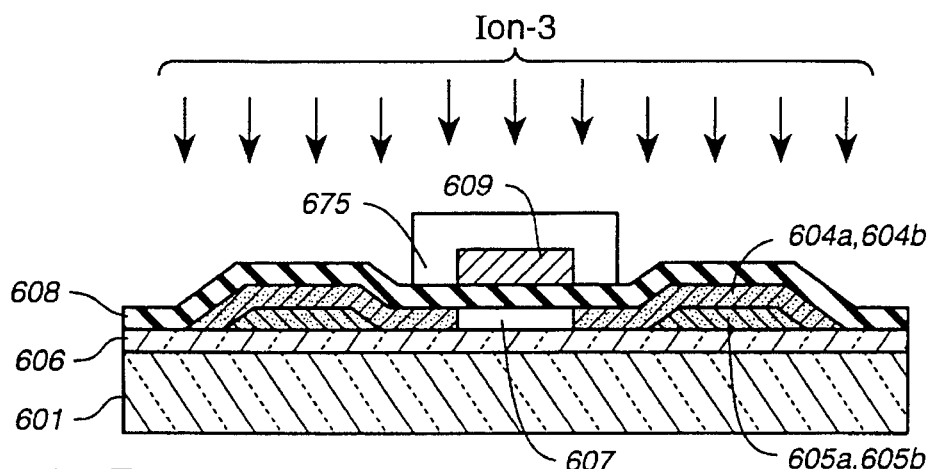
FIG._33D

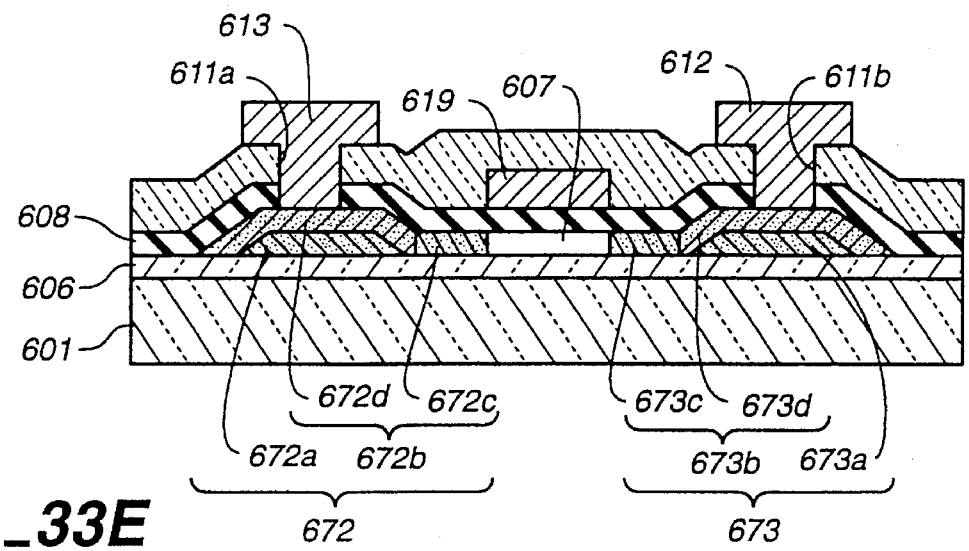
FIG._33E
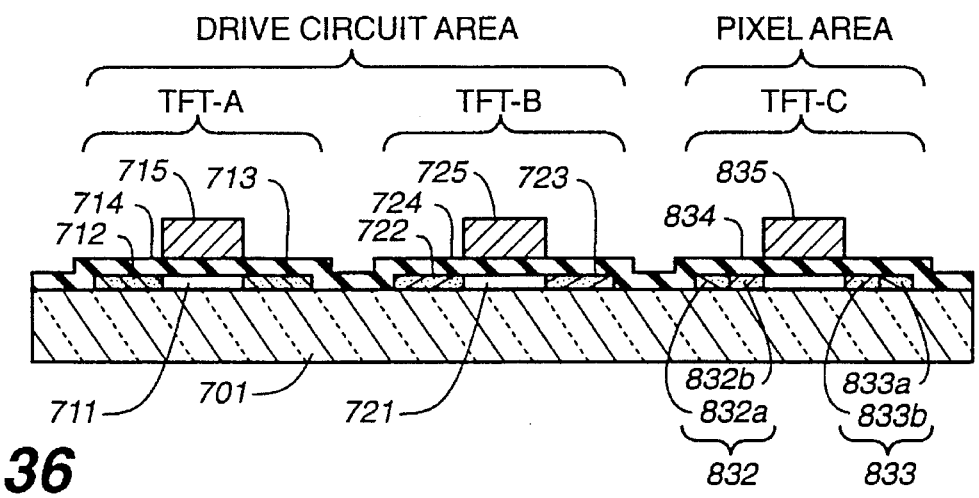
FIG._36
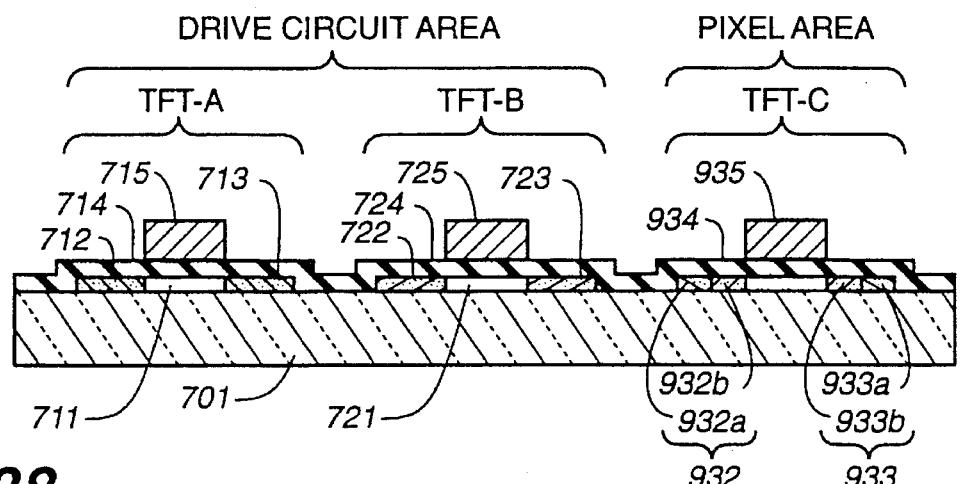
FIG._38

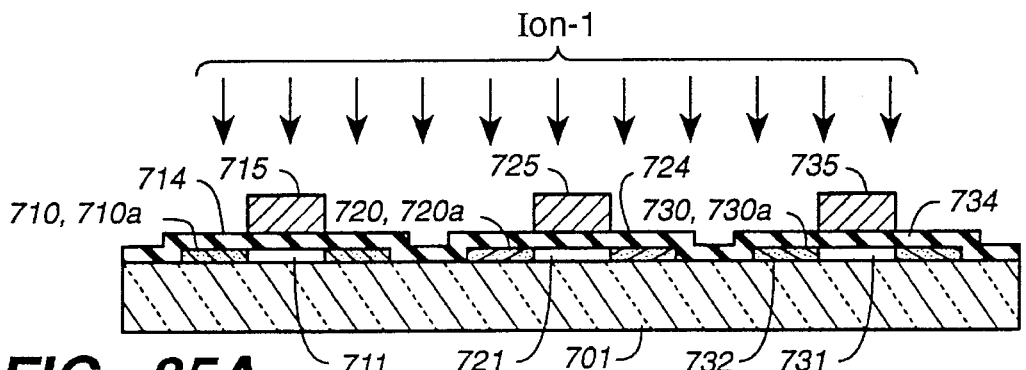
FIG._35A
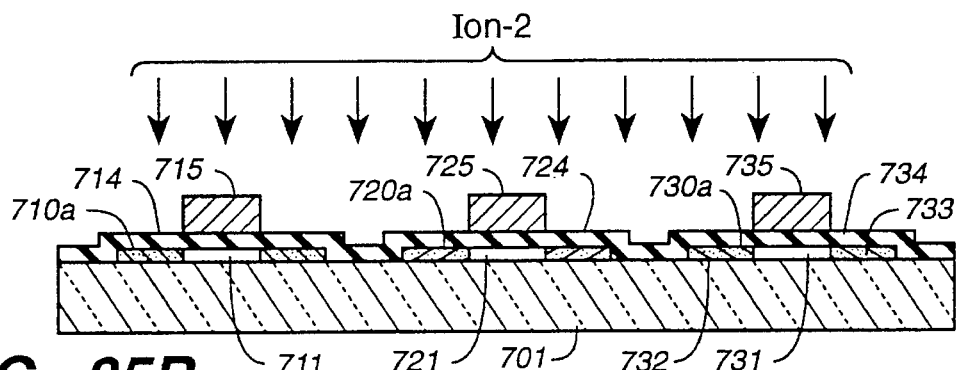
FIG._35B
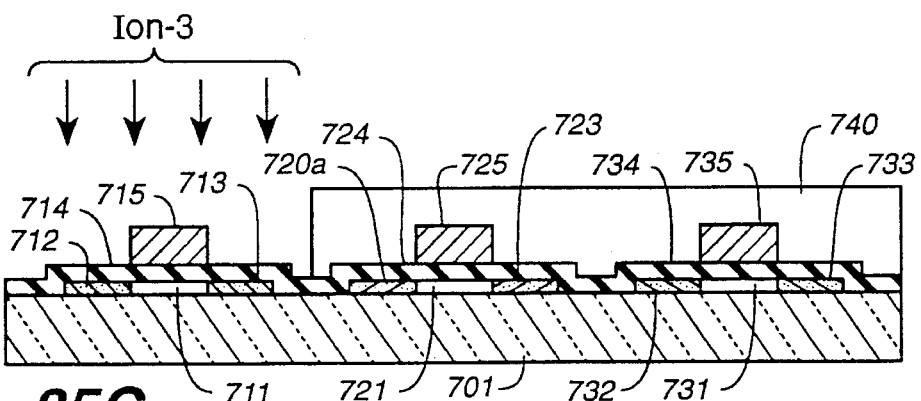
FIG._35C
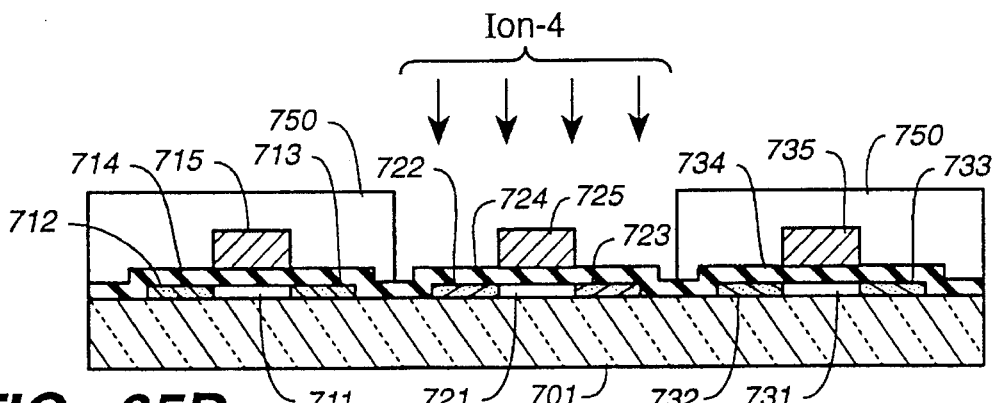
FIG._35D

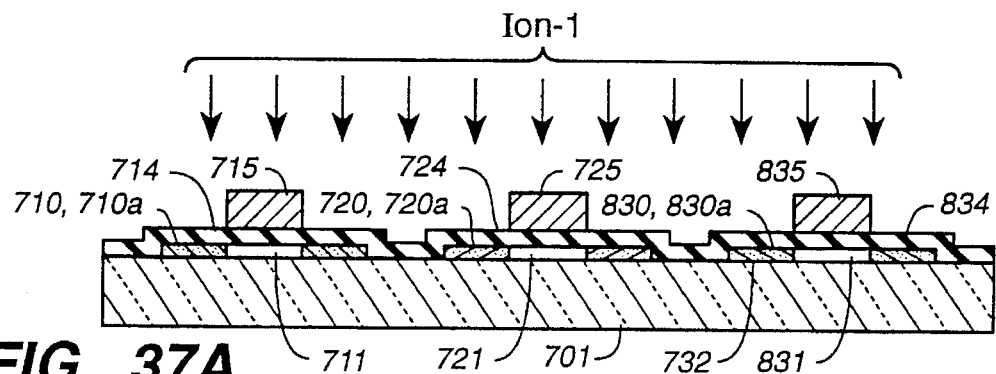
FIG. _37A
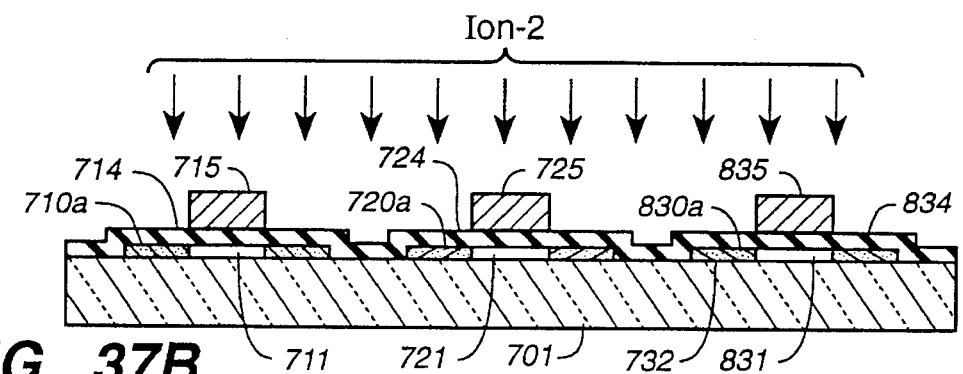
FIG. _37B
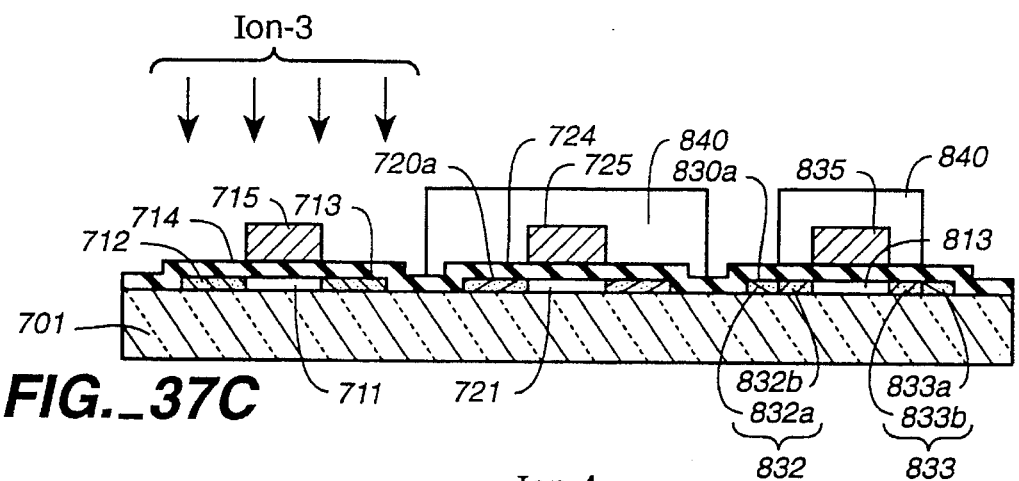
FIG. _37C
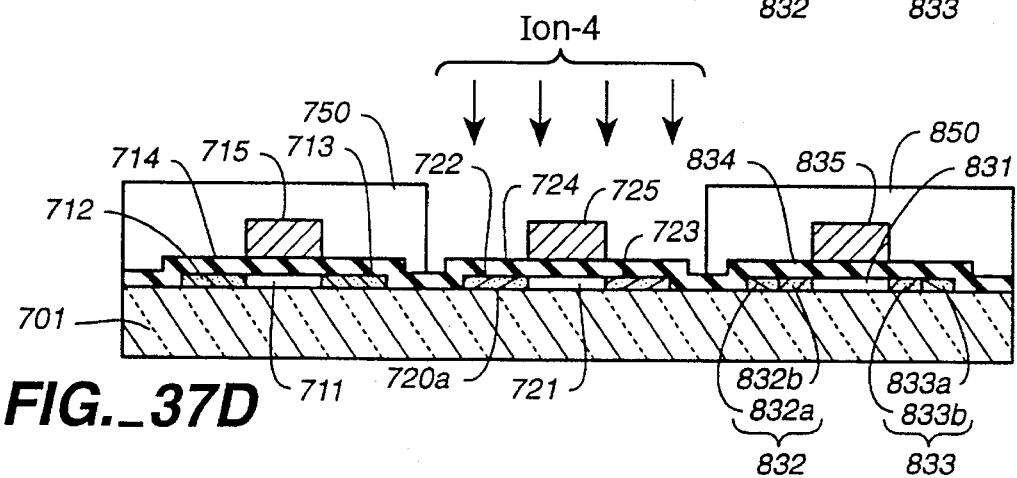
FIG. _37D

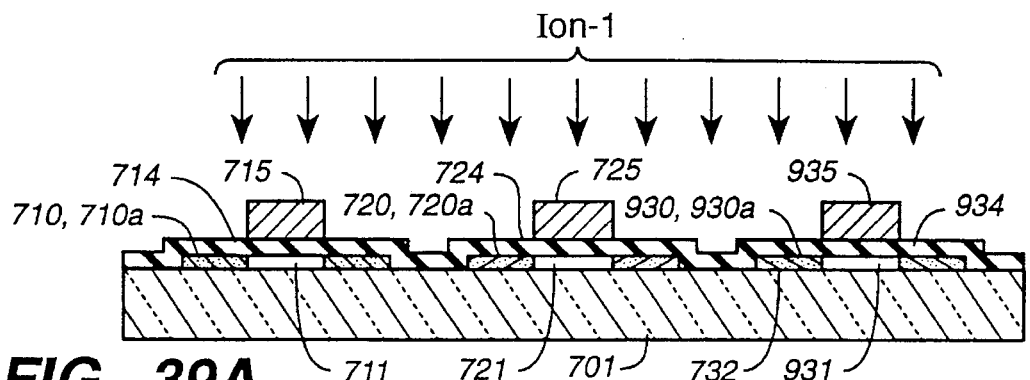
FIG._39A
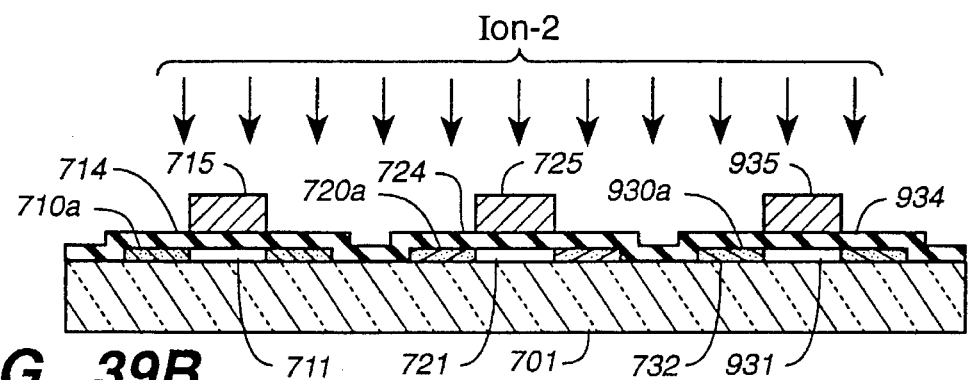
FIG._39B
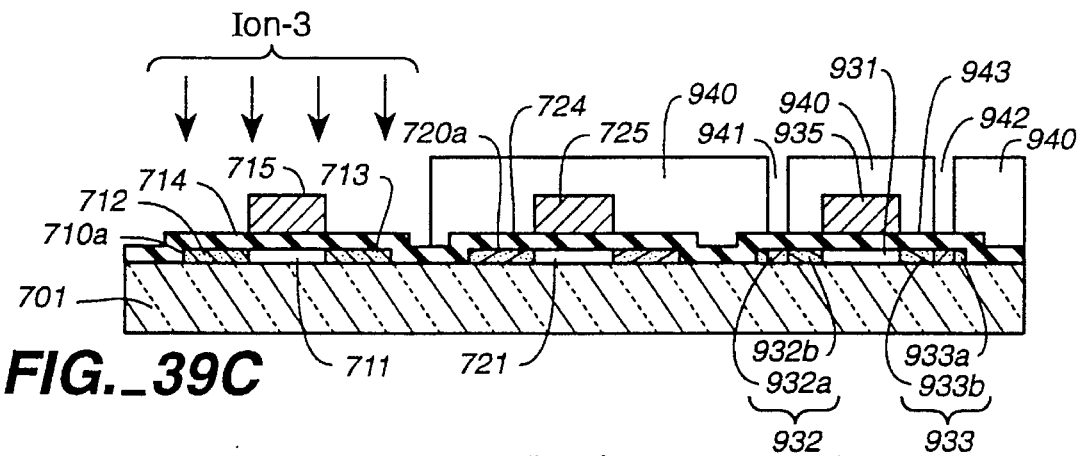
FIG._39C
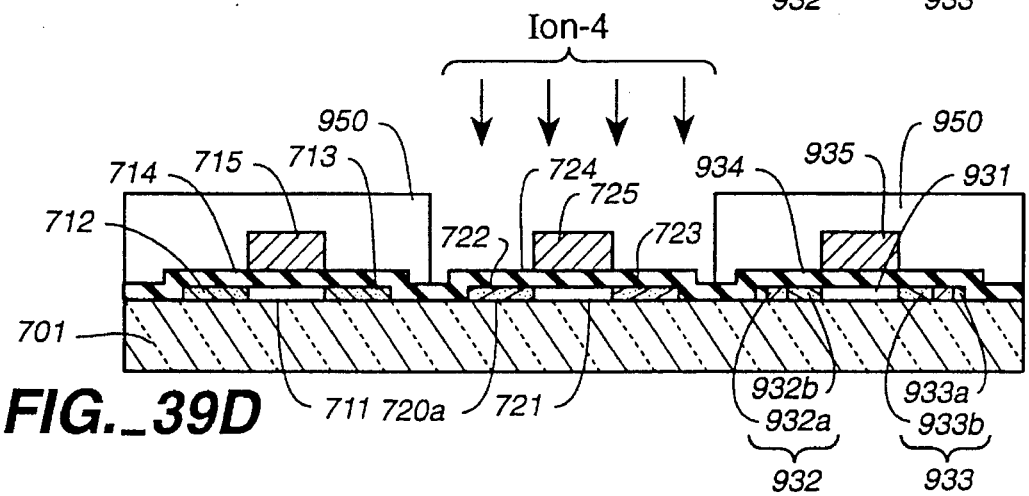
FIG._39D

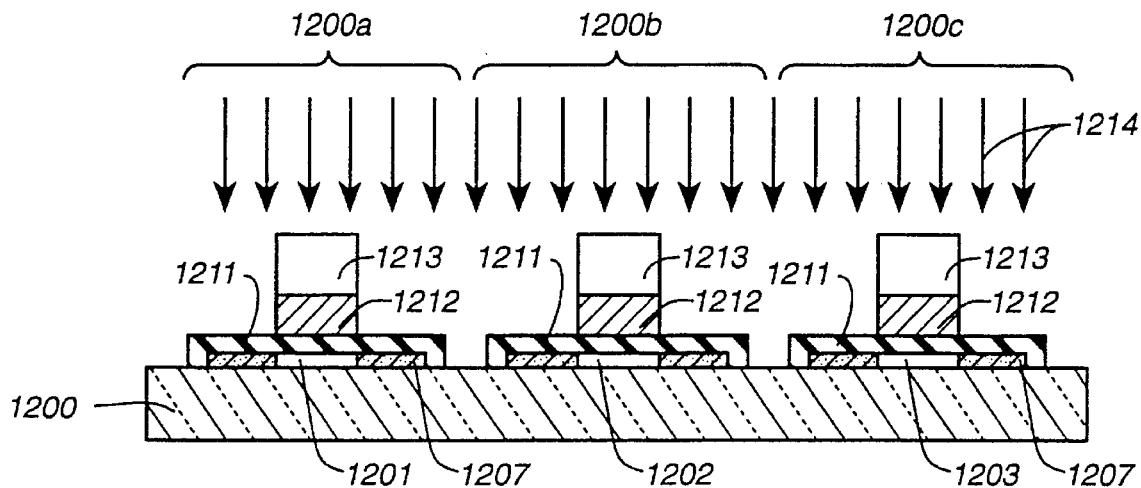
FIG._40A
(PRIOR ART)
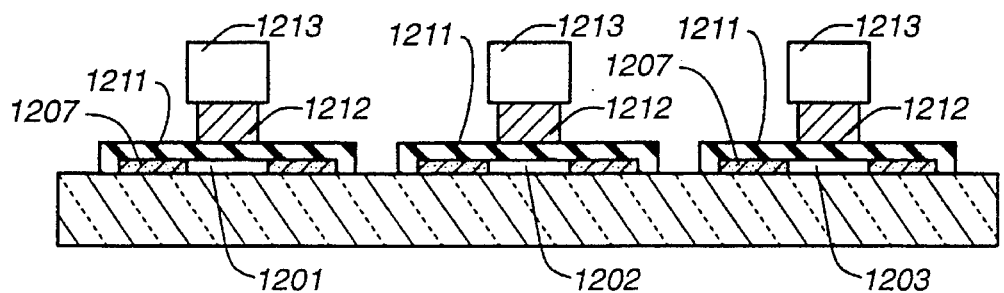
FIG._40B
(PRIOR ART)
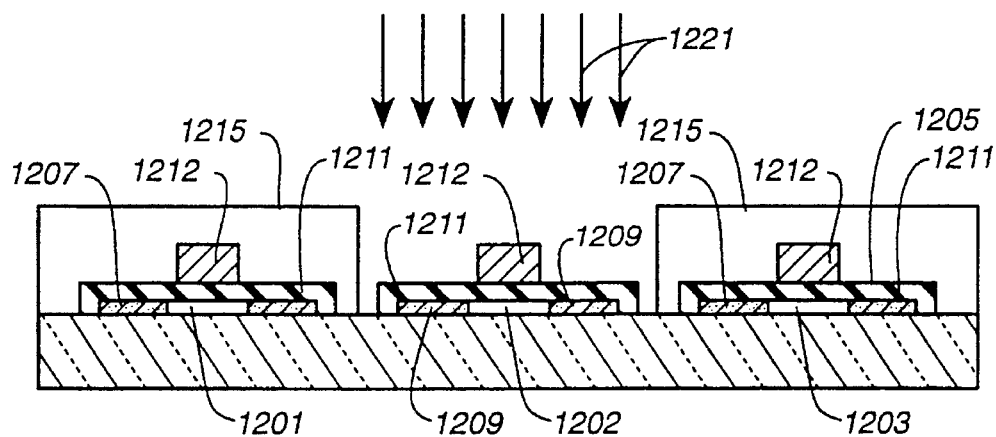
FIG._40C
(PRIOR ART)

ACTIVE MATRIX PANEL AND MANUFACTURING METHOD INCLUDING TFTS HAVING VARIABLE IMPURITY CONCENTRATION LEVELS

BACKGROUND OF THE INVENTION

1. Field of the Invention

The present invention relates to a thin-film transistor, an active matrix circuit board or active matrix panel, and a manufacturing method thereof. More particularly, the present invention relates to a technology improving the electrical characteristics of the thin-film transistor.

2. Description of the Related Art

Thin-film transistors (hereafter "TFT") which use a polycrystalline silicon film are used as pixel transistors in liquid crystal display panels and other active matrix circuit boards. Of the available liquid crystal display panels, active matrix circuit boards with integrated drive circuits (integrated peripheral circuits) which are formed using TFTs in the area peripheral to the pixel area are used in, for example, relatively small liquid crystal display panels for viewfinders and projectors because it is difficult to make electrical connections to narrow pitch terminals by using conventional assembly technology. As a result, drive circuit TFTs and pixel TFTs must both be formed on the same active matrix circuit board.

Of these TFTs, a low OFF current is required in the TFT of the pixel area so that the charge written through the pixel electrodes can be maintained. Polycrystalline silicon TFTs, however, may use an offset gate structure wherein a source-drain region is provided at a position separated from the edge of the gate electrodes due to a high OFF current.

In addition, a lightly doped region (LDD region) may be provided at the edge of the drain region in order to reduce the electrical field strength therein.

The following manufacturing method is conventionally used to manufacture thin-film transistors with such a structure.

FIGS. 40–40B depict the formation of an n-channel type TFT 1200a in the drive circuit area, p-channel type TFT 1200b in the drive circuit area, and n-channel type TFT 1200c in the pixel area from left to right facing the figure. First, second, and third silicon films 1201, 1202, 1203 are first formed on the surface side of substrate 1201. The surface sides of the first, second, and third silicon films 1201, 1202, 1203 are then covered by gate insulation film 1211. After that, a conductive film which can comprise the gate electrode is formed on the surface side of the gate insulation film 1211. This conductive film, in turn, is etched using resist layer 1213 for a mask and results in formation of gate electrode 1212.

Next, as indicated by arrow 1214, impurity ions representing donors are implanted, and source-drain area 1207 is formed. Gate electrode 1212 is over-etched with resist 1213 as the mask, and gate electrode 1212 is narrowed as shown in FIG. 40B. As a result, the length of gate electrode 1212 is shorter than the length of the region (channel region) in first, second, and third silicon films 1202, 1202, 1203 in which impurity ions are not, and the offset gate structure is formed.

Next, as shown in FIG. 40C, impurity implanted ions representing the acceptors are implanted (arrow 1221) to second silicon film 1202 with first and third silicon films 1201, 1203 covered by resist 1215. As a result, source-drain region 1209 is formed. In this case, since the donor impurity was previously implanted to second silicon film 1202, the dose of acceptor impurity is much higher than the concentration of donor impurity implanted in the second film.

Note that when TFTs 1200a and 1200c are formed with an LDD structure, resist 1215 is removed after implanting acceptor and donor impurity at their appropriate respective doses. IN the TFT having the offset or LDD structure thus formed, the OFF current can be sufficiently lowered because the electrical field strength at the drain edge can be reduced.

The following problems exist with the conventional manufacturing method thus described, however.

First, even though TFT electrical characteristics vary with the gate length, this method sets the gate length by over-etching the gate electrode, and it is therefore difficult to control the gate length. For example, when a gate electrode composed of polycrystalline silicon is plasma etched, it is possible to determine the end of the etching cycle because the plasma emission strength changes at the etching endpoint in the normal etching mode, but it is difficult to reliably control etching as a whole because plasma emission strength not change in over-etching mode. In addition, it is also difficult to control over-etching when over-etching is controlled by the etching time because the etching speed varies slightly with the operating conditions, etc., of the etching equipment. As a result, the ON current characteristic and other electrical characteristics of TFT manufactured with conventional methods inevitably vary due to variations in gate length and offset length. Variations of this type are fatal defects in drive circuit TFT formed by the same process. Due to over-etching, it is also difficult to decrease TFT size More specifically, the active matrix circuit board must be designed with a large pattern dimension to accommodate variations in gate electrode over-etching, and designs with such large margins result in large waste in the active matrix circuit board design. Therefore conventional manufacturing methods are not suited to high resolution liquid crystal display panels, and are an obstruction to reducing the basic pattern dimension of the active matrix circuit board from 5 μm to 2 μm or 3 μm, or even smaller dimensions.

Second, high temperature processing exceeding 600° C. is required to activate the impurity ions that are implanted within LDD structures. With such high temperature processing, however, it is not possible to use low-cost glass substrates. As a result, conventional manufacturing methods also interfere with increasing display panel screen size and reducing display panel cost. Furthermore, conventional ion implantation technologies are not well suited to processing large circuit boards because of the small ion beam size Technologies for implanting the generated ions without mass separation have been studied with the objective of solving these problems. For example, a method for using a mixture of an impurity gas diluted with hydrogen as the doping gas and implanting the ions generated from this mixture without mass separation has been studied, and the impurity has been activated at a relatively low temperature of about 300° C. However, this method cannot activate a small amount of impurities implanted to a silicon film where the impurity concentration is $1\times10^{19}/cm^3$ or less, and it is still impossible to manufacture an LDD TFT at relatively low temperatures.

OBJECTS OF THE INVENTION

Considering the above problems, the object of the present invention is to improve the structure of the source-drain area and the manufacturing process therefor, and to thus achieve an active matrix circuit board, a thin-film transistor, and a conductive silicon film in which the OFF current characteristics can be improved, and a manufacturing method therefor.

SUMMARY OF THE INVENTION

To resolve the above-described problems, the impurity concentration of the source-drain area of the third thin-film transistor is set lower than the impurity concentration of the source-drain area of the first thin-film transistor in an active matrix circuit board comprising. According to the present invention, a pixel area comprises a third thin-film transistor of a first conductivity type and a drive circuit area comprises a CMOS circuit composed of-a first thin-film transistor of the first conductivity type and a second thin-film transistor of a second conductivity type with the source-drain area is formed in a self-aligned manner to the gate electrode. For example, by setting the impurity concentration of the source-drain area of the third thin-film transistor to $1 \times 10^{19}/cm^3$ or less, and the impurity concentration of the source-drain area of the first thin-film transistor to $1 \times 10^{19}/cm^3$ or greater, a large ON current can be obtained in the thin-film transistor of the drive circuit area and a small OFF current can be obtained in the thin-film transistor of the pixel area.

In the present invention, the first conductivity type is opposite from the second conductivity type. In other words, if the first conductivity type is n-type, then the second conductivity type is p-type. Conversely, if the first conductivity type is p-type, then the second conductivity type is n-type. In addition, "impurity ions" in this invention mean ions that are either donors or acceptors.

An active matrix circuit board of such construction can be fabricated, for example, by a method as follows. First, first and second silicon films for forming the first thin-film transistor of a first conductivity type and the second thin-film transistor of a second conductivity type for the drive circuit area, and a third silicon film for forming the third thin-film transistor of the first conductivity type for the pixel area are formed on the surface of the insulated substrate (first process). A gate insulation film is formed on the surfaces of the first, second, and third silicon films (second process), and a gate electrode is formed on the surface of the gate insulation film (third process). In the next step, with the first and third silicon films covered with a first mask, a second conductivity type impurity is ion implanted at a dose of $1 \times 10^{14}/cm^2$ or greater to the second silicon film (fourth process). With the second and third silicon films covered with a second mask, a first conductivity type impurity is ion implanted at a dose of $1 \times 10^{14}/cm^2$ or greater to the first silicon film (fifth process). Then, after either the third or fifth process, a first conductivity type impurity is ion implanted at a dose of $1 \times 10^{14}/cm^2$ or less to the first, second, and third silicon films (low concentration area formation process). It is to be noted that the sequence of the fourth and fifth processes can be reversed.

It is preferable in the present invention to form a high concentration contact area with an impurity concentration of $1 \times 10^{19}/cm^3$ or greater in the source-drain area of the third thin-film transistor such that the source-drain electrode is electrically connected to the source-drain area of the third thin-film transistor through this high concentration contact area. In this case, the second mask in the fifth process is left open in the area corresponding to the connection area of the source-drain electrodes to the source-drain areas of the third thin-film transistor. The lateral distance between the high concentration contact area and the edge of the gate electrode is preferably less than approximately 4 μm in the present invention.

It is also preferable in the present invention to form the source-drain areas of the third thin-film transistor in the thick silicon film of the bottom layer, and to form the channel formation area in the thin silicon film of the top layer.

In an active matrix circuit board with an integrated drive circuit area according to an alternative form of the present invention, the thin-film transistor of the pixel area has an offset gate structure whereby the source-drain area is in a position laterally offset by a predetermined distance from the edge of the gate electrode.

In the manufacturing method of an active matrix circuit board of such construction, first, second, and third silicon films for forming first, second, and third thin-film transistors are formed on the surface of the insulated substrate (first process). Next, a gate insulation film is formed on the surfaces of the first, second, and third silicon films (second process), and a gate electrode is formed on the surface of the gate insulation film (third process). In the next step, with the first and third silicon films covered with a first mask, a second conductivity type impurity is ion implanted at a dose of $1 \times 10^{14}/cm^2$ or greater to the second silicon film with the gate electrode as a mask (fourth process). Next, with the second and third silicon films covered with a second mask and the second mask open the area of the source-drain area of the third thin-film transistor, a first conductivity type impurity is ion implanted at a dose of $1 \times 10^{14}/cm^2$ or greater to the first and third silicon films (fifth process). It is to be noted that the sequence of the fourth and fifth processes can be reversed.

A low temperature process is used in an active matrix circuit board with an integrated drive circuit area according to a further alternative form of the present invention. Specifically, in an active matrix circuit board comprising on the surface side of a glass substrate or other insulated substrate a pixel area comprising a third thin-film transistor of a first conductivity type, and a drive circuit area comprising a CMOS circuit composed of a first thin-film transistor of a first conductivity type and a second thin-film transistor of a second conductivity type in which the source-drain areas are formed in a self-aligned manner to the gate electrode, the source-drain areas are formed in the third thin-film transistor with a peak concentration of impurity in the range from $3 \times 10^{18}/cm^{19}$ to $1 \times 10^{19}/cm^3$ and the peak concentration of hydrogen ions in the range from $6 \times 10^{18}/cm^3$ to $1 \times 10^{20}/cm^3$, and the source-drain areas formed in the first and second thin-film transistors have a peak concentration of impurity of $1 \times 10^{20}/cm^3$ or greater.

An active matrix circuit board of such construction can be formed, for example, by a method as follows. Initially, first and second silicon films for forming the first thin-film transistor of a first conductivity type and the second thin-film transistor of a second conductivity type for the drive circuit area, and a third silicon film for forming the third thin-film transistor of a first conductivity type for the pixel area are formed on the surface of the insulated substrate (first process). Next, a gate insulation film is formed on the surfaces of the first, second, and third silicon films (second process). A gate electrode is then formed on the surface of the gate insulation film (third process). Next, with the first and third silicon films covered with a first mask, a second conductivity type impurity is ion implanted at a dose of $1\times10^{14}/cm^2$ or greater to the second silicon film (fourth process). Next, with the second and third silicon films covered with a second mask, a first conductivity type impurity is ion implanted at a dose of $1\times10^{14}/cm^2$ or greater to the first silicon film (fifth process). Then, after either the third or fifth process, a first conductivity type impurity is ion implanted at a dose of $1\times10^{14}/cm^2$ or less to the first, second, and third silicon films (low concentration area formation process). For an ion implantation method in which the lightly doped region is formed, a first ion doping process is performed in which all ions generated from a mixed gas containing an impurity gas for generating impurity ions with the hydrogen gas are implanted into the silicon film without mass separation, coupled with a second ion doping process in which all ions generated from a pure hydrogen gas are implanted into the silicon film without mass separation. Furthermore, in the ion implantation performed in the fourth and fifth processes, all ions generated from a mixed gas containing an impurity gas for generating impurity ions with the remainder being hydrogen gas are implanted to the silicon film without mass separation. In addition, a heat treatment temperature for activating the ions implanted to the silicon film is set above approximately 300° C. It is to be noted that the sequence of the fourth and fifth processes can be reversed.

In the present invention, a high concentration contact area with a peak impurity concentration of $1\times10^{20}/cm^3$ or greater is formed in the source-drain area of the third thin-film transistor such that the source-drain electrode is conductively connected to the source-drain area of the third thin-film transistor through this high concentration contact area. In this case, the second mask in the fifth process is left open in the area corresponding to the connection area of the source-drain electrodes to the source-drain areas of the third thin-film transistor for ion implantation. Alternatively, ions are implanted through contact holes formed in the layer insulation film.

It is also preferable to form the source-drain areas in the thick silicon film of the bottom layer, and to form the channel formation area in the thin silicon film of the top layer.

In addition to active matrix circuit boards, the structure and manufacturing method of this third thin-film transistor can also be applied to TFT for which a low temperature process is desirable. Furthermore, a lightly doped conductive silicon film formed through a relatively low temperature process can be applied to other processing technologies outside TFT manufacture.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a simplified block diagram of an active matrix circuit board having a AN integrated drive circuit;

FIG. 2 is a simplified schematic diagram showing a typical structure of the pixel area of an active matrix circuit board;

FIG. 3 is a cross-sectional diagram showing a typical basic structure of a liquid crystal display panel;

FIG. 4 is a cross-sectional diagram typically showing a TFT structure formed in the pixel area and the drive circuit area of an active matrix circuit board in accordance with a first embodiment of the present invention;

FIGS. 5A–5C illustrate a process flow of the manufacturing method of the active matrix circuit board in FIG. 4;

FIG. 6 is a graph showing the relationship between the gate voltage Vg and drain current Id when the impurity concentration of the source-drain area is varied in an n-channel type TFT;

FIG. 7 is a cross-sectional diagram typically showing a TFT structure formed in the pixel area and the drive circuit area of an active matrix circuit board in accordance with a second embodiment of the present invention;

FIGS. 8A–8C illustrate a process flow of the manufacturing method of the active matrix circuit board in FIG. 7;

FIG. 9 is a cross-sectional diagram typically showing the TFT structure formed in the pixel area of an active matrix circuit board in accordance with a third embodiment of the present invention;

FIG. 10 is a graph showing the relationship between the ion dosage to the source-drain areas and the contact resistance between the ITO and source-drain area;

FIGS. 11A–11C show a process flow of the manufacturing method of the active matrix circuit board in FIG. 9;

FIG. 12 is a cross-sectional diagram showing a typical TFT structure formed in the pixel area of an active matrix circuit board in accordance with a fourth embodiment of the present invention.

FIGS. 13A–13C show a process flow of the manufacturing method of the active matrix circuit board in FIG. 12;

FIG. 14 is a cross-sectional diagram showing a typical TFT structure formed in the pixel area and drive circuit area of an active matrix circuit board in accordance with a fifth embodiment of the present invention.

FIGS. 15A–15E show a process flow of the manufacturing method of the active matrix circuit board in FIG. 14;

FIG. 16 is a simplified structural diagram of an ion implantation apparatus used in the manufacturing method of the conductive silicon film of the sixth and seventh embodiments of the present invention.

FIG. 17 is a graph illustrating the relationship between hydrogen ion dosage to the polycrystalline silicon film and sheet resistance in the manufacturing method of an n-type conductive silicon film in accordance with a sixth embodiment of the invention;

FIG. 18 is a graph depicting the relationship between phosphorus ion dosage in a first doping process and sheet resistance in the manufacturing method of an n-type conductive silicon film in accordance with the sixth embodiment of the invention;

FIG. 19 is a graph showing the relationship between hydrogen ion dosage to the polycrystalline silicon film and sheet resistance in the manufacturing method of a p-type conductive silicon film in accordance with a seventh embodiment of the invention;

FIG. 20 is a graph showing the relationship between boron ion dosage in a first doping process and sheet resistance in the manufacturing method of a p-type conductive silicon film in accordance with the seventh embodiment of the invention;

FIG. 21 is a cross-sectional diagram showing a typical TFT structure in accordance with an eighth embodiment of the present invention;

FIGS. 22A–22D are process cross-sectional views showing the manufacturing method of the TFT in FIG. 21;

FIG. 23 is a graph showing the relationship between P+ dosage and drain current in the TFT in FIG. 21;

FIG. 24 is a cross-sectional diagram showing a typical TFT structure in accordance with a ninth embodiment of the present invention;

FIGS. 25A–25E shows a process flow of the manufacturing method of the TFT in FIG. 24;

FIG. 26 is a cross-sectional diagram showing a typical TFT structure in accordance with a tenth embodiment of the present invention;

FIGS. 27A–27E are process cross-sectional views showing the manufacturing method of the TFT in FIG. 26;

FIG. 28 is a cross-sectional diagram showing a typical TFT structure in accordance with an eleventh embodiment of the present invention;

FIGS. 29A–29D show a process flow of the manufacturing method of the TFT in FIG. 28;

FIG. 30 is a cross-sectional diagram showing a typical TFT structure in accordance with a twelfth embodiment of the present invention;

FIGS. 31A–31E show a process flow of the manufacturing method of the TFT in FIG. 30;

FIG. 32 is a cross-sectional diagram showing a typical TFT structure in accordance with a thirteenth embodiment of the present invention;

FIGS. 33A–33E show a process flow of the manufacturing method of the TFT in FIG. 32;

FIG. 34 is a cross-sectional diagram showing a typical TFT structure formed in the pixel area and drive circuit area of an active matrix circuit board in accordance with a fourteenth embodiment of the present invention.

FIGS. 35A–35D show a process flow of the manufacturing method of the active matrix circuit board in FIG. 34;

FIG. 36 is a cross-sectional diagram showing a typical TFT structure formed in the pixel area and drive circuit area of an active matrix circuit board in accordance with a fifteenth embodiment of the present invention;

FIGS. 37A–37D show a process flow of the manufacturing method of the active matrix circuit board in FIG. 36;

FIG. 38 is a cross-sectional diagram showing a typical TFT structure formed in the pixel area and drive circuit area of an active matrix circuit board in accordance with a sixteenth embodiment of the present invention;

FIGS. 39A–39D show a process flow of the manufacturing method of the active matrix circuit board in FIG. 38; and FIGS. 40A–40C show a process flow of the manufacturing method of conventional TFT.

DESCRIPTION OF THE PREFERRED EMBODIMENTS

First Embodiment

Before describing the structure of an active matrix circuit board according to the present embodiment, the basic structure of an active matrix circuit board with a built-in drive circuit and used in liquid crystal display panels is now described.

FIG. 1 is a simple block diagram of an active matrix circuit board with a built-in drive circuit, FIG. 2 is a simple block diagram typically showing the structure of the pixel area of an active matrix circuit board, and FIG. 3 is a cross-sectional diagram showing a typical basic structure of a liquid crystal display panel.

In FIG. 1, active matrix circuit board 10 is divided into a pixel area 10a, and scanning drive circuit areas 10b, and data drive circuit 10c (peripheral circuit part). Pixel region 13 is divided and formed in pixel area 10a by scanning lines (gate lines) 11a, 1b . . . (11) connected to drive circuit area 10b (scanning line drive circuit), and data lines 12a, 12b . . . (12) connected to drive circuit area 10c (data line drive circuit), as shown in FIG. 2. TFT 10d, which switches between a state connecting and a state interrupting the data line 12 side and the pixel electrode side based on the scanning signal from scanning line 11, is formed in pixel region 13. A CMOS circuit is also formed in drive circuit areas 10b, 10c by thin-film transistors of a different conductivity type.

Of these thin-film transistors, a small OFF current characteristic is required in TFT 10d of pixel area 10a so that a sufficient charge can be held in liquid crystal capacitance 10f. Because high speed operation compatible with a high quality display operation is required in the thin-film transistor of drive circuit areas 10b, 10c, a thin-film transistor with a self-alignment structure is generally used in drive circuit areas 10b, 10c.

It is to be noted that, as shown in FIG. 2, there are cases in which storage capacitance 10e is formed in pixel region 13, and this storage capacitance 10e may be constructed overlaid with part of the preceding scanning line 11 as the top pole and part of the drain electrode of TFT 10d as the bottom pole. Therefore, if the OFF current of TFT 10d of pixel area 10a is large, it is necessary to increase storage capacitance 10e, and the aperture ratio of pixel region 13 is decreased. Note that liquid crystal capacitance 10f is the capacitance when active matrix circuit board 10 and counter substrate 16 on which counter electrode 15 is formed are placed in opposition sandwiching liquid crystals 17 as shown in FIG. 3.

Thus, three types of thin-film transistors, including a pair of opposite conductivity type thin-film transistors in the drive circuit area and a thin-film transistor in the pixel area, are formed since the characteristics required in the thin-film transistors are different than in a built-in drive circuit type active matrix circuit board 10.

The following structure and manufacturing method are therefore used in the present invention as will be described below so that different types of thin-film transistors can be efficiently manufactured.

FIG. 4 is a cross-sectional diagram showing typical thin-film transistors (hereafter "TFT") formed in the active matrix circuit board of the first embodiment, the structure of the TFT formed in the pixel area and the n-channel type TFT and p-channel type TFT formed in the drive circuit area.

In FIG. 4, in active matrix circuit board 100 of the present embodiment, n-channel type TFT-A of the drive circuit area, p-channel type TFT-B of the drive circuit area, and n-channel type TFT-C of the pixel area are formed on a transparent insulated substrate 101. The transistors are arranged in order from the left side as looking at the figure. The CMOS circuit is formed in the drive circuit area by TFT-A and TFT-B.

Gate insulation film 114 is formed on the surface side of channel formation area 111 and source-drain areas 112, 113, and gate electrode 115 is formed on the surface side of this gate insulation film 114 in TFT-A. Source-drain areas 112, 113 are $n^+$ high concentration areas with an impurity concentration equal to or greater than $1\times10^{19}/cm^2$, for example, $1\times10^{20}/cm^3$, and are formed self-aligned to gate electrode 115.

Gate insulation film 124 is formed on the surface side of channel formation area 121 and source-drain areas 122, 123, and gate electrode 125 is formed on the surface side of this gate insulation film 124 in TFT-B. Source-drain areas 122, 123 are $p^+$ high concentration areas with an impurity concentration equal to or greater than $1\times10^{19}/\text{cm}^3$, e.g., $1\times10^{20}/\text{cm}^3$, and are formed self-aligned to gate electrode 125.

Gate insulation film 134 is formed on the surface side of channel formation area 131 and source-drain areas 132, 133, and gate electrode 135 is formed on the surface side of this gate insulation film 134 in TFT-C. Source-drain areas 132, 133 are formed as n⁻ low density areas with an impurity concentration equal to or less than $1\times10^{19}/\text{cm}^3$, e.g., $5\times10^{18}/\text{cm}^3$, and are formed self-aligned to gate electrode 135.

Therefore, a large ON current can be obtained in TFT-A and TFT-B of the drive circuit area. In addition, the OFF current is small in the TFT-C of the pixel area because source-drain areas 132, 133 are areas of low concentration of impurities. As a result, high resolution, high quality display can be achieved in a liquid crystal display panel using the active matrix circuit board 100 of this embodiment because high speed operation is possible in the drive circuit area and the written charge can be sufficiently maintained in the pixel area.

The manufacturing method of active matrix circuit board 100 a structure in accordance with the first embodiment is described with reference to FIGS. 5A–5C. FIGS. 5A–5C show a process flow of the manufacturing method of the active matrix circuit board of the present embodiment.

First, as shown in FIG. 5A, after forming a polycrystalline silicon film on the surface side of insulated substrate 101, the film is patterned to form silicon films 110, 120, 130. Silicon film 110 is a first silicon film for forming TFT-A in the drive circuit area, and silicon film 120 is a second silicon film for forming TFT-B in the drive circuit area. Silicon film 130 is a third silicon film for forming TFT-C in the pixel area (first process).

Next, in the second process, gate insulation films 114, 124, 134 are formed on the surface side of each silicon film 110, 120, 130. After forming a polycrystalline silicon film on the surfaces of gate insulation films 114, 124, 134 (the entire surface of insulated substrate 101), a high concentration impurity is introduced into it. The polycrystalline silicon film into which an impurity was introduced is then patterned using photoetching technologies to form gate electrodes 115, 125, 135. The gate lines are simultaneously formed with the same materials when forming gate electrodes 115, 125, 135 (third process).

It is to be noted that because the etching end point can be positively confirmed due to dry etching using $CF_4$ plasma being used in the present embodiment for patterning the polycrystalline silicon film, the dimensions of the silicon film after patterning can be precisely controlled.

Next, as shown by arrow $P^+$, low concentration phosphorus ions are implanted at a $5\times10^{13}/\text{cm}^2$ dose to silicon films 110, 120, 130 using gate electrodes 115, 125, 135 as masks (low concentration area formation process).

As a result, low concentration areas 110a, 120a, 130a having a $5\times10^{18}/\text{cm}^3$ impurity concentration are formed self-aligned to gate electrodes 115, 125, 135 in silicon films 110, 120, 130. Low concentration area 130a becomes source-drain areas 132, 133 of TFT-C without further ion implanting in the following processes. In addition, that part of silicon film 130 positioned directly below gate electrode 135 becomes channel formation area 131.

Next, as shown in FIG. 5B, after masking the side with silicon films 120, 130 with resist 140, high concentration phosphorus ions are implanted at a $1\times10^{15}/\text{cm}^2$ dose to silicon film 110 (low concentration area 110a) as shown by arrow $P^+$ (fourth process).

As a result, low concentration area 110a becomes source-drain area 112, 133 (n⁺ high density area) with a $1\times10^{20}/\text{cm}^3$ impurity concentration formed self-aligned to gate electrode 115. In addition, that part of silicon film 110 positioned directly below gate electrode 115 becomes channel formation area 111.

Next, as shown in FIG. 5C, after masking the sides with silicon films 110, 130 with resist 150, high concentration boron ions are implanted at a $1\times10^{15}/\text{cm}^2$ dose to silicon film 120 (low concentration area 120a) as shown by arrow $B^+$ (fifth process).

As a result, low concentration area 120a becomes source-drain areas 122, 123 (p⁺ high density area) with a $1\times10^{20}/\text{cm}^3$ impurity concentration formed self-aligned to gate electrode 125. In addition, that part of silicon film 120 positioned directly below gate electrode 125 becomes channel formation area 121.

In this way, even when three types of TFT are formed on the same active matrix circuit board 100, a low concentration impurity is also implanted to the drive circuit area side in the process forming the low concentration area on the pixel area side, and a high concentration area is formed there by the high concentration impurity implanted to the drive circuit area. Therefore, the impurity concentration of each area can be separately controlled while holding the number of masking operations to a minimum. Therefore, a TFT having an optimal structure can be manufactured by the manufacturing method of the present embodiment without overtaking at the side of the gate electrode. As a result, the display definition of the liquid crystal display panel can be improved because the ON current characteristic of the drive circuit area TFT and the OFF current characteristic of the pixel area TFT can be improved, and the electrical characteristics are stable.

The electrical characteristics of the TFT-A and TFT-C formed in this way are described with reference to FIG. 6.

FIG. 6 is a graph showing the relationship between the gate voltage Vg and drain current Id when the impurity concentration of the source-drain area is varied in an n-channel type TFT.

In FIG. 6, solid line 5E13 shows the characteristics of the TFT having phosphorus implanted at a $5\times10^{13}/\text{cm}^2$ dose to the source-drain area. Solid line 1E14 shows the characteristics of the TFT with phosphorus implanted at a $1\times10^{14}/\text{cm}^2$, dose to the source-drain area. Solid line 5E14 shows the characteristics of the TFT with phosphorus implanted at a $5\times10^{15}/\text{cm}^2$ dose to the source-drain area.

As will be apparent by comparing these characteristics, the ON current drops because the electrical resistance of the source-drain area increases as the dosage is reduced. Furthermore, the OFF current decreases because electrical field strength between the drain area and gate electrode is decreased in addition to the electrical resistance of the source-drain area increasing as the dosage is reduced. Therefore, it is sufficient to form the source-drain area as a low concentration area in the pixel area TFT where a small OFF current is required.

Because a low OFF current is required in the TFT-C in the pixel area through the gate voltage Vg range from 0 V to approximately −10 V, the impurity dose to the source-drain areas 132, 133 is less than or equal to $1\times10^{14}/\text{cm}^2$, and preferably less than $5\times10^{13}/\text{cm}^2$. However, because the level of the TFT-C OFF current differs according to the setting conditions and the specifications of the liquid crystal display panel in which active matrix circuit board 100 is used, the impurity concentration of source-drain areas 132, 133 is set to an optimal level according to the specifications and setting conditions.

The ON current of TFT-A and TFT-B in the drive circuit area is generally, however, preferably greater, and when gate voltage Vg is 10 V, drain current Id must be 10 μA or greater. Therefore, the impurity dose to the source-drain area of TFT-A and TFT-B must be approximately $1\times 10^{14}/cm^2$ or greater.

It is to be noted that the TFT ON current and OFF current are also dependent on the film thickness of the polycrystalline silicon film in the channel formation area and the film thickness of the gate insulation film, in addition to the impurity concentration of the source-drain area. Furthermore, the electrical resistance of the source-drain area affecting the ON current and OFF current is also dependent on the film thickness and polycrystallinity of the source-drain area. Moreover, in addition to the dosage, the impurity concentration of the source-drain area is also affected by the ion energy during implantation and the film thickness of the gate insulation film. Therefore, the dosage is set as may be required with consideration for the ion energy and the film thickness of the gate insulation film.

Second Embodiment

The structure of an active matrix circuit board according to a second embodiment is basically the same as the structure of the active matrix circuit board according to the first embodiment, and only that a pad area, which is a high concentration area, is formed in the source-drain area differs. Therefore, parts with functionality common to the first embodiment are identically labeled, and further identification in the figures and detailed description are omitted.

FIG. 7 is a cross-sectional diagram typically showing the structure of the pixel area TFT formed in an active matrix circuit board according to the present embodiment.

In active matrix circuit board 100a of the second embodiment, source-drain areas 112, 113 of TFT-A are n⁺ high concentration areas having an impurity concentration of $1\times 10^{19}/cm^3$ or greater, preferably $1\times 10^{19}/cm^3$ and are formed self-aligned to gate electrode 115. Source-drain areas 112, 113 are composed of thin upper layer source-drain areas 112a, 113a and thick bottom layer source-drain areas 112b, 113b formed from a polycrystalline silicon film the same as channel formation area 111.

Source-drain areas 122, 123 of TFT-B are p⁺ high concentration areas with an impurity concentration of $1\times 10^{19}/cm^3$ or greater, preferably $1\times 10^{20}/cm^3$, and are formed self-aligned to gate electrode 125. Source-drain areas 122, 123 are composed of thin upper layer source-drain areas 122a, 123a and thick bottom layer source-drain areas 122b, 123b formed from a polycrystalline silicon film the same as channel formation area 121.

Source-drain areas 132, 133 of TFT-C are formed self-aligned to gate electrode 115, and are composed of thin upper layer source-drain areas 132a, 133a and thick bottom layer source-drain areas 132b, 133b formed from a polycrystalline silicon film the same as channel formation area 131. Of these, the top layer source-drain areas 132a, 133a are n⁻ low concentration areas with an impurity concentration of $1\times 10^{19}/cm^3$ or less, e.g., $5\times 10^{19}/cm^3$ Relative to this layer, the bottom layer source-drain areas 132b, 133b are n⁺ high concentration areas with an impurity concentration of $1\times 10^{19}/cm^3$ or greater, e.g., $1\times 10^{20}/cm^3$.

In TFT-A and TFT-B of the drive circuit area thus formed, source-drain areas 112, 113, 122, 123 are formed self-aligned to gate electrodes 115, 125, and, moreover, are formed as high concentration areas with a low electrical resistance. Furthermore, because source-drain areas 112, 113, 122, 123 are formed in two layers with a thick film thickness, the electrical resistance is low. Therefore, a high ON current can be obtained in TFT-A and TFT-B of the drive circuit area. In addition, because the film thickness is thick and source-drain areas 132b, 133b, which are high concentration areas, are formed in source-drain areas 132, 133 of the TFT-C of the pixel area, the electrical resistance there is low and the ON current is thus high. Regardless of this, however, that part of source-drain areas 132, 133 near the edge of gate electrode 135 in the TFT-C of the pixel area is the thin film thickness, low concentration area source-drain areas 132a, 133a, and a sufficiently low OFF current can therefore be obtained. As a result, high speed operation is possible in the drive circuit area and the written charge can be sufficiently maintained in the pixel area.

In the manufacturing method of active matrix circuit board 100a thus constructed, after forming a thick film thickness polycrystalline silicon film on the surface side of insulated substrate 101, the circuit board is patterned to form silicon films 161, 162, 163 for forming source-drain areas 112b, 113b, 122b, 123b, 132b, 133b of the bottom layer as shown in FIG. 8A.

Next, as shown in FIG. 8B, high concentration boron ions are implanted to silicon film 162 at a $1\times 10^{15}/cm^2$, dose with silicon films 161, 163 masked by resist 164 to form source-drain areas 122b, 123b of the bottom layer.

Next, as shown in FIG. 8C, high concentration phosphorus ions are implanted to silicon films 161, 163 at a $1\times 10^{15}/cm^2$ dose with silicon film 162 masked by resist 165 to form source-drain areas 112b, 113b, 132b, 133b of the bottom layer.

Heat treatment is then applied to activate the implanted impurity. This activation may be applied after forming the other component areas during the heat treatment applied to activate those areas.

Next, as in the process described in the first embodiment with reference to FIG. 5A, after forming a thin polycrystalline silicon film over the entire surface of insulated substrate 101, it is patterned to form silicon films 110, 120, 130. Thereafter, the same processes described in the first embodiment with reference to FIGS. 5A to FIG. 5C, including formation of the gate insulation film and gate electrodes on the surface side of silicon films 110, 120, 130, are applied, and further description is therefore omitted.

It is to be noted that because high concentration boron ions are implanted to silicon film 120 using resist 150 covering the TFT-A and TFT-C formation areas in the following processes as shown in FIG. 5C, the process shown in FIG. 8B may be omitted and the bottom layer source-drain areas 122b, 123b formed in the process shown in FIG. 5C. By means of this method, the increase in the number of processes can be held to a minimum even when forming different conductivity type pads, for example, source-drain areas 112b, 113b, 122b, 123b, 132b, 133b of the bottom layer.

Third Embodiment

The structures of an active matrix circuit board according to a third embodiment and the fourth and fifth embodiments described hereinafter the third embodiment are basically the same as the structure of the active matrix circuit board according to the first embodiment, and only the structure of the TFT in the pixel area differs. Therefore, parts with functionality common to the first embodiment are identically labeled, and further identification in the figures and detailed description are omitted.

FIG. 9 is a cross-sectional diagram typically showing the structure of the TFT of the pixel area formed in an active matrix circuit board according to the present embodiment.

In active matrix circuit board 200 of this embodiment, the n-channel type TFT-C of the pixel area is formed over transparent insulated substrate 101 in FIG. 9, and n-channel type TFT-A and p-channel type TFT-B of the drive circuit area are formed over the same insulated substrate 101, as shown in FIG. 4.

As described in the first embodiment, source-drain areas 112, 113, 122, 123 of TFT-A and TFT-B are high concentration areas having an impurity concentration of $1\times10^{19}/\mathrm{cm}^3$ or greater, and are formed self-aligned to gate electrodes 115, 125.

Again, in FIG. 9, gate insulation film 234 is formed on the surface side of source-drain areas 232, 233 and channel formation area 231 in TFT-C, and gate electrode 235 is formed on the surface side of this gate insulation film 234. Layer insulation film 260 is formed on the surface side of gate electrode 235, source electrode 271 is connected to source-drain area 232 through the first contact hole 261, and pixel electrode 272 is connected to source-drain area 233 through second contact hole 262.

In this embodiment, those parts of source-drain areas 232, 233 corresponding to the openings of first contact hole 261 and second contact hole 262 are high concentration contact areas 232a, 233a with an impurity concentration of $1\times10^{19}/\mathrm{cm}^3$ or greater, preferably $1\times10^{20}/\mathrm{cm}^3$, and the remaining areas are low concentration source-drain areas 232b, 233b with an impurity concentration of $1\times10^{19}/\mathrm{cm}^3$ or less, preferably $5\times10^{18}/\mathrm{cm}^3$. Therefore, that part of TFT-C positioned near the edge of gate electrode 235 is an LDD structure, i.e., low concentration source-drain areas 232b, 233b. As a result, the OFF current of TFT-C is small as shown by solid line 5E13 in FIG. 6.

The TFT-C ON current is also high because high concentration contact areas 232a, 233a are formed in source-drain areas 232, 233. Specifically, in addition to the overall electrical resistance of the source-drain areas 232, 233 dropping due to high concentration contact areas 232a, 233a, the TFT-C ON current is high, equivalent to the characteristic shown by solid line 5E14 in FIG. 6 because the contact resistance between source-drain area 233 (drain area) and pixel electrode 272 formed from ITO is low.

FIG. 10 is a graph showing the relationship between the dosage of impurity ions to the area connected by pixel electrode 272 formed from ITO and the contact resistance. As shown in FIG. 10, if the dosage to source-drain area 233 is increased, the contact resistance tends to drop, and the contact resistance becomes severely low, in particular, when the dosage exceeds $1\times10^{14}/\mathrm{cm}^2$.

Note that even in the connection of source electrode 271, which is an aluminum electrode, and source-drain area 232 (source area), the contact resistance tends to drop the higher the impurity concentration in the area to which source electrode 271 connects. However, because the contact resistance between aluminum and polycrystalline silicon is basically low, the contribution to improving the ON current characteristic is less than when the contact resistance between the pixel electrode 272 and source-drain area 233 is reduced.

Furthermore, when the length in the lateral direction of low concentration source-drain areas 232b, 233b in source-drain areas 232, 233 (the distance in the lateral direction from the edge of high concentration contact areas 232a, 233a to the edge of gate electrode 235) was varied in the range from 1 μm to 4 μm, and the ON current characteristics and OFF current characteristics of the TFT-C were studied, it was confirmed that the OFF current does not change and the ON current changes only a slight 10+% in this range. Therefore, in the present embodiment, by setting the length dimension of low concentration source-drain areas 232b, 233b to approximately 2 μm, variation in the ON current characteristics can be held to 10% or less even when there is a ±1 μm variation in this dimension.

The manufacturing method of an active matrix circuit board of such construction is now described with reference to FIGS. 11A–11C.

FIGS. 11A–11C show a process flow of the manufacturing method of the active matrix circuit board of the third embodiment.

First, as shown in FIG. 11A, after forming a polycrystalline silicon film on the surface side of insulated substrate 101, the circuit board is patterned to form silicon films 110, 120, 230. Silicon film 110 is a first silicon film for forming TFT-A, and silicon film 120 is a second silicon film for forming TFT-B. Silicon film 230 is a third silicon film for forming TFT-C (first process).

In the second process, gate insulation films 114, 124, 234 are formed on the surface side of each silicon film 110, 120, 230.

Next, after forming a polycrystalline silicon film on the surfaces of gate insulation films 114, 124, 134 (the entire surface of insulated substrate 201), a high concentration impurity is introduced into it. The polycrystalline silicon film is then patterned using photoetching technologies to form gate electrodes 115, 125, 235. The gate lines are simultaneously formed with the same materials when forming gate electrodes 115, 125, 235 (third process).

Next, as shown by arrow $P^+$, phosphorus ions are implanted at a dose to silicon films 110, 120, 230 using gate electrodes 115, 125, 235 as a mask. As a result, low concentration areas 110a, 120a, 230a with a $5\times10^{18}/\mathrm{cm}^2$ impurity concentration are formed self-aligned to gate electrodes 115, 125, 235 in silicon films 110, 120, 230 (low concentration area formation process). Next, as shown in FIG. 11B, the side with silicon films 120, 230 is masked with resist 240.

Openings 241, 242 are formed in that part of low concentration area 230a of silicon film 230 corresponding to where the high concentration contact areas 232a, 233a are to be formed. In this state, high concentration phosphorus ions are implanted at a $1\times10^{15}/\mathrm{cm}^2$ dose to silicon films 110, 230 as shown by arrow $P^+$ (fourth process).

As a result, low concentration area 110a becomes source-drain areas 112, 133 ($n^+$ high concentration area) with a $1\times10^{20}/\mathrm{cm}^3$ impurity concentration formed self-aligned to gate electrode 115.

With respect to this, high concentration contact areas 232a, 233a with an impurity concentration of $1\times10^{20}/\mathrm{cm}^3$ are formed in low concentration area 230a of silicon film 230, and that part to which high concentration ions were not implanted becomes low concentration source-drain areas 232b, 233b with an impurity concentration of $5\times10^{18}/\mathrm{cm}^3$. In addition, that part of silicon film 230 positioned directly below gate electrode 235 becomes channel formation area 231.

Next, as shown in FIG. 11C, after masking the sides with silicon films 110, 230 with resist 250, high concentration boron ions are implanted at a $1\times10^{15}/\mathrm{cm}^2$ dose to silicon film 120 as shown by arrow $B^+$ (fifth process).

As a result, low concentration area 120b becomes source-drain areas 122, 123 ($p^+$ high concentration areas) with a $1\times10^{20}/\mathrm{cm}^3$ impurity concentration formed self-aligned to gate electrode 125.

Because the dosage conditions can be independently set for the n-channel type TFT-A of the drive circuit area, the p-channel type TFT-B of the drive circuit area, and the n-channel type TFT-C of the pixel area by means of the manufacturing method of this embodiment as thus described, a TFT with optimum electrical characteristics can be manufactured. Furthermore, because high concentration contact areas 232a, 233a are formed while forming the LDD structure by twice implanting ions to source-drain areas 232, 233 in TFT-C, the electrical resistance and the contact resistance of the overall source-drain areas 232, 233 can be reduced with the OFF current held low.

It is to be noted that in the first through third embodiments the low concentration area formation process can be applied after either the third, fourth, or fifth process. In addition, the order of the fourth and fifth processes can be reversed.

Fourth Embodiment

FIG. 12 is a cross-sectional diagram typically showing the structure of the TFT of the pixel area formed in an active matrix circuit board according to the fourth embodiment.

In active matrix circuit board 300 of this embodiment, the n-channel type TFT-C of the pixel area is formed over transparent insulated substrate 101 in FIG. 12, and n-channel type TFT-A and p-channel type TFT-B of the drive circuit area are formed over the same insulated substrate 101 as shown in FIG. 4.

As described in the first embodiment, source-drain areas 112, 113, 122, 123 of TFT-A and TFT-B are high concentration areas with an impurity concentration of $1 \times 10^{19}/cm^3$ or greater, preferably $1 \times 10^{20}/cm^2$, and are formed self-aligned to gate electrodes 115, 125.

Again, in FIG. 12, gate insulation film 334 is formed on the surface side of source-drain areas 332, 333 and channel formation area 331 in TFT-C, and gate electrode 335 is formed on the surface side of this gate insulation film 334. Layer insulation film 360 is formed on the surface side of gate electrode 335, source electrode 371 is connected to source-drain area 332 through the first contact hole 361, and pixel electrode 372 is connected to source-drain area 333 through second contact hole 362.

TFT-C has an offset gate structure formed at a position approximately 2 μm removed in the lateral direction from the edge of gate electrode 335 with the source-drain areas 332, 333 as high concentration areas with an impurity concentration of $1 \times 10^{19}/cm^3$ or greater, preferably $1 \times 10^{20}/cm^3$. TFT-C therefore has a small OFF current. Furthermore, because the distance in the lateral direction between gate electrode 335 and the source-drain area in TFT-C is set to approximately 2μm the drop in the ON current resulting from the offset structure is held to a minimum. Moreover, the contact resistance of the drain electrode formed from ITO and the source-drain areas 332, 333 is low. On the other hand, TFT-A and TFT-B have a high ON current because of their self-aligned structure.

The manufacturing method of an active matrix circuit board of such construction is described with reference to FIGS. 13A–13C.

FIGS. 13A–13C are process cross-sections showing the manufacturing method of the active matrix circuit board of this embodiment.

In the manufacturing method of this embodiment, the ion implantation performed in the process shown in FIG. 11A in the manufacturing method associated with the third embodiment is not performed. Specifically, as shown in FIG. 13A, the polycrystalline silicon film formed over insulated substrate 101 is patterned form silicon films 110, 120, 330. Silicon film 110 is a first silicon film for forming TFT-A, and silicon film 120 is a second silicon film for forming TFT-B. Silicon film 330 is a third silicon film for forming TFT-C (first process).

Next, gate insulation films 114, 124, 334 are formed on the surface side of each silicon film 110, 120, 330 (second process).

After forming a polycrystalline silicon film on the surfaces of gate insulation films 114, 124, 334 (the entire surface of insulated substrate 201), a high concentration impurity is introduced into it. The polycrystalline silicon film is then patterned using photoetching technologies to form gate electrodes 115, 125, 335. (third process).

Next, as shown in FIG. 13B, the side with silicon films 120, 330 is masked with resist 340. Openings 341, 342 are formed here in that part of resist 340 corresponding to where source-drain areas 332, 333 are to be formed in silicon film 330. In this state, high concentration phosphorus ions are implanted at a $1 \times 10^{15}/cm^2$ dose to silicon films 110, 330 as shown by arrow $P^+$ (fourth process).

As a result, source-drain areas 112, 133 ($n^+$ high concentration area) with a $1 \times 10^{20}/cm^3$ impurity concentration are formed self-aligned to gate electrode 115 in silicon film 110.

With respect to this, offset gate structure source-drain areas 332, 333 are formed in silicon film 330 with an impurity concentration of $1 \times 10^{19}/cm^3$ or greater. That part of silicon film 330 to which ions were not implanted becomes channel formation area 331.

Next, as shown in FIG. 13C, after masking the sides of silicon films 110, 330 with resist 350, high concentration boron ions are implanted at a $1 \times 10^{15}/cm^2$ dose to silicon film 120 as shown by arrow $B^+$ (fifth process).

As a result, silicon film 120 becomes source-drain areas 122, 123 ($p^+$ high concentration areas) with a $1 \times 10^{19}/cm^3$ impurity concentration formed self-aligned to gate electrode 125.

It is to be noted that the order of the fourth and fifth processes can be reversed.

Because the dosage conditions can be independently set for TFT-A, TFT-B, and TFT-C by means of the manufacturing method of this embodiment as thus described, formation under optimal conditions is possible. Furthermore, over-etching for gate electrode 335 is not necessary when forming TFT-C with an offset gate structure. As a result, the gate length of TFT-C is stable, and a high reliability active matrix circuit board 300 can be manufactured.

Fifth Embodiment

The structure of the active matrix circuit board of a fifth embodiment is basically the same as the structure of the active matrix circuit board of the fourth embodiment, and is characterized by forming a pad area, which is a high concentration area, only in the source-drain area of the n-channel type TFT.

FIG. 14 is a cross-sectional diagram showing a typical structure of the TFT formed in an active matrix circuit board according to the present embodiment.

In active matrix circuit board 400 of the fifth embodiment, gate insulation film 414 is formed on the surface side of channel formation area 411 and source-drain areas 412, 413 in TFT-A, and gate electrode 415 is formed on the surface side of this gate insulation film 414.

Source-drain areas 412, 413 are $n^+$ high concentration areas with an impurity concentration of $1 \times 10^{19}/cm^3$, preferably $1 \times 10^{20}/cm^3$, formed self-aligned to gate electrode 415. Source-drain areas 412, 413 comprise thin top layer source-drain areas 412a, 413a formed from the same polycrystalline silicon film as channel formation area 411, and thick bottom layer source-drain areas 412b, 413b.

Gate insulation film 124 is formed on the surface side of channel formation area 121 and source-drain areas 122, 123, and gate electrode 125 is formed on the surface side of this gate insulation film 124 in TFT-B. Source-drain areas 122, 123 are $p^+$ high density areas with an impurity concentration equal to or greater than $1 \times 10^{19}/cm^3$, preferably $1 \times 10^{20}/cm^3$, and are formed self-aligned to gate electrode 125.

Gate insulation film 434 is formed on the surface side of channel formation area 431 and source-drain areas 432, 433, and gate electrode 435 is formed on the surface side of this gate insulation film 434 in TFT-C.

Source-drain areas 432, 433 comprise thin top layer source-drain areas 432a, 433a formed from the same polycrystalline silicon film as channel formation area 431, and thick bottom layer source-drain areas 432b, 433b. Top layer source-drain areas 432a, 433a are non-doped areas. Bottom layer source-drain areas 432b, 433b, however, are $n^+$ high concentration areas with an impurity concentration of $1\times10^{19}/cm^3$, preferably $1\times10^{20}/cm^3$. As a result, that part of top layer source-drain areas 432a, 433a positioned near the edge of gate electrode 435 becomes non-doped offset areas 432c, 433c.

It is to be noted that while not shown in the figures, the source electrodes and drain electrodes of TFT-A and TFT-C are connected to bottom layer source-drain areas 412b, 413b, 432b, 433b.

In TFT-A and TFT-B of the drive circuit area thus formed, source-drain areas 412, 413, 122, 123 are formed self-aligned to gate electrodes 415, 125, and are formed as high concentration areas with a low electrical resistance. Furthermore, because source-drain areas 412, 413 are formed in two layers with a thick film thickness, the electrical resistance is low. Therefore, a high ON current can be obtained in TFT-A and TFT-B of the drive circuit area. In the same way, because the film thickness is thick in source-drain areas 432, 433 of TFT-C in the pixel area, and source-drain areas 432b, 433b, which are high concentration areas, are formed, a high ON current can be obtained because the electrical resistance there is low. Nevertheless, because TFT-C in the pixel area has an offset gate structure and the film thickness of offset areas 432c, 433c is thick, the OFF current is sufficiently low. As a result, high speed operation is possible in the drive circuit area, and the written charge can be sufficiently held in the pixel area.

In the manufacturing method of an active matrix circuit board 400 of such structure, after first forming a thick film thickness, non-doped silicon film on the surface side of insulated substrate 101, the silicon film is patterned to form silicon films 401, 402, 403 as shown in FIG. 15A.

Next, as shown in FIG. 15B, with silicon film 402 masked by resist 422, high concentration phosphorus ions are implanted at a $1\times10^{15}/cm^2$ dose to silicon films 401, 403 as shown by arrow $P^+$ to form source-drain areas 412b, 413b of the bottom layer.

Next, as shown in FIG. 15C, after forming a thin polycrystalline silicon film over the entire surface of insulated substrate 101, it is patterned to form non-doped silicon films 410, 420, 430. Silicon film 420 combines with silicon film 402 here to form silicon film 120. Silicon film 410 is the first silicon film for forming TFT-A, and silicon film 120 is a second silicon film for forming TFT-B. Silicon film 420 is the third silicon film for forming TFT-C (first process).

Next, gate insulation films 414, 124, 434 are formed on the surface side of each silicon film 410, 120, 430 (second process), and then gate electrodes 415, 125, 435 are formed (third process).

Next, as shown in FIG. 15D, the side with silicon films 120, 430 is masked by resist 440. In this state, high concentration phosphorus ions are implanted at a $1\times10^{15}/cm^2$ dose to silicon films 410, 430 as shown by arrow $P^+$ (fourth process).

As a result, source-drain areas 412, 433 with a $1\times10^{20}/cm^3$ impurity concentration formed self-aligned to gate electrode 415.

A resist mask with openings formed in that part of silicon film 430 corresponding to where source-drain areas 432b, 433b of the bottom layer are to be formed can be used here. In this case, all of source-drain areas 432, 433 except for the offset area can be formed as $n^+$ high concentration areas.

Next, after masking silicon films 410, 430 with resist 450 as shown in FIG. 15E, high concentration boron ions are implanted at a $5\times10^{15}/cm^2$ dose to silicon film 120 as shown by arrow $B^+$ (fifth process).

As a result, source-drain areas 122, 123, which are $p^+$ high concentration areas, are formed self-aligned to gate electrode 125 in silicon film 120.

It is to be noted that because the thicker the film thickness of source-drain areas 412, 413, the higher the ON current of TFT-A, and thus the better, the overall thickness of source-drain areas 412, 413 and channel formation area 411 can be increased as in TFT-B. In addition, the order of the fourth and fifth processes can be reversed.

Sixth Embodiment

The manufacturing method of a conductive silicon film is described as a sixth embodiment of the present invention.

FIG. 16 is a structural diagram of the ion implantation device used to manufacture the n-type conductive silicon film of this embodiment.

In FIG. 16, an extration electrode 53 for extracting impurity ions 52 from plasma source 51, and acceleration electrode 54 for accelerating the impurity ions 52 to a predetermined energy level are provided in ion implantation machine 50. A voltage is applied to extration electrode 53 and acceleration electrode 54 causing impurity ions 52 extracted from plasma source 51 to be implanted into the polycrystalline silicon film formed on the surface of glass substrate 55.

A mass separator for applying mass separation to the ions generated from the dopant gas is not provided in ion implantation machine 50, and all ions generated from the dopant gas are implanted to the polycrystalline silicon film without mass separation.

In the manufacturing method (impurity activation method) of the conductive silicon film according to this embodiment using a ion implantation machine 50 of this type, a polycrystalline silicon film with a thickness of, for example, 500 Å, is first formed on the surface of a glass substrate, and on the surface of the polycrystalline silicon film is formed a 1200 Å thick silicon dioxide film ($SiO_2$ film). When forming a TFT from the polycrystalline silicon film, it is preferable to form the polycrystalline silicon film with a crystallization rate of 75% or higher, and it is even more preferable to form it with a 90% or higher rate.

Next, using ion implantation machine 50, all ions generated from a mixed gas (dopant gas) containing 5% $PH_3$ with the remainder being hydrogen are implanted to the polycrystalline silicon film through the silicon dioxide film at an 80 keV energy level without mass separation (first ion doping process).

The dosage of the ions implanted at this time is $1\times10^{14}/cm^2$ converted to $P^+$ ions. As a result, the $P^+$ ion concentration peak in the polycrystalline silicon film will be approximately $1\times10^{19}/cm^3$.

Continuing, using ion implantation machine 50, ions generated from a 100% pure hydrogen gas are implanted to the polycrystalline silicon film through the silicon dioxide film at a 20 KeV energy level without mass separation (second ion doping process).

In this embodiment, most of the ions generated from the pure hydrogen gas are $H_2^+$, and by setting the implantation energy level to 20 KeV in this case, the concentration peak in the $H_2^+$ depth direction can be controlled to be positioned at the boundary of the polycrystalline silicon film and the silicon dioxide film.

Heat treatment with a temperature of approximately 300° C. is then applied for approximately one hour to the polycrystalline silicon film implanted with an impurity ($P^+$ ions) (heating process).

The heat treatment temperature here is in the range from approximately 300° C. to approximately 600° C., and preferably in the range from approximately 300° C. to approximately 550° C. Furthermore, in the TFT manufacturing process, when a low-cost glass substrate is used as the insulated substrate, the heat treatment temperature is preferably set within the range from approximately 300° C. to approximately 450° C.

The relationship between the hydrogen ion dose to the polycrystalline silicon film thus formed and the sheet resistance is shown in FIG. 17. In FIG. 17 the hydrogen ion dose is converted to a $H^+$ ion quantity.

As shown in FIG. 17, the resistance of the polycrystalline silicon implanted with a small quantity of impurity is low when the dose of implanted $H^+$ ions is in the range from $1\times10^{14}/cm^2$ to $1\times10^{15}/cm^2$, or specifically when the concentration peak of $H^+$ ions in the polycrystalline silicon film is in the range from $6\times10^{20}/cm^3$ to $1\times10^{20}/cm^3$. The reasons for this are believed to be the result of competition between the effect of dangling bonds in the polycrystalline silicon film terminating due to hydrogen ion implantation, and the effect of defects being created by hydrogen ion implantation.

Furthermore, the relationship between the phosphorus ion dose in the first doping process and sheet resistance is shown in FIG. 18 when the conditions of the second ion doping process are set so that ions generated from pure hydrogen are implanted without mass separation to the polycrystalline silicon film at a dose from $1\times10^{14}/cm^2$ to $1\times10^{15}/cm^2$ to achieve a concentration peak of $H^+$ ions in the polycrystalline silicon film in the range from $6\times10^{18}/cm^3$ [sic] to $1\times10^{19}/cm^3$. In FIG. 18, the phosphorus ions are shown converted to a $P^+$ ion quantity.

As shown in FIG. 18, the sheet resistance drops if the $P^+$ ion dose is changed to the range from $5\times10^{12}/cm^2$ to $1.5\times10^{15}/cm^2$, and the $P^+$ ion concentration peak is increased from $5\times10^{17}/cm^3$ to $1.6\times10^{19}/cm^3$.

Therefore, a low concentration polycrystalline silicon film can be made conductive according to this embodiment by heat treatment at a relatively low temperature of approximately 300° C. by implanting ions generated from a pure hydrogen gas to the silicon film without mass separation after implanting all ions generated from a mixed gas, which contains an impurity gas for generating an impurity with the remainder being hydrogen, to the silicon film without mass separation. As a result, an LDD structure TFT can be formed on a low-cost glass substrate because a TFT low concentration source-drain area can be formed even in a low temperature process. In addition, because an electrode material with a low electrical resistance can be used as a result of the heat resistance limitations of the gate electrode etc., being relaxed, the gate signal delay can be reduced and the display quality in a liquid crystal display panel can be improved. In addition, productivity is high because ions can be implanted to a wide area of the substrate because mass separation is not used.

It is to be noted that the energy level during ion implantation is a property that must be set to the optimum conditions based on the thickness and type of the silicon dioxide film formed on the surface of the polycrystalline silicon film, and the type of ions implanted, and there is therefore no limit on the conditions.

For example, when the generated ions are primarily $H^+$, if the implantation energy is set to 10 keV, the concentration peak in the $H^+$ depth direction can be controlled to a position at the boundary of the polycrystalline silicon film and the silicon dioxide film.

In addition, when the thickness of the silicon dioxide film is approximately 800 Å, using ion implantation machine 50, all ions generated from a mixed gas containing 5% $PH_3$ with the remainder being hydrogen are implanted to the polycrystalline silicon film through the silicon dioxide film at a 50 keV energy level without mass separation. To achieve a $P^+$ ion concentration peak in the polycrystalline silicon film of approximately $1\times10^{19}/cm^3$, the ion dose is set to $6.5\times10^{13}/cm^2$ converted to $P^+$ ions (first doping process).

Continuing, using ion implantation machine 50, ions generated from pure hydrogen are implanted to the polycrystalline silicon film through the silicon dioxide film at a 12 keV energy level without mass separation (second doping process).

Thereafter, heat treatment at approximately 300° C. is applied to the polycrystalline silicon film implanted with an impurity ($P^+$ ions) for approximately one hour (heating process).

Seventh Embodiment

Next, the manufacturing method of a p-type conductive silicon film is described as a seventh embodiment of the present invention. It is to be noted that the ion implantation machine 50 used in the sixth embodiment is also used in the seventh embodiment, and with this device all ions generated from the dopant gas are implanted to the polycrystalline silicon film without mass separation.

In the conductive silicon film manufacturing method according to this embodiment using this type of ion injection device 50, a polycrystalline silicon film with a thickness of, for example, 500 Å, is first formed on the surface of a glass substrate, and on the surface of the polycrystalline silicon film is formed a 1200 Å thick silicon dioxide film ($SiO_2$ film). When forming a TFT from the polycrystalline silicon film, it is preferable to form the polycrystalline silicon film with a crystallization rate of 75% or higher, and it is even more preferable to form it with a 90% or higher rate.

Next, using ion implantation machine 50, all ions generated from a mixed gas (dopant gas) containing 5% $B_2H_6$ with the remainder being hydrogen are implanted to the polycrystalline silicon film through the silicon dioxide film at an 80 keV energy level without mass separation (first ion doping process).

The dosage of the ions implanted at this time is $1\times10^{14}/cm^2$ converted to $B^+$ ions. As a result, the $B^+$ ion concentration peak in the polycrystalline silicon film will be approximately $1\times10^{19}/cm^3$.

Continuing, using ion injection device 50, ions generated from a 100% pure hydrogen gas are implanted to the polycrystalline silicon film through the silicon dioxide film at a 20 KeV energy level without mass separation (second ion doping process).

In this embodiment, most of the ions generated from the pure hydrogen gas are $H_2^+$, and by setting the implantation energy level to 20 KeV in this case, the concentration peak in the $H_2^+$ depth direction can be controlled to be positioned at the boundary of the polycrystalline silicon film and the silicon dioxide film.

Heat treatment with a temperature of approximately 300° C. is then applied for approximately one hour to the polycrystalline silicon film implanted with an impurity ($B^+$ ions) (heating process).

The heat treatment temperature here is in the range from approximately 300° C. to approximately 600° C., and preferably in the range from approximately 300° C. to approximately 550° C. Furthermore, in the TFT manufacturing process, when a low-cost glass substrate is used as the insulated substrate, the heat treatment temperature is preferably set within the range from approximately 300° C. to approximately 450° C.

The relationship between the hydrogen ion dose to the polycrystalline silicon film thus formed and the sheet resistance is shown in FIG. 19. In FIG. 19 the hydrogen ion does is converted to a $H^+$ ion quantity.

As shown in FIG. 19, the resistance of the polycrystalline silicon implanted with a small quantity of impurity is low when the dose of implanted $H^+$ ions is in the range from $1 \times 10^{14}/cm^2$ to $1 \times 10^{15}/cm^2$, or specifically when the concentration peak of $H^+$ ions in the polycrystalline silicon film is in the range from $6 \times 10^{18}/cm^3$ to $1 \times 10^{20}/cm^3$. The reasons for this are believed to be the result of competition between the effect of dangling bonds in the polycrystalline silicon film terminating due to hydrogen ion implantation, and the effect of defects being created by hydrogen ion implantation.

Furthermore, the relationship between the boron ion dose in the first doping process and sheet resistance is shown in FIG. 20 when the conditions of the second ion doping process are set so that ions generated from pure hydrogen are implanted without mass separation to the polycrystalline silicon film at a dose from $1 \times 10^{14}/cm^2$ to $1 \times 10^{15}/cm^2$ to achieve a concentration peak of $H^+$ ions in the polycrystalline silicon film in the range from $6 \times 10^{18}/cm^3$ [Sic] to $1 \times 10^{20}/cm^3$. In FIG. 20, the boron ion is shown converted to a $B^+$ ion quantity.

As shown in FIG. 20, the sheet resistance drops if the $B^+$ ion dose is changed to the range from $5 \times 10^{12}/cm^2$ to $1.5 \times 10^{15}/cm^2$, and the $B^+$ ion concentration peak is increased from $5 \times 10^{17}/cm^3$ to $1.6 \times 10^{19}/cm^3$.

Therefore, a low concentration polycrystalline silicon film can be made conductive according to this embodiment by heat treatment at a relatively low temperature of approximately 300° C. by implanting ions generated from a pure hydrogen gas to the silicon film without mass separation after implanting all ions generated from a mixed gas, which contains an impurity gas for generating an impurity with the remainder being hydrogen, to the silicon film without mass separation.

It is to be noted that in this embodiment, too, the energy level during ion implantation is a property that must be set to the optimum conditions based on the thickness and type of the silicon dioxide film formed on the surface of the polycrystalline silicon film, and the type of ions implanted, and there is therefore no limit on the conditions.

For example, when the generated ions are primarily $H^+$, if the implantation energy is set to 10 keV, the concentration peak in the $H^+$ depth direction can be positioned at the boundary of the polycrystalline silicon film and the silicon dioxide film.

Furthermore, because the ions generated from the mixed gas containing 5% $B_2H_6$ with the remainder hydrogen are primarily $B_2H_x^+$ ions, implantation can use an energy level of approximately 40 keV when primarily $B^+$ ions are generated even though ions were implanted at 80 keV in this embodiment.

Eighth Embodiment

A method for manufacturing TFT applying the manufacturing method of a conductive silicon film associated with an eighth embodiment of the present invention is described with reference to FIG. 21 and FIGS. 22A–22D.

FIG. 21 is a cross-sections view showing a typical structure of a TFT formed on a glass substrate using the manufacturing method of the eighth embodiment, and FIGS. 22A–22D show a process flow of the manufacturing method.

In FIG. 21, silicon dioxide film 606, for preventing diffusion of heavy metals from glass substrate 601 to the device area, is formed on the surface of glass substrate 601, and on its surface are formed an approximately 500 Å thick polycrystalline silicon film that will become channel formation area 607 and source-drain areas 602, 603 formed as n-type low concentration areas. On the surface of source-drain areas 602, 603 and channel formation area 607 is formed gate insulation film 608 from an approximately 1200 Å thick silicon dioxide film ($SiO_2$). On the surface of this gate insulation film 608 is formed gate electrode 609 comprising tantalum, aluminum, or chrome, and TFT 620 is formed from gate electrode 609, source-drain areas 602, 603, and channel formation area 607.

Source-drain areas 602, 603 are low concentration areas formed self-aligned to gate electrode 609 with a concentration peak of phosphorus ions as the impurity from $3 \times 10^{18}/cm^3$ to $1 \times 10^{19}/cm^2$.

Layer insulation film 611 is formed on the surface side of gate electrode 609, and aluminum source electrode 613 is connected to source-drain area 602 (source area), and aluminum and ITO drain electrode 612 is connected to source-drain area 603 (drain area), through contact holes 611*a*, 611*b*.

In the manufacturing method of TFT 620 thus structured, silicon dioxide film 606 is formed as an insulation film with a film thickness of approximately 2000 Å on the surface of glass substrate 601 as shown in FIG. 22A. This silicon dioxide film 606 is formed for the purpose of preventing diffusion of heavy metals, etc., contained in glass substrate 601 to the device side, and can therefore be omitted when using a substrate of sufficient purity.

Next, after forming a non-doped polycrystalline silicon film with a 500 Å film thickness, it is patterned to form polycrystalline silicon film 604. The crystallization rate of polycrystalline silicon film 604 is preferably approximately 75% or higher, and is even more preferably 90% or higher (first process).

Gate insulation film 608 is formed from $SiO_2$ with a film thickness of approximately 1200 Å on the surface of polycrystalline silicon film 604 (second process). Next, on the surface of gate insulation film 608, a low electrical resistance metal layer such as aluminum, chrome or tantalum is formed by sputtering, etc., to a film thickness of approximately 6000 Å, and this is then patterned to form gate electrode 609 (third process).

Next, as shown in FIG. 22 B in ion implantation machine 50 shown in FIG. 16, all ions (shown by arrow Ion-1) generated from a mixed gas (doping gas) containing 5% $PH_3$ with the remainder being $H_2$ gas are implanted to polycrystalline silicon film 604 at an approximately 80 keV energy level to achieve a $P^+$ ion dose in the range from $3 \times 10^{13}/cm^2$ to $1 \times 10^{14}/cm^2$ (first ion doping process).

As a result, polycrystalline silicon film 604 becomes low concentration area 604*a* with a phosphorus ion concentration peak in the range from $3 \times 10^{18}/cm^3$ to $1 \times 10^{19}/cm^3$.

Referring to FIG. 22C, in ion implantation machine 50 shown in FIG. 16, all ions (shown by arrow Ion-2) generated from a doping gas of pure hydrogen are implanted to low concentration area 604*a* at an approximately 20 KeV energy level to achieve a $H^+$ ion dose in the range from $1 \times 10^{14}/cm^2$ to $1 \times 10^{15}/cm^2$ (second ion doping process). As a result, the hydrogen ion concentration peak in low concentration area 604*a* is in the range from $6 \times 10^{18}/cm^3$ to $1 \times 10^{20}/cm^3$ Even after an impurity is implanted in this way, the crystallinity of low concentration area 604a is retained, and defects in the polycrystalline silicon film are terminated by the implanted hydrogen (above, the fourth process).

Next, as shown in FIG. 15D, the impurity is activated in polycrystalline silicon film 604 (low concentration area 604a) implanted with the impurity by heat treatment for approximately one hour at approximately 300° C. in a nitrogen atmosphere (heating process).

As a result, that part of polycrystalline silicon film 604 to which the impurity was introduced becomes source-drain areas 602, 603. In addition, directly below gate electrode 609 becomes channel formation area 607.

Next, contact holes 609a, 609b are formed after forming layer insulation film 611 on the surface of gate electrode 609, and source electrode 613 and drain electrode 612 are connected to source-drain areas 602, 603.

The relationship between the P+ dose and the drain current in TFT 620 thus manufactured when the drain-source voltage $V_{ds}$ is 4 V and the gate voltage $V_g$ is 10 V is shown by solid line 617 in FIG. 23. The relationship between the P+ dose and the drain current when the drain-source voltage $V_{ds}$ is 4 V and the gate voltage $V_g$ is −10 V is also shown in FIG. 23 by dotted line 618.

As shown in FIG. 23, the OFF current in TFT 620 can be reduced when the P+ dose is in the range from $3\times10^{13}/cm^2$ to $1\times10^{14}/cm^2$, in other words when the phosphorus ion concentration peak in the polycrystalline silicon film (source-drain areas 602, 603) is in the range from $3\times10^{18}/cm^3$ to $1\times10^{19}/cm^3$.

In addition, a low cost glass substrate 601 can be used because a heat treatment temperature of approximately 300° C. can be used with the TFT manufacturing method of the present embodiment. In addition, because high heat resistance is not required in gate electrode 609 and source electrode 613, a low electrical resistance electrode material can be used without being restricted by heat resistance. Moreover, because mass separation is not used in any of the ion doping processes, ions can be implanted to a wide area of the substrate.

Ninth Embodiment

FIG. 24 is a cross-sectional view showing a typical structure of a TFT formed on a glass substrate using the manufacturing method of this embodiment. FIGS. 25A–25E show a process flow of the manufacturing method. It is to be noted that the basic configuration of the eighth embodiment is common to the TFT of this embodiment and the TFT of embodiments 10 through 13 described below, and only the configuration of the source-drain area differs. Therefore, the same symbols are applied to parts having common functionality, and detailed description thereof is omitted.

In FIG. 24, an n-channel type TFT 630 comprising gate electrode 609 of tantalum, aluminum, or chrome, gate insulation film 608, source-drain areas 632, 633 formed self-aligned to gate electrode 609, and channel formation area 607 is formed on the surface of glass substrate 601.

High concentration contact areas 632a, 633a positioned in the area corresponding to contact holes 611a, 611b, and low concentration source-drain areas 632b, 633b positioned on the side of the edge of gate electrode 609 are formed in source-drain areas 632, 633, and TFT 630 has an LDD structure. The phosphorus ion concentration peak of the low concentration source-drain areas 632b, 6633 b here is in the range from $3\times10^{18}/cm^3$ to $1\times10^{19}/cm^3$, and the phosphorus ion concentration peak in high concentration contact areas 632a, 633a is $1\times10^{20}/cm^3$ or higher.

Therefore, the overall electrical resistance of source-drain areas 632, 633 is low due to the low electrical resistance high concentration contact areas 632a, 633a. Moreover, because it is low concentration source-drain areas 632b, 6633 b that are positioned near the edge of gate electrode 609, the OFF current is low. Furthermore, because source electrode 613 and drain electrode 612 are connected to source-drain areas 632, 633 through high concentration contact areas 632a, 633a, the contact resistance is low. In particular, even if drain electrode 612 is made of ITO as the pixel electrode, the contact resistance can be reduced because ITO is connected to high concentration contact area 633a.

The manufacturing method of a TFT thus configured is described with reference to FIGS. 25A–25E.

As shown in FIG. 25A, silicon dioxide film 606 is formed as an insulation film with a film thickness of approximately 2000 Å on the surface of glass substrate 601. Next, after forming a non-doped polycrystalline silicon film with a 500 Å film thickness, it is patterned to form polycrystalline silicon film 604. The crystallization rate of polycrystalline silicon film 604 is preferably approximately 75% or higher, and is even more preferably 90% or higher (first process). Gate insulation film 608 is formed from $SiO_2$ with a film thickness of approximately 1200 Å on the surface of polycrystalline silicon film 604 (second process).

Next, on the surface of gate insulation film 608, a low electrical resistance metal layer such as aluminum, chrome or tantalum is formed by sputtering, etc., to a film thickness of approximately 6000 Å, and this is then patterned to form gate electrode 609 (third process).

Next, as shown in FIG. 25B, in ion implantation machine 50 shown in FIG. 16, all ions (shown by arrow Ion-1) generated from a doping gas containing 5% $PH_3$ with the remainder being $H_2$ gas are implanted to polycrystalline silicon film 604 at an 80 keV energy level to achieve a P+ ion dose in the range from $3\times10^{13}/cm^2$ to $1\times10^{14}/cm^2$ (first ion doping process).

As a result, polycrystalline silicon film 604 becomes low concentration area 604a with a phosphorus ion concentration peak in the range from $3\times10^{18}/cm^3$.

Next, as shown in FIG. 25C, in ion implantation machine 50 shown in FIG. 16, all ions (shown by arrow ion-2) generated from a doping gas of pure hydrogen are implanted to low concentration area 604a at an approximately 20 KeV energy level to achieve a H+ ion dose in the range from $1\times10^{14}/cm^2$ to $1\times10^{15}/cm^2$ (second ion doping process). As a result, the hydrogen ion concentration peak in low concentration area 604a is in the range from $6\times10^{18}/cm^3$ to $1\times10^{20}/cm^2$.

Even after an impurity is implanted in this way, the crystallinity of low concentration area 604a is retained, and defects in the polycrystalline silicon film are terminated by the implanted hydrogen (above, the fourth process).

Next, as shown in FIG. 25D, contact holes 611a, 611b are formed in layer insulation film 611 after forming layer insulation film 611 on the surface of gate electrode 609. In this state, in ion implantation machine 50 shown in FIG. 16, all ions (shown by arrow Ion-3) generated from a doping gas of 5% $PH_3$ with the remainder $H_2$ gas are implanted to low concentration area 604a to achieve a P+ ion dose of $1\times10^{13}/cm^2$ or greater, forming high concentration contact areas 623a, 633a with a phosphorus ion concentration peak of $1\times10^{20}/cm^3$ in the area corresponding to the bottom of contact holes 611a, 611b. At this time, the impurity ions are implanted at an approximately 30 keV energy level so that the impurity concentration peak will be positioned at the center in the depth direction of polycrystalline silicon film 604 at the bottom side of contact holes 611a, 611b (fifth process).

Next, the impurity is activated by heat treatment of polycrystalline silicon film 604 implanted with the impurity for approximately one hour at approximately 300° C. in a nitrogen atmosphere (heating process).

As a result, that part of polycrystalline silicon film 604 to which the impurity was introduced becomes source-drain areas 632, 633. Additionally, part of source-drain areas 632, 633 implanted with a high concentration impurity is high concentration contact areas 632a, 633a, and the other area is low concentration source areas 632b, 6633b. In addition, the area corresponding to directly below gate electrode 609 is channel formation area 607.

As shown in FIG. 25E, source electrode 613 and drain electrode 612 are connected to high concentration contact areas 632a, 633a, respectively.

By means of this manufacturing method, even when high concentration contact areas 632a, 633a are formed in source-drain areas 623, 633, a resist mask or other special mask is not necessary because ions are selectively implanted through contact holes 611a, 611b formed in layer insulation film 611. As a result, the effect of being able to reduce the number of manufacturing processes in TFT 630 is obtained in addition to the effects obtained from the eighth embodiment.

Tenth Embodiment

FIG. 26 is a cross-sectional view showing a typical structure of a TFT formed on a glass substrate using the manufacturing method of this embodiment, and FIGS. 27A–27E show a process flow of the manufacturing method.

In FIG. 26, an n-channel type TFT 640 comprising gate electrode 609 of tantalum, aluminum, or chrome, gate insulation film 608, source-drain areas 632, 633 formed self-aligned to gate electrode 609, and channel formation area 607 is formed on the surface of glass substrate 601.

High concentration contact areas 642a, 643a having a phosphorus ion concentration peak of $1 \times 10^{20}/cm^3$ or greater is formed in the area of source-drain areas 642, 643 including the bottom surface of contact holes 611a, 611b, and positioned near the edge of gate electrode 609 are low concentration source-drain areas 642b, 643b with a phosphorus ion concentration peak in the range from $3 \times 10^{18}/cm^2$ to $1 \times 10^{19}/cm^3$.

As a result, the overall electrical resistance of source-drain areas 642, 643 is low due to the low electrical resistance high concentration contact areas 642a, 643a. Moreover, because what is positioned near the edge of gate electrode 609 is low concentration source-drain areas 642b, 643b, the OFF current is low. In addition, the contact resistance is low because source electrode 613 and drain electrode 612 are connected to source-drain areas 642, 643 through high concentration contact areas 642a, 643a. In particular, the contact resistance is low even if drain electrode 612 is made from ITO as the pixel electrode because ITO is connected to high concentration contact area 643a.

The manufacturing method of a TFT thus configured is described with reference to FIGS. 27A–27E.

As shown in FIG. 27A, silicon dioxide film 606 is formed as an insulation film having a film thickness of approximately 2000 Å on the surface of glass substrate 601. Next, after forming a non-doped polycrystalline silicon film with a 500 Å film thickness, it is patterned to form polycrystalline silicon film 604. The crystallization rate of polycrystalline silicon film 604 is preferably approximately 75% or higher, and is even more preferably 90% or higher (first process).

Next, gate insulation film 608 is formed from $SiO_2$ with a film thickness of approximately 1200 Å on the surface of polycrystalline silicon film 604 (second process).

In the third process, on the surface of gate insulation film 608, a low electrical resistance metal layer such as aluminum, chrome or tantalum is formed by sputtering, etc., to a film thickness of approximately 6000 Å, and this is then patterned to form gate electrode 609.

Next, as shown in FIG. 27B, in ion injection device 50 shown in FIG. 16, all ions (shown by arrow Ion-1) generated from a doping gas containing 5% $PH_3$ with the remainder being $H_2$ gas are implanted to polycrystalline silicon film 604 at an approximately 80 keV energy level to achieve a $P^+$ ion dose in the range from $3 \times 10^{13}/cm^2$ to $1 \times 10^{14}/cm^2$ (first ion doping process). As a result, polycrystalline silicon film 604 becomes low concentration area 604a with a phosphorus ion concentration peak in the range from $3 \times 10^{18}/cm^3$ to $1 \times 10^{19}/cm^3$.

Next, as shown in FIG. 27C, in ion implantation machine 50 shown in FIG. 16, all ions (shown by arrow ion-2) generated from a doping gas of pure hydrogen are implanted to low concentration area 604a at an approximately 20 KeV energy level to achieve a $H^+$ ion dose in the range from $1 \times 10^{14}/cm^2$ to $1 \times 10^{15}/cm^2$ (second ion doping process).

As a result, the hydrogen ion concentration peak in low concentration area 604a is in the range from $6 \times 10^{18}/cm^3$ to $1 \times 10^{20}/cm^3$.

Even after an impurity is implanted in this way, the crystallinity of low concentration area 604a is retained, and defects in the polycrystalline silicon film are terminated by the implanted hydrogen (above, the fourth process).

Next, as shown in FIG. 27D, that part of the surface of polycrystalline silicon film 604 around gate electrode 609 is covered by a mask 645 of a resist, polyimide, or other organic material. In this state, in ion injection device 50 shown in FIG. 16, all ions (shown by arrow Ion-3) generated from a doping gas of 5% $PH_3$ with the remainder $H_2$ gas are implanted to low concentration area 604a at approximately 80 keV to achieve a $P^+$ ion dose of $1 \times 10^{15}/cm^2$ or greater, forming high concentration contact areas 642a, 643a with a phosphorus ion concentration peak of $1 \times 10^{20}/cm^3$ or greater in polycrystalline silicon film 604 (fifth process).

Next, as shown in FIG. 27E, layer insulation film 611 made from a $SiO_2$ film with a 5000 Å film thickness is formed on the surface of gate electrode 609, and then contact holes 611a, 611b are formed in layer insulation film 611. The impurity is then activated by heat treatment of polycrystalline silicon film 604 implanted with the impurity for approximately one hour at approximately 300° C. in a nitrogen atmosphere (heating process).

As a result, that part of polycrystalline silicon film 604 to which the impurity was introduced becomes source-drain areas 642, 643. That part of source-drain areas 642, 643 implanted with a high concentration impurity is high concentration contact areas 642a, 643a, and the other area is low concentration source areas 642b, 643b. In addition, the area corresponding to directly below gate electrode 609 is channel formation area 607.

Next, source electrode 613 and drain electrode 612 are connected, respectively, to high concentration contact areas 642a, 643a through contact holes 611a, 611b of layer insulation film 611.

The implantation energy can be increased in the present embodiment when forming high concentration contact areas 642a, 643a because the impurity ions are implanted to the silicon film through gate insulation film 608. As a result, the productivity of TFT 640 manufacture can be improved in addition to the effects obtained with the eighth embodiment because of the advantage of being able to set the ion beam current high.

Eleventh Embodiment

FIG. 28 is a cross-sectional view showing a typical structure of a TFT formed on a glass substrate using the manufacturing method of this embodiment, and FIGS. 29A–29D [sic] shows a process flow of the manufacturing method.

In FIG. 28, an n-channel type TFT 650 comprising gate electrode 609 of tantalum, aluminum, or chrome, gate insulation film 608, source-drain areas 652, 653 formed self-aligned to gate electrode 609, and channel formation area 607 is formed on the surface of glass substrate 601.

Source-drain areas 652, 653 are low concentration areas with a phosphorus ion concentration peak in the range from $3\times10^{18}/cm^3$ to $1\times10^{19}/cm^3$, and have a double layer structure comprising low concentration source-drain areas 652a, 653a on the bottom with a film thickness of approximately 1000 Å, and low concentration source-drain areas 652b, 653b on the top with a film thickness of approximately 500 Å. Of source-drain areas 652, 653, the top layer low concentration source-drain areas 652b, 653b are areas formed from the same polycrystalline silicon film as channel formation area 607.

Therefore, source-drain areas 652, 653 have an overall low electrical resistance because the overall film thickness is thick. Moreover, because what is positioned near the edge of gate electrode 609 is the thin low concentration source-drain areas 652b, 653b of the top layer, the OFF current is low.

The manufacturing method of a TFT thus configured is described with reference to FIGS. 29A–29D.

As shown in FIG. 29A, silicon dioxide film 606 is formed as an insulation film with a film thickness of approximately 2000 Å on the surface of glass substrate 601.

Next, after forming a non-doped polycrystalline silicon film with a 1000 Å film thickness, it is patterned to form polycrystalline silicon film 605.

Next, after forming a non-doped polycrystalline silicon film with a 500 Å film thickness, it is patterned to form polycrystalline silicon film 604. The crystallization rate of polycrystalline silicon films 604 and 605 is preferably approximately 75% or higher, and is even more preferably 90% or higher (first process).

Next, gate insulation film 608 is formed from $SiO_2$ with a film thickness of approximately 1200 Å on the surface of polycrystalline silicon film 604 (second process).

In the next step, on the surface of gate insulation film 608, a low electrical resistance metal layer such as aluminum, chrome or tantalum is formed by sputtering, etc., to a film thickness of approximately 6000 Å, and this is then patterned to form gate electrode 609 (third process).

Next, as shown in FIG. 29B, in ion implantation machine 50 shown in FIG. 16, all ions (shown by arrow Ion-1) generated from a doping gas containing 5% $PH_3$ with the remainder being $H_2$ gas are implanted to polycrystalline silicon film 604 at an approximately 80 keV energy level to achieve a $P^+$ ion dose in the range from $3\times10^{13}/cm^2$ to $1\times10^{14}/cm^2$ (first ion doping process).

As a result, low concentration areas 604a, 605a with a phosphorus ion concentration peak in the range from $3\times10^{18}/cm^3$ to $1\times10^{19}/cm^3$ are formed in polycrystalline silicon films 604 and 605.

As shown in FIG. 29C, in ion implantation machine 50 shown in FIG. 16, all ions (shown by arrow ion-2) generated from a doping gas of pure hydrogen are implanted to low concentration areas 604a, 605a at an approximately 20 KeV energy level to achieve a $H^+$ ion dose in the range from $1\times10^{14}/cm^2$ to $1\times10^{15}/cm^2$ (second ion doping process). As a result, the hydrogen ion concentration peak in low concentration areas 604a, 605a is in the range from $6\times10^{18}/cm^3$ to $1\times10^{20}/cm^3$.

Even after an impurity is implanted in this way, the crystallinity of low concentration areas 604a, 605a is retained, and defects in the polycrystalline silicon film are terminated by the implanted hydrogen (above, the fourth process).

Next, as shown in FIG. 29D, the impurity is activated by heat treatment of polycrystalline silicon film 604 implanted with the impurity for approximately one hour at approximately 300° C. in a nitrogen atmosphere (heating process).

As a result, that part of polycrystalline silicon film 604 to which the impurity was introduced becomes source-drain areas 652, 653, and the area corresponding to directly below gate electrode 609 is channel formation area 607.

Next, layer insulation film 611 is formed from an $SiO_2$ film with a film thickness of 5000 Å on the surface of gate electrode 609, and contact holes 611a, 611b are then formed in layer insulation film 611.

In a manufacturing method of this type, contact holes 611a, 611b in layer insulation film 611 can be sufficiently over-etched when formed by dry etching because the bottom side is a double layer structure with a bottom layer of low concentration source-drain areas 652a, 653a and a top layer of low concentration source-drain areas 652b, 653b. As a result, the stability of the manufacturing process is improved in addition to the effects obtained by the eighth embodiment.

Twelfth Embodiment

FIG. 30 is a cross-sectional view showing a typical structure of a TFT formed on a glass substrate using the manufacturing method of this embodiment, and FIGS. 31A–31E show a process flow of the manufacturing method. In FIG. 30, an n-channel type TFT 660 comprising gate electrode 609 of tantalum, aluminum, or chrome, gate insulation film 608, source-drain areas 662, 663 formed self-aligned to gate electrode 609, and channel formation area 607 is formed on the surface of glass substrate 601.

Source-drain areas 662, 663 have a double layer structure comprising low concentration source-drain areas 662a, 663a on the bottom with a film thickness of approximately 1000 Å, and low concentration source-drain areas 662b, 663b on the top with a film thickness of approximately 500 Å. These low concentration source-drain areas 662a, 662b, 663a, 663b, are low concentration areas with a phosphorus ion concentration peak in the range from $3\times10^{18}/cm^3$ to $1\times10^{19}/cm^3$. The top layer low concentration source-drain areas 662b, 663b are areas formed from the same polycrystalline silicon film as channel formation area 607.

In source-drain areas 662, 663, high concentration contact areas 662c, 663c with a phosphorus ion concentration peak of $1\times10^{20}/cm^3$ or higher are formed at the position corresponding to the opening of contact holes 611a, 611b from the surface side of the top layer low concentration source-drain areas 662b, 663b to the bottom side of the bottom layer low concentration source-drain areas 662a, 663a.

Therefore, source-drain areas 662, 663 have an overall low electrical resistance because the overall film thickness is thick. Moreover, because what is positioned near the edge of gate electrode 609 is the thin low concentration source-drain areas 662b, 663b of the top layer, the OFF current is low.

The manufacturing method of a TFT thus configured is described with reference to FIG. 31A–31E.

As shown in FIG. 31A, silicon dioxide film 606 is formed as an insulation film with a film thickness of approximately 2000 Å on the surface of glass substrate 601. After forming a non-doped polycrystalline silicon film with a 1000 Å film thickness, it is patterned to form polycrystalline silicon film 605. Next, after forming a non-doped polycrystalline silicon film with a 500 Å film thickness, it is patterned to form polycrystalline silicon film 604. The crystallization rate of polycrystalline silicon films 604 and 605 is preferably approximately 75% or higher, and is even more preferably 90% or higher (first process).

Next, gate insulation film 608 is formed from $SiO_2$ with a film thickness of approximately 1200 Å on the surface of polycrystalline silicon film 604 (second process).

On the surface of gate insulation film 608, a low electrical resistance metal layer such as aluminum, chrome or tantalum is formed by sputtering, etc., to a film thickness of approximately 6000 Å and this is then patterned to form gate electrode 609 (third process).

Next, as shown in FIG. 31B, in ion implantation machine 50 shown in FIG. 16, all ions (shown by arrow Ion-1) generated from a doping gas containing 5% $PH_3$ with the remainder being $H_2$ gas are implanted to polycrystalline silicon films 604, 605 at an approximately 80 keV energy level to achieve a $P^+$ ion dose in the range from $3 \times 10^{13}/cm^2$ to $1 \times 10^{14}/cm^2$ (first ion doping process). As a result, low concentration areas 604a, 605a with a phosphorus ion concentration peak in the range from $3 \times 10^{18}/cm^3$ to $3 \times 10^{19}/cm^2$ are formed in polycrystalline silicon films 604 and 605.

Next, as shown in FIG. 31C, in ion implantation machine 50 shown in FIG. 16, all ions (shown by arrow ion-2) generated from a doping gas of pure hydrogen are implanted to low concentration areas 604a, 605a at an approximately 20 KeV energy level to achieve a $H^+$ ion dose in the range from $1 \times 10^{14}/cm^2$ to $1 \times 10^{15}/cm^2$ (second ion doping process).

As a result, the hydrogen ion concentration peak in low concentration areas 604a, 605a is in the range from $6 \times 10^{18}/cm^3$ to $1 \times 10^{20}/cm^3$.

Even after an impurity is implanted in this way, the crystallinity of low concentration areas 604a, 605a is retained, and defects in the polycrystalline silicon film are terminated by the implanted hydrogen (above, the fourth process).

Next, as shown in FIG. 31D, after forming layer insulation film 611 on the surface of gate electrode 609, contact holes 611a, 611b are formed therein. In this state, in ion injection device 50 shown in FIG. 16, all ions (shown by arrow Ion-3) generated from a doping gas of 5% $PH_3$ with the remainder $H_2$ gas are implanted to low concentration areas 604a, 605a to achieve a $P^+$ ion dose of $1 \times 10^{15}/cm^2$ or greater, forming high concentration contact areas 662c, 663c with a phosphorus ion concentration peak of $1 \times 10^{20}/cm^3$ or greater in the area corresponding to the bottom of contact holes 611a, 611b. At this time, the impurity ions are implanted at an approximately 30 keV energy level so that the impurity concentration peak in the bottom of contact holes 611a, 611b is positioned at the center of the total film thickness of polycrystalline silicon films 604 and 605 (fifth process).

Then, the impurity is activated by heat treatment of polycrystalline silicon film 604 implanted with the impurity for approximately one hour at approximately 300° C. in a nitrogen atmosphere (heating process).

As a result, that part of polycrystalline silicon films 604, 605 to which the impurity was introduced becomes source-drain areas 662, 663, and the area corresponding to directly below gate electrode 609 is channel formation area 607. That area of source-drain areas 662, 663 to which a high concentration impurity was implanted is high concentration contact areas 662c, 663c, and the remaining areas are low concentration source-drain areas 662a, 662b, 663a, 663b.

Next, as shown in FIG. 31E, source electrode 613 and drain electrode 612 are respectively connected to high concentration contact areas 662c and 663c.

In TFT 660 manufactured in this way, even when high concentration contact areas 662c, 663c are formed in source-drain areas 662, 663, a resist mask or other special mask is not necessary because ions are selectively implanted through contact holes 611a, 611b formed in layer insulation film 611. As a result, the effect of being able to reduce the number of manufacturing processes in TFT 660 is obtained in addition to the effects obtained from the eighth embodiment.

Thirteenth Embodiment

FIG. 32 is a cross-sectional view showing a typical structure of a TFT formed on a glass substrate using the manufacturing method of this embodiment, and FIG. 33 shows a process flow of the manufacturing method. In FIG. 32, an n-channel type TFT 670 comprising gate electrode 609 of tantalum, aluminum, or chrome, gate insulation film 608, source-drain areas 672, 673 formed self-aligned to gate electrode 609, and channel formation area 607 is formed on the surface of glass substrate 601.

Source-drain areas 672, 673 have a double layer structure comprising high concentration source-drain areas 672a, 673a on the bottom with a film thickness of approximately 1000 Å, and source-drain areas 672b, 673b on the top with a film thickness of approximately 500 Å. That part of source-drain areas 672b, 673b on the top positioned near the edge of gate electrode 609 forms low concentration source-drain areas 672c, 673c with a phosphorus ion concentration peak in the range from $3 \times 10^{18}/cm^{19}$ to $1 \times 10^{19}/cm^3$, and the remaining area forms high concentration source-drain areas 672d, 673d with a phosphorus ion concentration peak of $1 \times 10^{20}/cm^3$ or greater. The top layer source-drain areas 672b, 673b are areas formed from the same polycrystalline silicon film as channel formation area 607.

Therefore, source-drain areas 672, 673 have an overall low electrical resistance because the overall film thickness is thick. Moreover, because what is positioned near the edge of gate electrode 609 is the thin low concentration source-drain areas 672c, 673c of the top layer, the OFF current is low.

The manufacturing method of a TFT thus configured is described with reference to

FIGS. 33A–33E.

As shown in FIG. 33A, silicon dioxide film 606 is formed as an insulation film with a film thickness of approximately 2000 Å on the surface of glass substrate 601. Next, after forming a non-doped polycrystalline silicon film with a 1000 Å film thickness, it is patterned to form polycrystalline silicon film 605. After forming a non-doped silicon film with a 500 Å film thickness, it is patterned to form polycrystalline silicon film 604. The crystallization rate of polycrystalline silicon films 604 and 605 is preferably approximately 75% or higher, and is even more preferably 90% or higher (first process).

Next, gate insulation film 608 is formed from $SiO_2$ with a film thickness of approximately 1200 Å on the surface of polycrystalline silicon film 604 (second process).

Next, on the surface of gate insulation film 608, a low electrical resistance metal layer such as aluminum, chrome or tantalum is formed by sputtering, etc., to a film thickness of approximately 6000 Å, and this is then patterned to form gate electrode 609 (third process).

Next, as shown in FIG. 33B, in ion implantation machine 50 shown in FIG. 16, all ions (shown by arrow Ion-1) generated from a doping gas containing 5% $PH_3$ with the remainder being $H_2$ gas are implanted to polycrystalline silicon films 604, 605 at an approximately 80 keV energy level to achieve a P⁺ ion dose in the range from $3\times10^{13}/cm^2$ to $1\times10^{14}/cm^2$ (first ion doping process).

As a result, low concentration areas 604a, 605a with a phosphorus ion concentration peak in the range from $3\times10^{18}/cm^3$ to $1\times10^{19}/cm^3$ are formed in polycrystalline silicon films 604 and 605.

Next, as shown in FIG. 33C, in ion implantation machine 50 shown in FIG. 16, all ions (shown by arrow ion-2) generated from a doping gas of pure hydrogen are implanted to low concentration areas 604a, 605a at an approximately 20 KeV energy level to achieve a H⁺ ion dose in the range from $1\times10^{14}/cm^2$ to $1\times10^{15}/cm^2$ (second ion doping process). As a result, the hydrogen ion concentration peak in low concentration areas 604a, 605a is in the range from $1\times10^{18}/cm^3$ to $1\times10^{20}/cm^3$.

Even after the impurity is implanted in this way, the crystallinity of low concentration areas 604a, 605a is retained, and defects in the polycrystalline silicon film are filled by the implanted hydrogen (above, the fourth process).

Next, as shown in FIG. 33D, that part of the surface of polycrystalline silicon film 604 around gate electrode 609 is covered by a mask 675 of a resist, polyimide, or other organic material. In this state, in ion injection device 50 shown in FIG. 16, all ions (shown by arrow Ion-3) generated from a doping gas of 5% PH₃ with the remainder H₂ gas are implanted to low concentration areas 604a, 605a at approximately 80 keV to achieve a P⁺ ion dose of $1\times10^{15}/cm^2$ or greater, forming high concentration area 604b with a phosphorus ion concentration peak of $1\times10^{20}/cm^3$ or greater in low concentration area 604a. In addition, polycrystalline silicon film 605a is made into high concentration area 605b with a phosphorus ion concentration peak of $1\times10^{20}/cm^3$ or greater (fifth process).

Next, as shown in FIG. 33E, layer insulation film 611 is formed from a 5000 Å thick SiO₂ film on the surface of gate electrode 609, and contact holes 611a, 611b are formed in layer insulation film 611.

Then, the impurity is activated by heat treatment of polycrystalline silicon film 604 implanted with the impurity for approximately one hour at approximately 300° C. in a nitrogen atmosphere (heating process).

As a result, low concentration source-drain areas 672c, 673c and high concentration source-drain areas 672d, 673d are formed in polycrystalline silicon film 604, and the area corresponding to directly below gate electrode 609 becomes channel formation area 607. In addition, polycrystalline silicon film 605 becomes high concentration source-drain areas 672a, 673a. Next, source electrode 613 and drain electrode 612 are respectively connected to high concentration source-drain areas 672d, 673d.

In a TFT 670 thus manufactured, contact holes 611a, 611b can be sufficiently over-etched when formed by dry etching because the bottom side is a double layer structure with a bottom layer of high concentration source-drain areas 672a, 673a and a top layer of high concentration source-drain areas 672d, 673d. As a result, the stability of the manufacturing process is improved in addition to the effects obtained by the eighth embodiment. Furthermore, the ion beam current can be set high because the implantation energy when forming high concentration source-drain areas 672a, 672d, 673a, 673d can be high.

Fourteenth Embodiment

Three different types of thin-film transistors are formed in an active matrix circuit board with a built-in drive circuit because the characteristics required of the thin-film transistors are different.

In the fourteenth embodiment, therefore, a method for manufacturing different types of thin-film transistors is described applying the manufacturing method for conductive silicon films according to the sixth and seventh embodiments.

FIG. 34 is a cross-sectional diagram showing a typical thin-film transistors (hereafter "TFT") formed in the active matrix circuit board of the present embodiment. That figure illustrates the structure of the TFT formed in the pixel area and the n-channel type TFT and p-channel type TFT comprising a CMOS circuit formed in the drive circuit area.

In FIG. 34, in active matrix circuit board 700 of the present embodiment, n-channel type TFT-A of the drive circuit area, p-channel type TFT-B of the drive circuit area, and n-channel type TFT-C of the pixel area are formed on a glass substrate 701 (insulated substrate) in order from the left side as looking at the figure.

Source-drain areas 712, 713 of TFT-A are formed as high concentration areas with an impurity concentration of $1\times10^{19}/cm^2$ or greater, and are formed self-aligned to gate electrode 715. Source-drain areas 722, 723 of TFT-B are formed as high concentration areas with an impurity concentration of $1\times10^{19}/cm^3$ or greater, and are formed self-aligned to gate electrode 725. Source-drain areas 732, 733 of TFT-C are formed as low concentration areas with an impurity concentration of $1\times10^{19}/cm^3$ or less, and are formed self-aligned to gate electrode 735.

Therefore, a high ON current can be obtained in TFT-A and TFT-B of the drive circuit area. In addition, a sufficiently low OFF current can be obtained in TFT-C of the pixel area because source-drain areas 732, 733 are formed as low concentration areas.

The manufacturing method of active matrix circuit board 700 of such construction is described with reference to FIGS. 35A–35D. FIGS. 35A–35D show a process flow of the manufacturing method of the active matrix circuit board of the present embodiment.

First, as shown in FIG. 35A, after forming a polycrystalline silicon film with a film thickness of approximately 500 Å on the surface side of glass substrate 701, this is patterned to form silicon films 710, 720, 730. Silicon film 710 is a first silicon film for forming TFT-A, and silicon film 720 is a second silicon film for forming TFT-B. Silicon film 730 is a third silicon film for forming TFT-C (first process).

Next, gate insulation films 714, 724, 734 having a film thickness of approximately 1200 Å are formed on the surface side of each silicon film 710, 720, 730 (second process).

A metal layer such as tantalum, aluminum, or chrome is then formed by sputtering, etc., on the surface of gate insulation films 714, 724, 734, and is patterned to form gate electrodes 715, 725, 735 with a film thickness of approximately 600 Å (third process). As shown by arrow Ion-1, low concentration phosphorus ions are implanted to silicon films 710, 720, 730 using gate electrodes 715, 725, 735 as a mask.

In this process, in ion implantation machine 50 shown in FIG. 16, all ions generated from a doping gas containing 5% PH₃ with the remainder being H₂ gas are implanted at an approximately 80 keV energy level to achieve a P⁺ ion dose in the range from $3\times10^{13}/cm^2$ to $1\times10^{14}/cm^2$ (first ion doping process).

As a result, polycrystalline silicon films 710, 720, 730 become low concentration areas 710a, 720a, 730a with a phosphorus ion concentration peak in the range from $3\times10^{18}/cm^3$ to $1\times10^{19}/cm^3$.

Continuing, as shown in FIG. 35B, in ion implantation machine 50 shown in FIG. 16, all ions (shown by arrow Ion-2) generated from a doping gas of pure hydrogen are implanted to low concentration areas 710a, 720a, 730a at an approximately 20 KeV energy level to achieve a H$^+$ ion dose in the range from $1\times10^{14}$/cm$^2$ to $1\times10^{15}$/cm$^2$ (second ion doping process).

As a result, the hydrogen ion concentration peak in low concentration areas 7 10a, 720a, 730a is in the range from $6\times10^{18}$/cm$^3$ to $1\times10^{20}$/cm$^3$ (above, the low concentration area formation process).

Next, as shown in FIG. 35C, after masking the side with silicon films 720, 730 with resist 740 as a mask, high concentration phosphorus ions are implanted to low concentration area 710a as shown by arrow Ion-3 (fourth process).

Ion implantation machine 50 shown in FIG. 16 is used for this ion implantation, too. In other words, all ions generated from a doping gas containing 5% PH$_3$ with the remainder being H$_2$ gas are implanted at an approximately 80 keV energy level to achieve a P$^+$ ion dose of $1\times10^{15}$/cm$^2$ or greater (fifth process).

As a result, low concentration area 710a becomes source-drain areas 712, 713 (n$^+$high concentration areas) formed with a phosphorus ion concentration peak of $1\times10^{20}$/cm$^3$ or greater self-aligned to gate electrode 715. In addition, that part of silicon film 710 positioned directly below gate electrode 715 becomes channel formation area 711. Next, as shown in FIG. 35D, after masking the sides with silicon films 710, 730 with resist 750, high concentration boron ions are implanted to low concentration area 720a as shown by arrow Ion-4 (fifth process).

Ion implantation machine 50 shown in FIG. 16 is used for this ion implantation, too. In other words, all ions generated from a doping gas containing 5% B$_2$H$_3$ with the remainder being H$_2$ gas are implanted at an approximately 80 keV energy level to achieve a B$^+$ion dose of $1\times10^{15}$/cm$^2$ or greater. As a result, low concentration area 720a becomes source-drain areas 722, 723 (p$^+$ high concentration areas) formed with a phosphorus ion concentration peak of $1\times10^{20}$/cm$^3$ or greater self-aligned to gate electrode 725. In addition, that part of silicon film 720 positioned directly below gate electrode 725 becomes channel formation area 721.

Then, the impurity is activated in polycrystalline silicon films 710, 720, 730 implanted with the impurity by heat treatment for approximately one hour at approximately 300° C. in a nitrogen atmosphere (heating process).

The processes following thereafter are identical to the normal TFT manufacturing method, and description is therefore omitted.

As described hereinabove, by means of the manufacturing method of this embodiment, TFT with optimum electrical characteristics can be manufactured because the dosage conditions of TFT-A, TFT-B, and TFT-C can be set independently. In addition, because the heat treatment temperature is low, the low heat resistance materials can be used for electrodes, and a low cost glass substrate 701 can be used.

Fifteenth Embodiment

The structures of an active matrix circuit board according to a fifteenth embodiment of the present invention and the sixteenth embodiment described after this embodiment are basically the same as the structure of the active matrix circuit board according to the fourteenth embodiment, and only the structure of the TFT in the pixel area differs. Therefore, parts with functionality common to the fourteenth embodiment are identically labeled, and further identification in the figures and detailed description are omitted.

FIG. 36 is a cross-sectional view showing a typical structure of the TFT formed in an active matrix circuit board according to the present embodiment. In FIG. 36, TFT-A, TFT-B, and TFT-C are formed in active matrix circuit board 800 of this embodiment on glass substrate 701.

As described in the description of the fourteenth embodiment, source-drain areas 712, 713, 722, and 723 of TFT-A and TFT-B are high concentration areas with an impurity concentration of $1\times10^{19}$/cm$^3$ or greater, and are formed self-aligned to gate electrodes 715, 725.

In source-drain areas 832, 833 of TFT-C, that area positioned near the edge of gate electrode 835 is low concentration source-drain area 832b, 833 b with an impurity concentration of $1\times10^{19}$/cm$^3$ or less, and the other areas are high concentration contact areas 832a, 833a with an impurity concentration of $1\times10^{19}$/cm$^3$ or greater.

Therefore, the OFF current of TFT-C is low. In addition, the overall electrical resistance of source-drain areas 832, 833 is low because high concentration contact areas 832a, 833a are formed in source-drain areas 832, 833. Moreover, because the source electrode and drain electrode can be connected to high concentration contact area 832a, 833a, the contact resistance there can be reduced.

The manufacturing method of an active matrix circuit board of such configuration is described with reference to FIGS. 37A–37D.

First, as shown in FIG. 37A, after forming a polycrystalline silicon film with a film thickness of approximately 500 Å on the surface side of glass substrate 701, this is patterned to form silicon films 710,720, 830. Silicon film 830 is a third silicon film for forming TFT-C (first process). Gate insulation films 714, 724, 834 with a film thickness of approximately 1200 Å are then formed on the surface side of each silicon film 710, 720, 830 (second process), and then gate electrodes 715, 725, 835 with a film thickness of approximately 6000 Å, are formed from tantalum, aluminum, chrome, etc. on the surface of gate insulation films 714, 724, 834 (third process).

Next, as shown by arrow Ion-1, low concentration phosphorus ions are implanted to silicon films 710, 720, 830 using gate electrodes 715, 725, 835 as a mask.

In this process, in ion implantation machine 50 shown in FIG. 16, all ions generated from a doping gas containing 5% PH$_3$ with the remainder being H$_2$ gas are implanted at an approximately 80 keV energy level to achieve a P$^+$ ion dose in the range from $3\times10^{13}$/cm$^2$ to $1\times10^{14}$/cm$^2$ (first ion doping process). As a result, polycrystalline silicon films 710, 720, 830 become low concentration areas 710a, 720a, 830a with a phosphorus ion concentration peak in the range from $3\times10^{18}$/cm$^3$ to $1\times10^{19}$/cm$^3$.

Continuing, as shown in FIG. 37B, in ion implantation machine 50 shown in FIG. 16, all ions (shown by arrow ion-2) generated from a doping gas of pure hydrogen are implanted to low concentration areas 710a, 720a, 830a at an approximately 20 KeV energy level to achieve a H$^+$ ion dose in the range from $1\times10^{14}$/cm$^2$ to $1\times10^{15}$/cm$^2$(second ion doping process).

As a result, the hydrogen ion concentration peak in low concentration areas 710a, 720a, 830a is in the range from $6\times10^{18}$/cm$^3$ to $1\times10^{20}$/cm$^3$ (above, the low concentration area formation process).

Next, as shown in FIG. 37C, after masking the side with silicon films 720, 830 with resist 840, high concentration phosphorus ions are implanted to low concentration area 710a as shown by arrow Ion-3 (fourth process). Here, resist 840 covers the area around gate electrode 835 on the side with silicon film 830, and ions are implanted in this state.

Ion implantation machine 50 shown in FIG. 16 is used for this ion implantation in this process. In other words, all ions generated from a doping gas containing 5% PH$_3$ with the remainder being H$_2$ gas are implanted at an approximately 80 keV energy level to achieve a P$^+$ ion dose of $1\times10^{15}$/cm$^3$ or greater. As a result, low concentration area 710a becomes source-drain areas 712, 713 (n+ high concentration areas) formed with a phosphorus ion concentration peak of $1\times10^{20}$/cm$^3$ or greater self-aligned to gate electrode 715. In addition, that part of silicon film 710 positioned directly below gate electrode 715 becomes channel formation area 711.

Also, high concentration contact areas 832a, 833a with a phosphorus ion concentration peak of $1\times10^{20}$/cm$^3$ or greater are formed in low concentration area 830a, and that area to which high concentration ions are not implanted becomes low concentration source-drain area 832b, 8633 b with a phosphorus ion concentration peak in the range from $3\times10^{18}$/cm$^3$ to $1\times10^{19}$/cm$^3$.

Next, as shown in FIG. 37D, after masking the sides with silicon films 710, 830 with resist 850, high concentration boron ions are implanted to low concentration area 720a as shown by arrow Ion-4 (fifth process).

Ion implantation machine 50 shown in FIG. 16 is used for this ion implantation, too. In other words, all ions generated from a doping gas containing 5% $B_2H_3$ with the remainder being $H_2$ gas are implanted at an approximately 80 keV energy level to achieve a B$^+$ion dose of $1\times10^{15}$/cm$^2$ or greater. As a result, low concentration area 720a becomes source-drain areas 722, 723 (p$^+$ high concentration areas) formed with a boron ion concentration peak of $1\times10^{20}$/cm$^3$ or greater self-aligned to gate electrode 725. In addition, that part of silicon film 720 positioned directly below gate electrode 725 becomes channel formation area 721.

Then, the impurity is activated in polycrystalline silicon films 710, 720, 830 implanted with the impurity by heat treatment for approximately one hour at approximately 300° C. in a nitrogen atmosphere.

The processes following thereafter are identical to the normal TFT manufacturing method, and description is therefore omitted.

As described hereinabove, by means of the manufacturing method of this embodiment, TFT with optimum electrical characteristics can be manufactured because the dosage conditions of TFT-A, TFT-B, and TFT-C can be set independently. In addition, because the heat treatment temperature is low, the low heat resistance material can be used for electrodes, and a low cost glass substrate 701 can be used.

Sixteenth Embodiment

FIG. 38 is a cross-sectional diagram showing a typical structure of the TFT formed in an active matrix circuit board according to the sixteenth embodiment according to the present invention.

In FIG. 38, TFT-A, TFT-B, and TFT-C are formed on glass substrate 701 in active matrix circuit board 900 of this embodiment.

As described in the description of the fourteenth embodiment, source-drain areas 712, 713, 722, and 723 of TFT-A and TFT-B are high concentration areas with an impurity concentration of $1\times10^{19}$/cm$^3$ or greater, and are formed self-aligned to gate electrodes 715, 725.

In source-drain areas 932, 933 of TFT-C, that area positioned near the edge of gate electrode 935 is low concentration source-drain area 932b, 933b with an impurity concentration of $1\times10^{19}$/cm$^3$ or less, and the other areas are high concentration contact areas 932a, 933a with an impurity concentration of $1\times10^{19}$/cm$^3$ or greater.

Therefore, the OFF current of TFT-C is low. In addition, the overall electrical resistance of source-drain areas 932, 933 is low because high concentration contact area 932a, 933a are formed in source-drain areas 932, 933. Moreover, because the source electrode and drain electrode can be connected to high concentration contact area 932a, 933a, the contact resistance there can be reduced.

The manufacturing method of an active matrix circuit board of such configuration is described with reference to FIG. 37.

FIGS. 39A–39D show a process flow of the manufacturing method of the active matrix circuit board of the present embodiment.

First, as shown in FIG. 39A, after forming a polycrystalline silicon film with a film thickness of approximately 500 Å on the surface side of glass substrate 701, this is patterned to form silicon films 710, 720, 930. Silicon film 930 is a silicon film for forming TFT-C (first process).

Next, gate insulation films 714, 724, 934 with a film thickness of approximately 1200 Å are formed on the surface side of each silicon film 710, 720, 930 (second process).

Gate electrodes 715, 725, 935 with a film thickness of approximately 6000 Å are then formed from tantalum, aluminum, chrome, etc. on the surface of gate insulation films 714, 724, 934 (third process) and, as shown by arrow Ion-1, low concentration phosphorus ions are implanted to silicon films 710, 720, 930 using gate electrodes 715, 725, 935 as a mask.

In this process, in ion implantation machine 50 shown in FIG. 16, all ions generated from a doping gas containing 5% PH$_3$ with the remainder being H$_2$ gas are implanted at an approximately 80 keV energy level to achieve a P$^+$ ion dose in the range from $3\times10^{13}$/cm$^2$ to $1\times10^{14}$/cm$^2$ (first ion doping process).

As a result, polycrystalline silicon films 710, 720, 930 become low concentration areas 710a, 720a, 930a with a phosphorus ion concentration peak in the range from $3\times10^{18}$/cm$^3$ to $1\times10^{19}$/cm$^3$.

Continuing, as shown in FIG. 39B, in ion implantation machine 50 shown in FIG. 16, all ions (shown by arrow ion-2) generated from a doping gas of pure hydrogen are implanted to low concentration areas 710a, 720a, 930a at an approximately 20 KeV energy level to achieve a H$^+$ ion dose in the range from $1\times10^{14}$/cm$^2$ to $1\times10^{15}$/cm$^2$ (second ion doping process). As a result, the hydrogen ion concentration peak in low concentration areas 710a, 720a, 930a is in the range from $6\times10^{18}$/cm$^3$ to $1\times10^{20}$/cm$^3$ (above, the low concentration area formation process).

As shown in FIG. 39C, after masking the side with silicon films 720, 930 with resist 940, high concentration phosphorus ions are implanted to low concentration area 710a as shown by arrow Ion-3 (fourth process). Here, openings 941, 942 are formed in resist 940 at the position corresponding to the intended formation area of high concentration contact areas 932a, 933a in the surface side of silicon film 930.

Ion implantation machine 50 shown in FIG. 16 is used for this ion implantation, too. In other words, all ions generated from a doping gas containing 5% PH$_3$ with the remainder being H$_2$ gas are implanted at an approximately 80 keV energy level to achieve a P$^+$ ion dose of $1\times10^{15}$/cm$^2$ or greater.

As a result, low concentration area 710a becomes source-drain areas 712, 713 (n$^+$ high concentration areas) formed with a phosphorus ion concentration peak of $1\times10^{20}$/cm$^3$ or greater self-aligned to gate electrode 715. In addition, that part of silicon film 710 positioned directly below gate electrode 715 becomes channel formation area 711.

Also, high concentration contact areas 932a, 933a with a phosphorus ion concentration peak of $1\times10^{20}$/cm$^3$ or greater are formed in low concentration area 930a of silicon film 930, and that area to which high concentration ions are not implanted becomes low concentration source-drain area 932b, 933 b with a phosphorus ion concentration peak in the range from $3\times10^{18}$/cm$^3$ to $1\times10m$/cm$^3$.

As shown in FIG. 39D, after masking the sides with silicon films 710, 930 with resist 950, high concentration boron ions are implanted to low concentration area 720a as shown by arrow Ion-4 (fifth process).

Ion implantation machine 50 shown in FIG. 16 is used for this ion implantation, too. In other words, all ions generated from a doping gas containing 5% $B_2H_3$ with the remainder being $H_2$ gas are implanted at an approximately 80 keV energy level to achieve a $B^+$ ion dose of $1\times10^{15}/cm^2$ or greater. As a result, low concentration area 720a becomes source-drain areas 722, 723 ($p^+$ high concentration areas) formed with a boron ion concentration peak of $1\times10^{20}/cm^3$ or greater self-aligned to gate electrode 725. In addition, that part of silicon film 720 positioned directly below gate electrode 725 becomes channel formation area 721.

Then, the impurity is activated in polycrystalline silicon films 710, 720, 930 implanted with the impurity by heat treatment for approximately one hour at approximately 300° C. in a nitrogen atmosphere.

The processes following thereafter are identical to the normal TFT manufacturing method, and description is therefore omitted.

As described hereinabove, by means of the manufacturing method of this embodiment, TFT with optimum electrical characteristics can be manufactured because the dosage conditions of TFT-A, TFT-B, and TFT-C can be set independently. In addition, because the heat treatment temperature is low, the method is not limited by the heat resistance of the electrode material, and a low cost glass substrate 701 can be used.

It is to be noted that in embodiments fourteen through sixteen the low concentration area formation process may be executed after either of the third, fourth, or fifth processes. In addition, the sequence of the fourth and fifth processes may be reversed. Moreover, a silicon dioxide film with a film thickness of approximately 2000 Å may be formed on top of glass substrate 701 before performing the first process to prevent diffusion of heavy metals from the side of glass substrate 701 to the component areas. In addition, as in the source-drain structure described in the eleventh through thirteenth embodiments, the source-drain areas may be formed from a two-layer silicon film.

As described above, the TFT of the pixel area is has with an offset gate structure or LDD structure, and in the drive circuit area the source-drain area of the TFT is formed as a high concentration area and with a self-aligned structure in an active matrix circuit board relating to the present invention. Therefore, according to the present invention, the quality of the display of a liquid crystal display panel can be improved because the ON current characteristics of the TFT in the drive circuit area and the OFF current characteristics of the TFT in the pixel area can both be improved.

In the manufacturing method of such an active matrix circuit board, in the process forming the low concentration areas on the side of the pixel area, a low concentration impurity is also implanted to the drive circuit area side, and a high concentration area is formed there by the high concentration impurity implanted to the drive circuit area side. Therefore, while holding the number of masking operations to a minimum, the impurity concentration of each area can be independently controlled. As a result, different types of TFT can be easily formed on the same substrate. Furthermore, over-etching of the gate electrodes need not occur because a TFT with an offset gate structure or LDD structure is formed by the mask pattern. As a result, TFT with stable electrical characteristics can be manufactured because the gate length can be controlled with good precision. In addition, this simplifies structuring of TFTs.

In the manufacturing method of a conductive silicon film according to the present invention, after all ions generated from a mixed gas containing an impurity gas with the remainder being pure hydrogen gas are implanted to the silicon film without mass separation, ions generated from a pure hydrogen gas are implanted to the silicon film without mass separation. By means of such a method, even an impurity with a low concentration dose of $1\times10^{14}/cm^2$ can be activated by heating the silicon film to approximately 300° C. or greater, for example to a temperature from 300° C. to 450° C. Therefore, because low concentration source-drain areas can be formed even in a low temperature process, an LDD structure TFT can be formed on a glass substrate. Furthermore, because the restrictions relating to the heat resistance of the gate electrode, etc., are alleviated, electrode materials with a low electrical resistance can be used. As a result, because the delay of the gate signal can be reduced in an active matrix circuit board, the quality of the display in a liquid crystal display panel can be improved. Moreover, because implanting is done without mass separation, ions can be implanted to a wide area of the substrate.

Furthermore, high concentration areas can also be formed in a low temperature process by implanting to the silicon film without mass separation all ions generated from a mixed gas containing an impurity gas with the remainder being pure hydrogen gas. Therefore, an active matrix circuit board comprising different types of TFT in the drive circuit area and the pixel area can be manufactured in a low temperature process.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. An active matrix panel, comprising:

a drive circuit area arranged on a surface of an insulated substrate comprising a CMOS circuit comprising a first thin-film transistor of a first conductivity type and a second thin-film transistor of a second conductivity type aid first thin film transistor comprises a source-drain area formed self-aligned to a gate electrode and said second thin film transistor comprising a second source-drain area and a pixel area arranged on the surface of said insulated substrate comprising a third thin-film transistor of the first conductivity type comprising a third source-drain area, wherein a concentration peak of an impurity of said third source-drain area of said third thin-film transistor is in a range from $3\times10^{18}/cm^3$ to $1\times10^{19}/cm^3$, and a concentration peak of hydrogen ions is in a range from $6\times10^{18}/cm^3$ to $1\times10^{20}/cm^3$, wherein a concentration peak of impurity contained in said first source-drain area of said first thin-film transistor and said second source drain area second thin-film transistor is at least $1\times10^{20}/cm^3$ or greater.

2. An active matrix circuit board according to claim 1, wherein said source-drain area of said third thin-film transistor has a high concentration contact area with a concentration peak of impurity of at least $1\times10^{20}/cm^3$, and wherein said third thin film transistor comprises source-drain electrodes electrically connected to the source-drain area of said third thin-film transistor through said high concentration contact area.

3. An active matrix circuit board according to claim 1 or 2, wherein the insulated substrate comprises a glass substrate.

4. An active matrix panel in which data signals are supplied to liquid crystal cells through a plurality of thin film transistors arranged in a matrix of pixels, comprising:

an insulated substrate defining separate drive circuit and pixel areas on a surface thereon;

a CMOS drive circuit formed within the drive circuit area of said insulated substrate, comprising:
 a first thin-film transistor of a first conductivity type including a first source-drain area having an impurity concentration of at least $1\times10^{19}/cm^3$; and
 a second thin-film transistor of a second conductivity type having a second source-drain area; and a plurality of pixel thin-film transistors formed within the pixel area of said insulated substrate defining said matrix of pixels, wherein at least one of said pixel thin-film transistors comprises a third thin-film transistor of the first conductivity type, said third thin-film transistor including a third source-drain area having an area of impurity concentration less than said first source-drain area.

5. The active matrix panel according to claim 4, wherein said third source-drain area comprises two doped regions respectively formed through patterning a first silicon film on said insulated substrate and separated by a channel area formed through patterning a second silicon film on said insulating substrate.

6. An active matrix panel in which data signals are supplied to liquid crystal cells through a plurality of thin film transistors arranged in matrix of pixels, comprising:

an insulated substrate defining separate drive circuit and pixel areas on a surface thereon;

a CMOS drive circuit formed within the drive circuit area of said insulated substrate, comprising:
 a first thin-film transistor of a first conductivity type including a first source drain area; and
 a second thin-film transistor of a second conductivity type having a second source-drain area; and a plurality of pixel thin-film transistors formed within the pixel area of said insulated substrate defining said matrix of pixels, wherein at least one of said pixel thin film transistors comprises a third thin-film transistor of the first conductivity type, said third thin-film transistor comprising:
 a third source-drain area including a high concentration contact area having an impurity concentration of at least $1\times10^{19}/cm^3$; and
 a source-drain electrode electrically connected to said high concentration contact area.

7. The active matrix panel according to claim 6, wherein said third thin-film transistor includes a channel area adjacent said third source-drain area; and
 wherein said third source-drain area comprises a lightly-doped concentration area interposing said channel area and said high concentration contact area.

8. The active matrix panel according to claim 6, wherein said third transistor further comprises a gate electrode spaced, at most, a 4 μm lateral distance away from said high concentration contact area.

9. An active matrix panel in which data signals are supplied to liquid crystal cells through a plurality of thin film transistors arranged in a pixel matrix, comprising:

an insulated substrate defining separate drive circuit and pixel areas on a surface thereon;

a CMOS drive circuit formed within the drive circuit area of said insulated substrate, comprising:
 a first thin-film transistor of a first conductivity type including a first source-drain area; and
 a second thin-film transistor of a second conductivity type having a second source-drain area; and a plurality of pixel thin-film transistors formed within the pixel area of said insulated substrate defining said matrix of pixels, wherein at least one of said pixel thin film transistors comprises a third thin-film transistor of the first conductivity type, said third thin-film transistor including a third source-drain area and a non-overlapping gate electrode offset laterally thereto.

10. The active matrix panel of any one of claims 4–9, wherein the first conductive type is N-type and the second conductive type is P-type.

11. The active matrix panel of any one of claim 4–9, wherein the first conductive type is P-type and the second conductive type is N-type.

12. A method for manufacturing an active matrix panel, comprising the steps of:

(A) patterning first and second silicon films on a surface of an insulated substrate to form first and second thin-film transistors comprising a display drive circuit;

(B) patterning a third silicon film on the surface of the insulated substrate to form a third thin-film transistor within a pixel matrix;

(C) forming gate insulating films on the top surfaces of the first, second and third silicon films;

(D) forming gate electrodes on portions of the gate insulating films;

(E) implanting the first, second, and third silicon films with impurities of a first conductivity type at a dose less than $1\times10^{14}/cm^2$ to create lightly-doped source-drain areas of a first conductivity type within the first, second, and third transistors;

(F) masking the first and third silicon films with a first doping-resistant mask;

(G) implanting the second silicon film with impurities of a second conductivity type at a dose of at least $1\times10^{14}/cm^2$ to form source-drain areas of the second conductivity type within the second transistor;

(H) removing the first doping-resistant mask;

(I) masking the second silicon film, a gate electrode and a gate electrode periphery of the third silicon film with a second doping-resistant mask thereby leaving at least one portion of the third silicon film unmasked; and (J) implanting the first silicon film and the unmasked portion of the third silicon film with impurities of the first conductivity type at a dose of at least $1\times10^{14}/cm^2$.

13. The method of claim 12, wherein said first silicon film implanting step (J) comprises:

implanting the first silicon film with ions generated without mass separation from a gaseous mixture consisting essentially of the impurities of the first conductivity type and hydrogen; and implanting the first silicon film with ions generated without mass separation from substantially pure hydrogen.

14. The method of claim 13, wherein said second silicon film implanting step (G) comprises:

implanting the second silicon film with ions generated without mass separation from a gaseous mixture consisting essentially of the impurities of the second conductivity type and hydrogen; and implanting the second silicon film with ions generated without mass separation from substantially pure hydrogen.

15. The method of claim 14, further comprising:
(K) heat-treating the second silicon film at a temperature of at least 300° C. to activate the ions implanted therein.

16. The method of claim 13, wherein said implanting step (E) comprises:
implanting the first, second, and third silicon films with ions generated without mass separation from a gaseous mixture consisting essentially of the impurities of the first conductivity type and hydrogen; and
implanting the first, second, and third silicon films with ions generated without mass separation from substantially pure hydrogen.

17. The method of claim 16, further comprising:
(K) heat-treating the first, second, and third silicon films at a temperature of at least 300° C. to activate the ions implanted therein.

18. The method of claim 13, further comprising:
(K) heat-treating the first silicon film at a temperature of at least 300° C. to activate the ions implanted therein.

19. The method of claim 12, wherein said second silicon film implanting step (G) comprises:
implanting the second silicon film with ions generated without mass separation from a gaseous mixture consisting essentially of the impurities of the second conductivity type and hydrogen; and implanting the second silicon film with ions generated without mass separation from substantially pure hydrogen.

20. The method of claim 12, wherein said implanting step (E) comprises:
implanting the first, second, and third silicon films with ions generated without mass separation from a gaseous mixture consisting essentially of the impurities of the first conductivity type and hydrogen; and
implanting the first, second, and third silicon films with ions generated without mass separation from substantially pure hydrogen.

21. An active matrix panel in which data signals are supplied to liquid crystal cells through a plurality of thin film transistors arranged in a matrix of pixels, comprising:
an insulated substrate defining separate drive circuit and pixel areas on a surface thereon;
a CMOS drive circuit formed within the drive circuit area of said insulated substrate, comprising:
a first thin-film transistor of a first conductivity type including a first source-drain area having an impurity concentration of at least $1\times10^{19}$cm$^3$; and
a second thin-film transistor of a second conductivity type having a second source-drain area; and
a plurality of pixel thin-film transistors formed within the pixel area of said insulated substrate defining said matrix of pixels, wherein at least one of said pixel thin-film transistors comprises a third thin-film transistor of the first conductivity type, said third thin-film transistor comprising:
a channel area; and
source and drain regions interposing said channel area, each said source and drain region including a lightly-doped concentration area adjacent said channel area and a highly-doped concentration area adjacent said lightly-doped concentration area.

22. The active matrix panel of claim 21, wherein the first conductive type is N-type and the second conductive type is P-type.

23. The active matrix panel of claim 21, wherein the first conductive type is P-type and the second conductive type is N-type.

24. A method for manufacturing an active matrix panel, comprising the steps of:

(A) patterning first and second silicon films on a surface of an insulated substrate to form first and second thin-film transistors comprising a display drive circuit;
(B) patterning a third silicon film on the surface of the insulated substrate to form a third thin-film transistor within a pixel matrix; forming gate insulating films on the top surfaces of the first, second and third silicon films;
(D) forming gate electrodes on portions of the gate insulating films;
(E) implanting the first, second, and third silicon films with impurities of a first conductivity type to create lightly-doped source-drain areas of a first conductivity type within the first, second, and third transistors;
(F) masking the first and third silicon films with a first doping-resistant mask;
(G) implanting the second silicon film with impurities of a second conductivity type to form highly-doped source-drain areas of the second conductivity type within the second transistor;
(H) removing the first doping-resistant mask;
(I) masking the second silicon film, a gate electrode and a gate electrode periphery of the third silicon film with a second doping-resistant mask to leave at least one portion of the third silicon film unmasked; and
(J) implanting the first silicon film and the unmasked portion of the third silicon film with impurities of the first conductivity type to develop highly-doped source-drain areas of the first conductivity type within the first transistor.

25. The method of claim 24, wherein said implanting step (E) comprises implanting the first, second and third silicon films with impurities of the first conductivity type at a dose less than $1\times10^{14}$/cm$^2$.

26. The method of claim 49, wherein said implanting step (G) comprises implanting the second silicon film with impurities of the second conductivity type at a dose of at least $1\times10^{14}$/cm$^2$.

27. A method for manufacturing an active matrix panel, comprising the steps of:

(A) patterning first and second silicon films on a surface of an insulated substrate to form first and second thin-film transistors comprising a display drive circuit;
(B) patterning a third silicon film on the surface of the insulated substrate to form a third thin-film transistor within a pixel matrix;
(C) forming gate insulating films on the top surfaces of the first, second and third silicon films;
(D) forming gate electrodes on portions of the gate insulating films;
(E) implanting the first, second, and third silicon films with impurities of a first conductivity type at a dose less than $1\times10^{14}$/cm$^2$;
(F) masking the first and third silicon films with a first doping-resistant mask;
(G) implanting the second silicon film with impurities of a second conductivity type at a dose of at least $1\times10^{14}$/cm$^2$;
(H) removing the first doping-resistant mask;
(I) masking the second silicon film, a gate electrode and a gate electrode periphery of the third silicon film with a second doping-resistant mask to leave at least one portion of the third silicon film unmasked; and
(J) implanting the first silicon film and the unmasked portion of the third silicon film with impurities of the first conductivity type at a dose of at least $1\times10^{14}$/cm$^2$.

* * * * *

UNITED STATES PATENT AND TRADEMARK OFFICE
CERTIFICATE OF CORRECTION

PATENT NO.     : 5,563,427
DATED          : October 8, 1996
INVENTOR(S)    : Ichio Yudasaka, et al.

It is certified that errors appear in the above identified patent and that said Letters Patent is hereby corrected as shown below:

Column 41, Line 45, insert --/-- after "$1 \times 10^{19}$".

Column 42, Line 34, change "claim 49" to --claim 24--.

Signed and Sealed this

Eighteenth Day of February, 1997

Attest:

BRUCE LEHMAN

*Attesting Officer*     *Commissioner of Patents and Trademarks*